(12) United States Patent
Fallon et al.

(10) Patent No.: US 8,553,759 B2
(45) Date of Patent: *Oct. 8, 2013

(54) BANDWIDTH SENSITIVE DATA COMPRESSION AND DECOMPRESSION

(75) Inventors: James J. Fallon, Armonk, NY (US); Stephen J. McErlain, New York, NY (US)

(73) Assignee: Realtime Data, LLC, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/154,239

(22) Filed: Jun. 6, 2011

(65) Prior Publication Data

US 2011/0235697 A1 Sep. 29, 2011

Related U.S. Application Data

(63) Continuation of application No. 12/123,081, filed on May 19, 2008, now Pat. No. 8,073,047, which is a continuation of application No. 10/076,013, filed on Feb. 13, 2002, now Pat. No. 7,386,046.

(60) Provisional application No. 60/268,394, filed on Feb. 13, 2001.

(51) Int. Cl.
*H04B 1/66* (2006.01)
*H04L 23/00* (2006.01)

(52) U.S. Cl.
USPC .......................................... 375/240; 375/377

(58) Field of Classification Search
USPC ................................ 375/240, 377, 372
See application file for complete search history.

(56) References Cited

U.S. PATENT DOCUMENTS

| | | |
|---|---|---|
| 3,394,352 A | 7/1968 | Wernikoff et al. |
| 3,490,690 A | 1/1970 | Apple et al. |
| 4,021,782 A | 5/1977 | Hoerning |
| 4,032,893 A | 6/1977 | Moran |
| 4,054,951 A | 10/1977 | Jackson et al. |
| 4,127,518 A | 11/1978 | Coy et al. |
| 4,302,775 A | 11/1981 | Widergren et al. |
| 4,325,085 A | 4/1982 | Gooch |
| 4,360,840 A | 11/1982 | Wolfrun et al. |
| 4,386,416 A | 5/1983 | Giltner et al. |
| 4,394,774 A | 7/1983 | Widergren et al. |

(Continued)

FOREIGN PATENT DOCUMENTS

| | | |
|---|---|---|
| DE | 4127518 | 2/1992 |
| EP | 0164677 | 12/1985 |

(Continued)

OTHER PUBLICATIONS

"Packeteer iShaper, PacketShaper and iShared Appliances Drive Intelligent Application Acceleration Across Coogee Resources Wide Area Network", Business Wire, accessed on Aug. 25, 2008, 2 pages.

(Continued)

*Primary Examiner* — Tesfaldet Bocure
(74) *Attorney, Agent, or Firm* — Sterne, Kessler, Goldstein & Fox P.L.L.C.

(57) ABSTRACT

Data compression and decompression methods for compressing and decompressing data based on an actual or expected throughput (bandwidth) of a system. In one embodiment, a controller tracks and monitors the throughput (data storage and retrieval) of a data compression system and generates control signals to enable/disable different compression algorithms when, e.g., a bottleneck occurs so as to increase the throughput and eliminate the bottleneck.

8 Claims, 4 Drawing Sheets

(56) References Cited

U.S. PATENT DOCUMENTS

| | | |
|---|---|---|
| 4,464,650 A | 8/1984 | Eastman |
| 4,494,108 A | 1/1985 | Langdon, Jr. et al. |
| 4,499,499 A | 2/1985 | Brickman et al. |
| 4,574,351 A | 3/1986 | Dang et al. |
| 4,593,324 A | 6/1986 | Ohkubo et al. |
| 4,626,829 A | 12/1986 | Hauck |
| 4,646,061 A | 2/1987 | Bledsoe |
| 4,682,150 A | 7/1987 | Mathes et al. |
| 4,701,745 A | 10/1987 | Waterworth |
| 4,729,020 A | 3/1988 | Schaphorst et al. |
| 4,730,348 A | 3/1988 | MacCrisken |
| 4,745,559 A | 5/1988 | Willis et al. |
| 4,748,638 A | 5/1988 | Freidman et al. |
| 4,750,135 A | 6/1988 | Boilen |
| 4,754,351 A | 6/1988 | Wright |
| 4,804,959 A | 2/1989 | Makansi et al. |
| 4,813,040 A | 3/1989 | Futato |
| 4,814,746 A | 3/1989 | Miller et al. |
| 4,862,167 A | 8/1989 | Copeland, III |
| 4,866,601 A | 9/1989 | DuLac et al. |
| 4,870,415 A | 9/1989 | Van Maren et al. |
| 4,872,009 A | 10/1989 | Tsukiyama et al. |
| 4,876,541 A | 10/1989 | Storer |
| 4,888,812 A | 12/1989 | Dinan et al. |
| 4,890,282 A | 12/1989 | Lambert et al. |
| 4,897,717 A | 1/1990 | Hamilton et al. |
| 4,906,991 A | 3/1990 | Fiala et al. |
| 4,906,995 A | 3/1990 | Swanson |
| 4,929,946 A | 5/1990 | O'Brien et al. |
| 4,953,324 A | 9/1990 | Hermann |
| 4,956,808 A | 9/1990 | Aakre et al. |
| 4,965,675 A | 10/1990 | Hori et al. |
| 4,988,998 A | 1/1991 | O'Brien |
| 5,003,307 A | 3/1991 | Whiting et al. |
| 5,016,009 A | 5/1991 | Whiting et al. |
| 5,027,376 A | 6/1991 | Freidman et al. |
| 5,028,922 A | 7/1991 | Huang |
| 5,045,848 A | 9/1991 | Fascenda |
| 5,045,852 A | 9/1991 | Mitchell et al. |
| 5,046,027 A | 9/1991 | Taaffe et al. |
| 5,049,881 A | 9/1991 | Gibson et al. |
| 5,079,630 A | 1/1992 | Golin |
| 5,091,782 A | 2/1992 | Krause et al. |
| 5,097,261 A | 3/1992 | Langdon, Jr. et al. |
| 5,103,306 A | 4/1992 | Weiman |
| 5,109,226 A | 4/1992 | MacLean, Jr. et al. |
| 5,109,433 A | 4/1992 | Notenboom |
| 5,113,522 A | 5/1992 | Dinwiddie, Jr. et al. |
| 5,115,309 A | 5/1992 | Hang |
| 5,121,342 A | 6/1992 | Szymborski |
| 5,126,739 A | 6/1992 | Whiting et al. |
| 5,128,963 A | 7/1992 | Akagiri |
| 5,132,992 A | 7/1992 | Yurt et al. |
| 5,146,221 A | 9/1992 | Whiting et al. |
| 5,150,430 A | 9/1992 | Chu |
| 5,155,484 A | 10/1992 | Chambers, IV |
| 5,159,336 A | 10/1992 | Rabin et al. |
| 5,167,034 A | 11/1992 | MacLean, Jr. et al. |
| 5,175,543 A | 12/1992 | Lantz |
| 5,179,651 A | 1/1993 | Taaffe et al. |
| 5,187,793 A | 2/1993 | Keith et al. |
| 5,191,431 A | 3/1993 | Hasegawa et al. |
| 5,204,756 A | 4/1993 | Chevion et al. |
| 5,209,220 A | 5/1993 | Hiyama et al. |
| 5,212,742 A | 5/1993 | Normile et al. |
| 5,226,176 A | 7/1993 | Westaway et al. |
| 5,227,893 A | 7/1993 | Ett |
| 5,231,492 A | 7/1993 | Dangi et al. |
| 5,237,460 A | 8/1993 | Miller et al. |
| 5,237,675 A | 8/1993 | Hannon, Jr. |
| 5,243,341 A | 9/1993 | Seroussi et al. |
| 5,243,348 A | 9/1993 | Jackson |
| 5,247,638 A | 9/1993 | O'Brien et al. |
| 5,247,646 A | 9/1993 | Osterlund et al. |
| 5,249,053 A | 9/1993 | Jain |
| 5,263,168 A | 11/1993 | Toms et al. |
| 5,267,333 A | 11/1993 | Aono |
| 5,270,832 A | 12/1993 | Balkanski et al. |
| 5,280,600 A | 1/1994 | Van Maren et al. |
| 5,287,420 A | 2/1994 | Barrett |
| 5,289,580 A | 2/1994 | Latif et al. |
| 5,293,379 A | 3/1994 | Carr |
| 5,293,576 A | 3/1994 | Mihm, Jr. et al. |
| 5,307,497 A | 4/1994 | Feigenbaum et al. |
| 5,309,555 A | 5/1994 | Akins et al. |
| 5,319,682 A | 6/1994 | Clark |
| 5,331,425 A | 7/1994 | Ozaki et al. |
| 5,341,440 A | 8/1994 | Earl et al. |
| 5,347,600 A | 9/1994 | Barnsley et al. |
| 5,353,132 A | 10/1994 | Katsuma |
| 5,354,315 A | 10/1994 | Armstrong |
| 5,355,498 A | 10/1994 | Provino et al. |
| 5,357,614 A | 10/1994 | Pattisam et al. |
| 5,367,629 A | 11/1994 | Chu et al. |
| 5,373,290 A | 12/1994 | Lempel et al. |
| 5,374,916 A | 12/1994 | Chu |
| 5,379,036 A | 1/1995 | Storer |
| 5,379,757 A | 1/1995 | Hiyama et al. |
| 5,381,145 A | 1/1995 | Allen et al. |
| 5,389,922 A | 2/1995 | Seroussi et al. |
| 5,394,534 A | 2/1995 | Kulakowski et al. |
| 5,396,228 A | 3/1995 | Garahi |
| 5,400,401 A | 3/1995 | Wasilewski et al. |
| 5,403,639 A | 4/1995 | Belsan et al. |
| 5,406,278 A | 4/1995 | Graybill et al. |
| 5,406,279 A | 4/1995 | Anderson et al. |
| 5,410,671 A | 4/1995 | Elgamal et al. |
| 5,412,384 A | 5/1995 | Chang et al. |
| 5,414,850 A | 5/1995 | Whiting |
| 5,420,639 A | 5/1995 | Perkins |
| 5,434,983 A | 7/1995 | Yaso et al. |
| 5,437,020 A | 7/1995 | Wells et al. |
| 5,452,287 A | 9/1995 | Dicecco et al. |
| 5,454,079 A | 9/1995 | Roper et al. |
| 5,454,107 A | 9/1995 | Lehman et al. |
| 5,455,576 A | 10/1995 | Clark, II et al. |
| 5,455,578 A | 10/1995 | Bhandari |
| 5,455,680 A | 10/1995 | Shin |
| 5,461,679 A | 10/1995 | Normile et al. |
| 5,463,390 A | 10/1995 | Whiting et al. |
| 5,467,087 A | 11/1995 | Chu |
| 5,471,206 A | 11/1995 | Allen et al. |
| 5,475,388 A | 12/1995 | Gormish et al. |
| 5,479,587 A | 12/1995 | Campbell et al. |
| 5,479,633 A | 12/1995 | Wells et al. |
| 5,483,470 A | 1/1996 | Alur et al. |
| 5,486,826 A | 1/1996 | Remillard |
| 5,488,364 A | 1/1996 | Cole |
| 5,488,365 A | 1/1996 | Seroussi et al. |
| 5,495,244 A | 2/1996 | Jeong et al. |
| 5,504,842 A | 4/1996 | Gentile |
| 5,506,844 A | 4/1996 | Rao |
| 5,506,872 A | 4/1996 | Mohler |
| 5,506,944 A | 4/1996 | Gentile |
| 5,521,940 A | 5/1996 | Lane et al. |
| 5,528,628 A | 6/1996 | Park et al. |
| 5,530,845 A | 6/1996 | Hiatt et al. |
| 5,533,051 A | 7/1996 | James |
| 5,535,311 A | 7/1996 | Zimmerman |
| 5,535,356 A | 7/1996 | Kim et al. |
| 5,535,369 A | 7/1996 | Wells et al. |
| 5,537,658 A | 7/1996 | Bakke et al. |
| 5,539,865 A | 7/1996 | Gentile |
| 5,542,031 A | 7/1996 | Douglass et al. |
| 5,544,290 A | 8/1996 | Gentile |
| 5,546,395 A | 8/1996 | Sharma et al. |
| 5,546,475 A | 8/1996 | Bolle et al. |
| 5,553,160 A | 9/1996 | Dawson |
| 5,557,551 A | 9/1996 | Craft |
| 5,557,668 A | 9/1996 | Brady |
| 5,557,749 A | 9/1996 | Norris |
| 5,561,421 A | 10/1996 | Smith et al. |
| 5,561,824 A | 10/1996 | Carreiro et al. |
| 5,563,961 A | 10/1996 | Rynderman et al. |

(56) References Cited

U.S. PATENT DOCUMENTS

| | | |
|---|---|---|
| 5,574,952 A | 11/1996 | Brady et al. |
| 5,574,953 A | 11/1996 | Rust et al. |
| 5,576,953 A | 11/1996 | Hugentobler |
| 5,577,248 A | 11/1996 | Chambers, IV |
| 5,581,715 A | 12/1996 | Verinsky et al. |
| 5,583,500 A | 12/1996 | Allen et al. |
| 5,586,264 A | 12/1996 | Belknap et al. |
| 5,586,285 A | 12/1996 | Hasbun et al. |
| 5,590,306 A | 12/1996 | Watanabe et al. |
| 5,596,674 A | 1/1997 | Bhandari et al. |
| 5,598,388 A | 1/1997 | Van Maren et al. |
| 5,604,824 A | 2/1997 | Chui et al. |
| 5,606,706 A | 2/1997 | Takamoto et al. |
| 5,610,657 A | 3/1997 | Zhang |
| 5,611,024 A | 3/1997 | Campbell et al. |
| 5,612,788 A | 3/1997 | Stone |
| 5,613,069 A | 3/1997 | Walker |
| 5,615,017 A | 3/1997 | Choi |
| 5,615,287 A | 3/1997 | Fu et al. |
| 5,619,995 A | 4/1997 | Lobodzinski |
| 5,621,820 A | 4/1997 | Rynderman et al. |
| 5,623,623 A | 4/1997 | Kim et al. |
| 5,623,701 A | 4/1997 | Bakke et al. |
| 5,627,534 A | 5/1997 | Craft |
| 5,627,995 A | 5/1997 | Miller et al. |
| 5,629,732 A | 5/1997 | Moskowitz et al. |
| 5,630,092 A | 5/1997 | Carreiro et al. |
| 5,635,632 A | 6/1997 | Fay et al. |
| 5,635,932 A | 6/1997 | Shinagawa et al. |
| 5,638,498 A | 6/1997 | Tyler et al. |
| 5,640,158 A | 6/1997 | Okayama et al. |
| 5,642,506 A | 6/1997 | Lee |
| 5,649,032 A | 7/1997 | Burt et al. |
| 5,652,795 A | 7/1997 | Dillon et al. |
| 5,652,857 A | 7/1997 | Shimoi et al. |
| 5,652,917 A | 7/1997 | Maupin et al. |
| 5,654,703 A | 8/1997 | Clark, II |
| 5,655,138 A | 8/1997 | Kikinis |
| 5,666,560 A | 9/1997 | Moertl et al. |
| 5,668,737 A | 9/1997 | Iler |
| 5,671,355 A | 9/1997 | Collins |
| 5,671,389 A | 9/1997 | Saliba |
| 5,671,413 A | 9/1997 | Shipman et al. |
| 5,673,370 A | 9/1997 | Laney |
| 5,675,333 A | 10/1997 | Boursier et al. |
| 5,675,789 A | 10/1997 | Ishii et al. |
| 5,686,916 A | 11/1997 | Bakhmutsky |
| 5,692,159 A | 11/1997 | Shand |
| 5,694,619 A | 12/1997 | Konno |
| 5,696,927 A | 12/1997 | MacDonald et al. |
| 5,703,793 A | 12/1997 | Wise et al. |
| 5,708,511 A | 1/1998 | Gandhi et al. |
| 5,715,477 A | 2/1998 | Kikinis |
| 5,717,393 A | 2/1998 | Nakano et al. |
| 5,717,394 A | 2/1998 | Schwartz et al. |
| 5,719,862 A | 2/1998 | Lee et al. |
| 5,721,958 A | 2/1998 | Kikinis |
| 5,724,475 A | 3/1998 | Kirsten |
| 5,729,228 A | 3/1998 | Franaszek et al. |
| 5,740,395 A | 4/1998 | Wells et al. |
| 5,742,773 A | 4/1998 | Blomfield-Brown et al. |
| 5,748,904 A | 5/1998 | Huang et al. |
| 5,757,852 A | 5/1998 | Jericevic et al. |
| 5,764,774 A | 6/1998 | Liu |
| 5,765,027 A | 6/1998 | Wang et al. |
| 5,767,898 A | 6/1998 | Urano et al. |
| 5,768,445 A | 6/1998 | Troeller et al. |
| 5,768,525 A | 6/1998 | Kralowetz et al. |
| 5,771,340 A | 6/1998 | Nakazato et al. |
| 5,774,715 A | 6/1998 | Madany et al. |
| 5,778,411 A | 7/1998 | DeMoss et al. |
| 5,781,767 A | 7/1998 | Inoue et al. |
| 5,784,572 A | 7/1998 | Rostoker et al. |
| 5,787,487 A | 7/1998 | Hashimoto et al. |
| 5,794,229 A | 8/1998 | French et al. |
| 5,796,864 A | 8/1998 | Callahan |
| 5,799,110 A | 8/1998 | Israelsen et al. |
| 5,805,834 A | 9/1998 | McKinley et al. |
| 5,805,932 A | 9/1998 | Kawashima et al. |
| 5,808,660 A | 9/1998 | Sekine et al. |
| 5,809,176 A | 9/1998 | Yajima |
| 5,809,299 A | 9/1998 | Cloutier et al. |
| 5,809,337 A | 9/1998 | Hannah et al. |
| 5,812,195 A | 9/1998 | Zhang |
| 5,812,789 A | 9/1998 | Diaz et al. |
| 5,818,368 A | 10/1998 | Langley |
| 5,818,369 A | 10/1998 | Withers |
| 5,818,530 A | 10/1998 | Canfield et al. |
| 5,819,215 A | 10/1998 | Dobson et al. |
| 5,822,781 A | 10/1998 | Wells et al. |
| 5,825,424 A | 10/1998 | Canfield et al. |
| 5,825,830 A | 10/1998 | Kopf |
| 5,832,037 A | 11/1998 | Park |
| 5,832,126 A | 11/1998 | Tanaka |
| 5,832,443 A | 11/1998 | Kolesnik et al. |
| 5,835,788 A | 11/1998 | Blumer et al. |
| 5,836,003 A | 11/1998 | Sadeh |
| 5,838,821 A | 11/1998 | Matsubara et al. |
| 5,838,927 A | 11/1998 | Gillon |
| 5,838,996 A | 11/1998 | deCarmo |
| 5,839,100 A | 11/1998 | Wegener |
| 5,841,979 A | 11/1998 | Schulhof et al. |
| 5,847,762 A | 12/1998 | Canfield et al. |
| 5,850,565 A | 12/1998 | Wightman |
| 5,861,824 A | 1/1999 | Ryu et al. |
| 5,861,920 A | 1/1999 | Mead et al. |
| 5,864,342 A | 1/1999 | Kajiya et al. |
| 5,864,678 A | 1/1999 | Riddle |
| 5,867,167 A | 2/1999 | Deering |
| 5,867,602 A | 2/1999 | Zandi et al. |
| 5,870,036 A | 2/1999 | Franaszek et al. |
| 5,870,087 A | 2/1999 | Chau |
| 5,872,530 A | 2/1999 | Domyo et al. |
| 5,874,907 A | 2/1999 | Craft |
| 5,883,975 A | 3/1999 | Narita et al. |
| 5,884,269 A | 3/1999 | Cellier et al. |
| 5,886,655 A | 3/1999 | Rust |
| 5,887,165 A | 3/1999 | Martel et al. |
| 5,889,961 A | 3/1999 | Dobbek |
| 5,892,847 A | 4/1999 | Johnson |
| 5,907,801 A | 5/1999 | Albert et al. |
| 5,909,557 A | 6/1999 | Betker et al. |
| 5,909,559 A | 6/1999 | So |
| 5,915,079 A | 6/1999 | Vondran, Jr. et al. |
| 5,917,438 A | 6/1999 | Ando |
| 5,918,068 A | 6/1999 | Shafe |
| 5,918,225 A | 6/1999 | White et al. |
| 5,920,326 A | 7/1999 | Rentschler et al. |
| 5,923,860 A | 7/1999 | Olarig |
| 5,930,358 A | 7/1999 | Rao |
| 5,936,616 A | 8/1999 | Torborg, Jr. et al. |
| 5,938,737 A | 8/1999 | Smallcomb et al. |
| 5,943,692 A | 8/1999 | Marberg |
| 5,945,933 A | 8/1999 | Kalkstein |
| 5,949,355 A | 9/1999 | Panaoussis |
| 5,949,968 A | 9/1999 | Gentile |
| 5,951,623 A | 9/1999 | Reynar et al. |
| 5,955,976 A | 9/1999 | Heath |
| 5,956,490 A | 9/1999 | Buchholz et al. |
| 5,960,465 A | 9/1999 | Adams |
| 5,964,842 A | 10/1999 | Packard |
| 5,968,149 A | 10/1999 | Jaquette et al. |
| 5,969,927 A | 10/1999 | Schirmer et al. |
| 5,973,630 A | 10/1999 | Heath |
| 5,974,235 A | 10/1999 | Nunally et al. |
| 5,974,387 A | 10/1999 | Kageyama |
| 5,974,471 A | 10/1999 | Belt |
| 5,978,483 A | 11/1999 | Thompson, Jr. et al. |
| 5,982,360 A | 11/1999 | Wu et al. |
| 5,982,723 A | 11/1999 | Kamatani |
| 5,982,937 A | 11/1999 | Accad |
| 5,987,022 A | 11/1999 | Geiger et al. |
| 5,987,432 A | 11/1999 | Zusman et al. |
| 5,987,590 A | 11/1999 | So |

(56) References Cited

U.S. PATENT DOCUMENTS

| | | |
|---|---|---|
| 5,990,884 A | 11/1999 | Douma et al. |
| 5,991,515 A | 11/1999 | Fall et al. |
| 5,996,033 A | 11/1999 | Chiu-Hao |
| 6,000,009 A | 12/1999 | Brady |
| 6,002,411 A | 12/1999 | Dye |
| 6,003,115 A | 12/1999 | Spear et al. |
| 6,008,743 A | 12/1999 | Jaquette |
| 6,011,901 A | 1/2000 | Kirsten |
| 6,014,694 A | 1/2000 | Aharoni et al. |
| 6,021,433 A | 2/2000 | Payne |
| 6,023,755 A | 2/2000 | Casselman |
| 6,026,217 A | 2/2000 | Adiletta |
| 6,028,725 A | 2/2000 | Blumenau |
| 6,031,939 A | 2/2000 | Gilbert et al. |
| 6,032,148 A | 2/2000 | Wilkes |
| 6,032,197 A | 2/2000 | Birdwell et al. |
| 6,038,346 A | 3/2000 | Ratnakar |
| 6,058,459 A | 5/2000 | Owen et al. |
| 6,061,398 A | 5/2000 | Satoh et al. |
| 6,061,473 A | 5/2000 | Chen et al. |
| 6,070,179 A | 5/2000 | Craft |
| 6,073,232 A | 6/2000 | Kroeker et al. |
| 6,075,470 A | 6/2000 | Little et al. |
| 6,078,958 A | 6/2000 | Echeita et al. |
| 6,091,777 A | 7/2000 | Guetz et al. |
| 6,092,123 A | 7/2000 | Steffan et al. |
| 6,094,634 A | 7/2000 | Yahagi et al. |
| 6,097,520 A | 8/2000 | Kadnier |
| 6,097,845 A | 8/2000 | Ng et al. |
| 6,098,114 A | 8/2000 | McDonald et al. |
| 6,104,389 A | 8/2000 | Ando |
| 6,105,130 A | 8/2000 | Wu et al. |
| 6,115,384 A | 9/2000 | Parzych |
| 6,128,412 A | 10/2000 | Satoh |
| 6,134,631 A | 10/2000 | Jennings, III |
| 6,141,053 A | 10/2000 | Saukkonen |
| 6,145,020 A | 11/2000 | Barnett |
| 6,145,069 A | 11/2000 | Dye |
| 6,169,241 B1 | 1/2001 | Shimizu |
| 6,170,007 B1 | 1/2001 | Venkatraman et al. |
| 6,170,047 B1 | 1/2001 | Dye |
| 6,170,049 B1 | 1/2001 | So |
| 6,172,936 B1 | 1/2001 | Kitazaki |
| 6,173,381 B1 | 1/2001 | Dye |
| 6,175,650 B1 | 1/2001 | Sindhu et al. |
| 6,175,856 B1 | 1/2001 | Riddle |
| 6,182,125 B1 | 1/2001 | Borella et al. |
| 6,185,625 B1 | 2/2001 | Tso et al. |
| 6,185,659 B1 | 2/2001 | Milillo et al. |
| 6,192,082 B1 | 2/2001 | Moriarty et al. |
| 6,192,155 B1 | 2/2001 | Fan |
| 6,195,024 B1 | 2/2001 | Fallon |
| 6,195,125 B1 | 2/2001 | Udagawa et al. |
| 6,195,391 B1 | 2/2001 | Hancock et al. |
| 6,195,465 B1 | 2/2001 | Zandi et al. |
| 6,198,842 B1 | 3/2001 | Yeo |
| 6,198,850 B1 | 3/2001 | Banton |
| 6,208,273 B1 | 3/2001 | Dye et al. |
| 6,215,904 B1 | 4/2001 | Lavallee |
| 6,219,754 B1 | 4/2001 | Belt et al. |
| 6,222,886 B1 | 4/2001 | Yogeshwar |
| 6,225,922 B1 | 5/2001 | Norton |
| 6,226,667 B1 | 5/2001 | Matthews et al. |
| 6,226,740 B1 | 5/2001 | Iga |
| 6,230,223 B1 | 5/2001 | Olarig |
| 6,237,054 B1 | 5/2001 | Freitag, Jr. |
| 6,243,829 B1 | 6/2001 | Chan |
| 6,253,264 B1 | 6/2001 | Sebastian |
| 6,272,178 B1 | 8/2001 | Nieweglowski et al. |
| 6,272,627 B1 | 8/2001 | Mann |
| 6,272,628 B1 | 8/2001 | Aguilar et al. |
| 6,282,641 B1 | 8/2001 | Christensen |
| 6,285,458 B1 | 9/2001 | Yada |
| 6,298,408 B1 | 10/2001 | Park |
| 6,308,311 B1 | 10/2001 | Carmichael et al. |
| 6,309,424 B1 | 10/2001 | Fallon |
| 6,310,563 B1 | 10/2001 | Har et al. |
| 6,317,714 B1 | 11/2001 | Del Castillo et al. |
| 6,317,818 B1 | 11/2001 | Zwiegincew et al. |
| 6,330,622 B1 | 12/2001 | Schaefer |
| 6,333,745 B1 | 12/2001 | Shimomura et al. |
| 6,345,307 B1 | 2/2002 | Booth |
| 6,356,589 B1 | 3/2002 | Gebler et al. |
| 6,356,937 B1 | 3/2002 | Montville et al. |
| 6,388,584 B1 | 5/2002 | Dorward et al. |
| 6,392,567 B2 | 5/2002 | Satoh |
| 6,404,931 B1 | 6/2002 | Chen et al. |
| 6,421,387 B1 | 7/2002 | Rhee |
| 6,434,168 B1 | 8/2002 | Kari |
| 6,434,695 B1 | 8/2002 | Esfahani et al. |
| 6,442,659 B1 | 8/2002 | Blumenau |
| 6,449,658 B1 | 9/2002 | Lafe et al. |
| 6,449,682 B1 | 9/2002 | Toorians |
| 6,452,602 B1 | 9/2002 | Morein |
| 6,452,933 B1 | 9/2002 | Duffield et al. |
| 6,459,429 B1 | 10/2002 | Deering |
| 6,463,509 B1 | 10/2002 | Teoman et al. |
| 6,487,640 B1 | 11/2002 | Lipasti |
| 6,489,902 B2 | 12/2002 | Heath |
| 6,505,239 B1 | 1/2003 | Kobata |
| 6,513,113 B1 | 1/2003 | Kobayashi |
| 6,523,102 B1 | 2/2003 | Dye et al. |
| 6,526,174 B1 | 2/2003 | Graffagnino |
| 6,529,633 B1 | 3/2003 | Easwar et al. |
| 6,532,121 B1 | 3/2003 | Rust et al. |
| 6,539,438 B1 | 3/2003 | Ledzius et al. |
| 6,539,456 B2 | 3/2003 | Stewart |
| 6,542,644 B1 | 4/2003 | Satoh |
| 6,577,254 B2 | 6/2003 | Rasmussen |
| 6,590,609 B1 | 7/2003 | Kitade et al. |
| 6,597,812 B1 | 7/2003 | Fallon et al. |
| 6,601,104 B1 | 7/2003 | Fallon |
| 6,604,040 B2 | 8/2003 | Kawasaki et al. |
| 6,604,158 B1 | 8/2003 | Fallon |
| 6,606,040 B2 | 8/2003 | Abdat |
| 6,606,413 B1 | 8/2003 | Zeineh |
| 6,609,223 B1 | 8/2003 | Wolfgang |
| 6,618,728 B1 | 9/2003 | Rail |
| 6,624,761 B2 | 9/2003 | Fallon |
| 6,633,244 B2 | 10/2003 | Avery |
| 6,633,968 B2 | 10/2003 | Zwiegincew et al. |
| 6,650,261 B2 | 11/2003 | Nelson et al. |
| 6,661,839 B1 | 12/2003 | Ishida et al. |
| 6,661,845 B1 | 12/2003 | Herath |
| 6,704,840 B2 | 3/2004 | Nalawadi et al. |
| 6,708,220 B1 | 3/2004 | Olin |
| 6,711,709 B1 | 3/2004 | York |
| 6,717,534 B2 | 4/2004 | Yokose |
| 6,731,814 B2 | 5/2004 | Zeck et al. |
| 6,745,282 B2 | 6/2004 | Okada et al. |
| 6,748,457 B2 | 6/2004 | Fallon et al. |
| 6,756,922 B2 | 6/2004 | Ossia |
| 6,768,749 B1 | 7/2004 | Osler et al. |
| 6,792,151 B1 | 9/2004 | Barnes et al. |
| 6,810,434 B2 | 10/2004 | Muthujumaraswathy et al. |
| 6,813,689 B2 | 11/2004 | Baxter, III |
| 6,819,271 B2 | 11/2004 | Geiger et al. |
| 6,822,589 B1 | 11/2004 | Dye et al. |
| 6,856,651 B2 | 2/2005 | Singh |
| 6,862,278 B1 | 3/2005 | Chang et al. |
| 6,879,266 B1 | 4/2005 | Dye et al. |
| 6,885,316 B2 | 4/2005 | Mehring |
| 6,885,319 B2 | 4/2005 | Geiger et al. |
| 6,888,893 B2 | 5/2005 | Li et al. |
| 6,909,383 B2 | 6/2005 | Shokrollahi et al. |
| 6,909,745 B1 | 6/2005 | Puri et al. |
| 6,944,740 B2 | 9/2005 | Abali et al. |
| 6,952,409 B2 | 10/2005 | Jolitz |
| 6,959,359 B1 | 10/2005 | Suzuki et al. |
| 6,963,608 B1 | 11/2005 | Wu |
| 6,990,247 B2 | 1/2006 | Schwartz |
| 6,993,597 B2 | 1/2006 | Nakagawa et al. |
| 7,007,099 B1 | 2/2006 | Donati et al. |
| 7,024,460 B2 | 4/2006 | Koopmas |

(56) References Cited

U.S. PATENT DOCUMENTS

| | | |
|---|---|---|
| 7,054,493 B2 | 5/2006 | Schwartz |
| 7,069,342 B1 | 6/2006 | Biederman |
| 7,089,391 B2 | 8/2006 | Geiger et al. |
| 7,102,544 B1 | 9/2006 | Liu |
| 7,127,518 B2 | 10/2006 | Vange et al. |
| 7,129,860 B2 | 10/2006 | Alvarez, II |
| 7,130,913 B2 | 10/2006 | Fallon |
| 7,161,506 B2 | 1/2007 | Fallon |
| 7,181,608 B2 | 2/2007 | Fallon et al. |
| 7,190,284 B1 | 3/2007 | Dye et al. |
| 7,319,667 B1 | 1/2008 | Biederman |
| 7,321,937 B2 | 1/2008 | Fallon |
| RE40,092 E | 2/2008 | Kang |
| 7,330,912 B1 | 2/2008 | Fox et al. |
| 7,352,300 B2 | 4/2008 | Fallon |
| 7,358,867 B2 | 4/2008 | Fallon |
| 7,376,772 B2 | 5/2008 | Fallon |
| 7,378,992 B2 | 5/2008 | Fallon |
| 7,386,046 B2 | 6/2008 | Fallon et al. |
| 7,395,345 B2 | 7/2008 | Fallon |
| 7,400,274 B2 | 7/2008 | Fallon et al. |
| 7,415,530 B2 | 8/2008 | Fallon |
| 7,417,568 B2 | 8/2008 | Fallon et al. |
| 7,552,069 B2 | 6/2009 | Kepecs |
| 7,565,441 B2 | 7/2009 | Romanik et al. |
| 7,714,747 B2 | 5/2010 | Fallon |
| 7,777,651 B2 | 8/2010 | Fallon et al. |
| 8,054,879 B2 | 11/2011 | Fallon et al. |
| 8,073,047 B2 | 12/2011 | Fallon et al. |
| 8,090,936 B2 | 1/2012 | Fallon et al. |
| 8,112,619 B2 | 2/2012 | Fallon et al. |
| 8,275,897 B2 | 9/2012 | Fallon |
| 2001/0031092 A1 | 10/2001 | Zeck et al. |
| 2001/0032128 A1 | 10/2001 | Kepecs |
| 2001/0047473 A1 | 11/2001 | Fallon |
| 2001/0052038 A1 | 12/2001 | Fallon et al. |
| 2001/0054131 A1 | 12/2001 | Alvarez, II et al. |
| 2002/0037035 A1 | 3/2002 | Singh |
| 2002/0069354 A1 | 6/2002 | Fallon et al. |
| 2002/0080871 A1 | 6/2002 | Fallon et al. |
| 2002/0097172 A1 | 7/2002 | Fallon |
| 2002/0101367 A1 | 8/2002 | Geiger et al. |
| 2002/0104891 A1 | 8/2002 | Otto |
| 2002/0126755 A1 | 9/2002 | Li et al. |
| 2002/0169950 A1 | 11/2002 | Esfahani et al. |
| 2002/0191692 A1 | 12/2002 | Fallon et al. |
| 2003/0030575 A1 | 2/2003 | Frachtenberg et al. |
| 2003/0034905 A1 | 2/2003 | Anton et al. |
| 2003/0084238 A1 | 5/2003 | Okada et al. |
| 2003/0090397 A1 | 5/2003 | Rasmussen |
| 2003/0142874 A1 | 7/2003 | Schwartz |
| 2003/0191876 A1 | 10/2003 | Fallon |
| 2004/0042506 A1 | 3/2004 | Fallon et al. |
| 2004/0056783 A1 | 3/2004 | Fallon |
| 2004/0073710 A1 | 4/2004 | Fallon |
| 2004/0073746 A1 | 4/2004 | Fallon |
| 2006/0015650 A1 | 1/2006 | Fallon |
| 2006/0181441 A1 | 8/2006 | Fallon |
| 2006/0181442 A1 | 8/2006 | Fallon |
| 2006/0184687 A1 | 8/2006 | Fallon |
| 2006/0190644 A1 | 8/2006 | Fallon |
| 2006/0195601 A1 | 8/2006 | Fallon |
| 2007/0043939 A1 | 2/2007 | Fallon et al. |
| 2007/0050514 A1 | 3/2007 | Fallon |
| 2007/0050515 A1 | 3/2007 | Fallon |
| 2007/0067483 A1 | 3/2007 | Fallon |
| 2007/0083746 A1 | 4/2007 | Fallon et al. |
| 2007/0109154 A1 | 5/2007 | Fallon |
| 2007/0109155 A1 | 5/2007 | Fallon |
| 2007/0109156 A1 | 5/2007 | Fallon |
| 2007/0174209 A1 | 7/2007 | Fallon |
| 2008/0232457 A1 | 9/2008 | Fallon et al. |
| 2009/0125698 A1 | 5/2009 | Dye |
| 2009/0154545 A1 | 6/2009 | Fallon et al. |
| 2009/0287839 A1 | 11/2009 | Fallon et al. |
| 2010/0316114 A1 | 12/2010 | Fallon et al. |
| 2010/0318684 A1 | 12/2010 | Fallon |
| 2010/0332700 A1 | 12/2010 | Fallon |
| 2011/0037626 A1 | 2/2011 | Fallon |
| 2011/0199243 A1 | 8/2011 | Fallon et al. |
| 2011/0208833 A1 | 8/2011 | Fallon |
| 2011/0231642 A1 | 9/2011 | Fallon et al. |
| 2011/0285559 A1 | 11/2011 | Fallon |
| 2012/0194362 A1 | 8/2012 | Fallon et al. |
| 2012/0239921 A1 | 9/2012 | Fallon |

FOREIGN PATENT DOCUMENTS

| | | |
|---|---|---|
| EP | 0185098 | 6/1986 |
| EP | 0283798 | 9/1988 |
| EP | 0405572 | 1/1991 |
| EP | 0493130 | 7/1992 |
| EP | 0587437 | 3/1994 |
| EP | 0595406 | 5/1994 |
| EP | 0718751 | 6/1996 |
| EP | 0928070 | 7/1999 |
| GB | 2162025 | 1/1986 |
| JP | 04-241681 | 8/1992 |
| JP | 6051989 | 2/1994 |
| JP | 9188009 | 7/1997 |
| JP | 11149376 | 6/1999 |
| WO | WO 94/14273 | 6/1994 |
| WO | WO 94/29852 | 12/1994 |
| WO | WO 95/02873 | 1/1995 |
| WO | WO 95/29437 A1 | 11/1995 |
| WO | WO 97/48212 | 12/1997 |
| WO | WO 98/39699 A2 | 9/1998 |
| WO | WO 99/08186 | 2/1999 |
| WO | WO 00/36754 A1 | 6/2000 |
| WO | WO 01/57642 | 8/2001 |
| WO | WO 01/57659 | 8/2001 |
| WO | WO 01/63772 | 8/2001 |
| WO | WO 02/39591 | 5/2002 |

OTHER PUBLICATIONS

Whiting, Doug, "Deflate vs. LZS", Nov. 2000, 2 pages.
"The Packeteer Q4 2005 Financial Confrence Call", Jan. 26, 2006, 9 pages.
Notice of Allowance for U.S. Appl. No. 11/551,204, mailed Jul. 11, 2011, 5 pages.
Notice of Allowance for U.S. Appl. No. 12/684,624, mailed Jul. 25, 2011, 5 pages.
Non-Final Office Action for U.S. Appl. No. 12/703,042, mailed Jul. 28, 2011, 5 pages.
Non-Final Office Action for U.S. Appl. No. 12/857,238, mailed Aug. 10, 2011, 6 pages.
Non-Final Office Action for U.S. Appl. No. 13/101,994, mailed Aug. 16, 2011, 10 pages.
Notice of Allowance for U.S. Appl. No. 11/551,211 mailed Aug. 24, 2011, 5 pages.
Notice of Allowance for U.S. Appl. No. 12/684,624, mailed Sep. 1, 2011, 9 pages.
Examiner's Answer to Appeal Brief in Inter Partes Reexamination of U.S. Patent No. 7,321,937, Control No. 95/000,466, mailed Jul. 18, 2011, 33 pages.
Non-Final Office Action in Inter Partes Reexamination of U.S. Patent No. 7,777,651, Control No. 95/001,581, mailed Jul. 25, 2011, 274 pages.
"Data Compression Ratio", Wikipedia, the free encyclopedia, accessed on Aug. 10, 2011 from http://en.wikipedia.org/wiki/Data_compression_ratio, 2 pages.
Court Docket History for 6:10-cv-00493-LED-JDL *Realtime Data, LLC D/B/A/ IXO,* v. *MetroPCS Texas, LLC et al.,* dated Sep. 2, 2011, 16 pages.
Court Docket History for 6:09-cv-00326-LED-JDL *Realtime Data, LLC D/B/A/ IXO,* v. *Morgan Stanley et al.,* dated Sep. 2, 2011, 45 pages.
Court Docket History for 6:09-cv-00327-LED-JDL *Realtime Data, LLC D/B/A/IXO,* v. *CME Group Inc. et al.,* dated Sep. 2, 2011, 56 pages.

(56) References Cited

OTHER PUBLICATIONS

Court Docket History for 6:09-cv-00333-LED-JDL *Realtime Data, LLC D/B/A IXO* v. *Thomson Reuters et al.,* dated Sep. 2, 2011, 30 pages.
"A-T Financial Offers Manipulation, Redistribution of Ticker III", Inside Market Data, vol. 4 No. 14, Sep. 5, 1989, 1 page.
"Add-on Options for the XpressFiles", Intelligent Compression Technologies, http://web.archive.org/web/19980518053418/ictcompress.com/options_X.html, 1998, 2 pages.
Andrews et al., "A Mean-Removed Variation of Weighted Universal Vector Quantization for Image Coding", IEEE, 1993, pp. 302-309.
Asserted Claims Chart for U.S. Patent No. 6,624,761, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 4 pages.
Asserted Claims Chart for U.S. Patent No. 7,161,506,*Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 5 pages.
Asserted Claims Chart for U.S. Patent No. 7,400,274, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 6 pages.
Asserted Claims Chart for U.S. Patent No. 7,417,568, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 13 pages.
Asserted Claims Chart for U.S. Patent No. 7,714,747, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 19 pages.
Barton, Rich, S&P ComStock Network Character Set Definition, 19.2 KB Network, Version 1.7.0, Feb. 10, 1995, 29 pages.
Beech et al., AX.25 Link Access Protocol for Amateur Packet Radio, Version 2.2, Revision: Jul. 1998, 143 pages.
Bormann, Carsten, "Providing Integrated Services over Low-bitrate Links", Network Working Group Request for Comments: 2689, Category: Informational, Sep. 1999, 14 pages.
ComStock Services Pamphlet, McGraw-Hill Financial Services Company, purportedly published by Jul. 19, 1995, 6 pages.
Cormack, Gordon V., "Data Compression on a Database System", Communications of the ACM, vol. 28, No. 12, Dec. 1985, pp. 1336-1342.
Danskin, John Moffatt, Compressing the X Graphics Protocol: A Dissertation Presented to the Facult of Princeton University in Candidacy for the Degree of Doctor of Philosophy, Jan. 1995, 147 pages.
"Data Networks and Open System Communications", Information Technology—Abstract Syntax Notation One (ASN. 1) Specification of Basic Notation, International Telecommunication Union, ITU-T Telecommunication Standardization Sector of ITU X.680, Jul. 1994.
Defendants' Invalidity Contentions, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 19 pages.
Degermark, Mikael, "IP Header Compression", Network Working Group Request for Comments: 2507, Category: Standards Track, Feb. 1999, 47 pages.
Developer's Guide, Version 1.0.2, S&P ComStock, Feb. 15, 1994, 186 pages.
Domanski, Dr. Bernie, "All the news you can eat, Department: Dr. Bernie's Digestions and Digressions", Demand Technology's Capacity Management Review, vol. 25, No. 7, Jul. 1997, pp. 24, 18-22.
Effros, Michelle and Philip A. Chou, "Weighted Universal Transform Coding: Universal Image Compression with the Karhunen-Loeve Transform", IEEE, 1995, pp. 61-64.
Engan, Mathias, "IP Header Compression over PPP", Network Working Group Request for Comments: 2509, Category: 2509, Feb. 1999, 10 pages.

Exhibit A, Invalidity Claim Charts A1-A45 for U.S. Patent 6,624,761, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 616 pages.
Exhibit B, Invalidity Claim Charts B1-B45 for U.S. Patent 7,161,506, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 1513 pages.
Exhibit C, Invalidity Claim Charts C1-C7, C9-C31, C33-C45 for U.S. Patent 7,400,274, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 1528 pages.
Exhibit D, Invalidity Claim Charts D1-D7, D9-D45 for U.S. Patent 7,417,568, *Realtime Data, LLC D/B/A IXO* v. *CME Group Inc., et at.*, 6:09-cv-327-LED-JDL, 6:10-cv-246-LED-JDL, United States District Court for the Eastern District of Texas Tyler Division, Oct. 19, 2010, 2458 pages.
Exhibit E, Invalidity Claim Charts E1-E7, E9, E11, E13-E15, E17-E30, E32-E45 for U.S. Patent 7,714,747, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 3312 pages.
Greene, Tim, "Squeeze your 'Net links", NetworkWorld, vol. 14, No. 28, Jul. 14, 1997, pp. 1 and 56.
Helck, Christopher J., "Encapsulated Ticker: Ver 1.0", Jul. 14, 1993, 22 pages.
"High-performance schema-specific compression for XML data formats.", XML-Xpress: Product Overview, Intelligent Compression Technologies, http://web.archive.org/web/20020818002535/www.ictcompress.com/products_xmlxpress, 2001, 2 pages.
Hsu, William H. and Amy E. Zwarico, "Automatic Synthesis of Compression Techniques for Heterogeneous Files", Software—Practice and Experience, vol. 25 (10), Oct. 1995, pp. 1097-1116.
"ICT's XML-Xpress", Intelligent Compression Technologies, Dec. 2000, 6 pages.
"Information processing systems—Data communication—High-level data link control procedures—Frame structure", UNI ISO 3309, 1984, 11 pages.
Installing and Administering PPP, Edition 1, Hewlitt-Packard Company, 1997, 169 pages.
"Introducing XpressFiles", Intelligent Compression Technologies, http://web.archive.org/web/19980518053310/ictcompress.com/xpressfiles.html, 1998, 1 page.
"Ion's RemoteScript speeds transmission", Seybold Report on Publishing Systems, vol. 22 No. 5, Nov. 9, 1992, pp. 21-23.
Jacobson, Compressing TCP/IP Headers for Low-Speed Serial Links, Feb. 1990, 43 pages.
Kulkosky, Victor, "Upping the Ante", Wall Street & Technology, vol. 11 No. 5, Oct. 1993, pp. 8-11.
Liefke, Hartmut and Dan Suciu, An Extensible Compressor for XML Data, SIGMOD Record, vol. 29, No. 1, Mar. 2000, pp. 57-62.
Liefke, Hartmut and Dan Suciu, Xmill: an Efficient Compressor for XML Data, 2000, pp. 153-164.
Liefke, Hartmut and Dan Suciu, Xmill: an Efficient Compressor for XML Data, Oct. 18, 1999, 25 pages.
McGregor, Glenn, "The PPP Internet Protocol Control Protocol (IPCP)", Network Working Group Request for Comments: 1332, Obsoletes: RFC 1172, May 1992, 14 pages.
Obviousness Chart for U.S. Pat. No. 6,624,761, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 19 pages.
Obviousness Chart for U.S. Pat. No. 7,161,506, *Realtime Data, LLC D/B/A IXO* v. *CME Group Inc., et al.*, 6,09-cv-327-LED-JDL, 6:10-cv-246-LED-JDL, United States District Court for the Eastern District of Texas Tyler Division, Oct. 19, 2010, 49 pages.
Obviousness Chart for U.S. Pat. No. 7,400,274, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 41 pages.

(56) References Cited

OTHER PUBLICATIONS

Obviousness Chart for U.S. Pat. No. 7,417,568, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 75 pages.
Obviousness Chart for U.S. Pat. No. 7,714,747, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19. 2010, 97 pages.
Open Financial Exchange Specification 2.0, Intuit Inc., Microsoft Corp., Apr. 28, 2000, 537 pages.
Rand, Dave, "The PPP Compression Control Protocol (CCP)", Network Working Group Request for Comments: 1962, Category: Standards Track, Jun. 1996, 9 pages.
Rogers, Amy, "Bandwidth Bargain IT hot on products that squeeze more out of the pipe", No. 673, Jul. 21, 1997, pp. 1 and 65.
Roth, Mark A. and Scott J. Van Horn, "Database Compression", SIGMOD Record, vol. 22, No. 3, Sep. 1993, pp. 31-39.
Schmerken, Ivy "Time Running Out for Old Technologies", Wall Street Computer Review, Apr. 1990, pp. 14-16, 23-24, 28, 56.
"Scrolling News", Inside Market Data, Feb. 27, 1995, 2 pages.
Simpson, W., "PPP in HDLC-like Framing", Network Working Group Request for Comments: 1662, STD 51, Obsoletes 1549, Category: Standards Track, Jul. 1994, 26 pages.
Suciu, Dan, Data Management on the Web, AT&T Labs, Apr. 4, 2000, 52 slides.
Suciu, Dan, Data Management on the Web: Abstract, University of Washington Computer Science & Engineering, Apr. 4, 2000, 1 page.
"Telekurs Buys S&P Trading Systems and Its Ticker III Feed", Inside Market Data, vol. 4, No. 11, Jul. 10, 1989, 1 page.
"Telekurs May Debut 128 KPS Ticker By Year's End", Inside Market Data, Jul. 18, 1994, 2 pages.
"Telekurs Now Carries All Dow Jones' News on 56-Kbps Ticker," Inside Market Data, Dec. 20, 1993, 2 pages.
"Telekurs Sells No. American Division in Mgmt. Buyout", Inside Market Data, Oct. 23, 1995, 2 pages.
"Telekurs to Launch New Int'l Feed/Internet Server", Wall Street & Technology, vol. 15, No. 1, Jan. 1997, p. 14.
"The Technology Behind XpressFiles," *Intelligent Compression Technologies*, http://web.archive.org/web/19980518053634/ictcompress.com/technical_X.html. 1998, 1 page.
TID Information: Revisions to TID Program Since the Dawn of Time!!! Version 1.0, 23 pages, TID Codes 1, 1 page; TID Codes 2, 1 page, purportedly by Jul. 19, 1995.
TypeWorld: The First and Only Newspaper for Electronic Publishing, vol. 16 No. 9, Jun. 17, 1992, 3 pages.
"XpressFiles White Paper", Intelligent Compression Technologies, 1999-2001, 3 pages.
U.S. Appl. No. 60/309,218, filed Jul. 31, 2001, 58 pgs.
Telekurs Manual, Jan. 11, 1993, 184 pages.
Danskin, et al., "Fast Higher Bandwidth X," Dartmouth College, Hanover, NH, 1995, 8 pages.
Hoffman, Roy, "Data Compression in Digital Systems," Digital Multimedia Standards Series, Chapman & Hall, 1997, 426 pages.
Defendants' Invalidity Contentions, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 34 pages.
Appendix A, Obviousness Chart for U.S. Patent No. 7,777,651, not dated, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 466 pages.
Appendix B, § 112 Invalidity Arguments for U.S. Pat. No. 7,777,651, *Realtime Data, LLC D/B/A IXO v. Morgan Stanley, et al.*, 6:09-cv-326-LED-JDL, 6:10-cv-248-LED-JDL., 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 75 pages.
Exhibit 1, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 161 pages, citing Aakre et al., U.S. Patent No. 4,956,808.
Exhibit 2, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 206 pages, citing Albert et al., U.S. Patent No. 5,907,801.
Exhibit 3, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 95 pages, citing B. Andrews, P. Chou, M. Effros and R. Gray "A Mean-Removed Variation of Weighted Universal Vector Quantization for Image Coding," IEEE 0-8186-3392-1/93, 302-309 (1993).
Exhibit 4, Prior Art Chart for U.S. Pat. No. 7,777,651, 144 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Barnes et al., U.S. Patent No. 6,792,151.
Exhibit 5, Prior Art Chart for U.S. Pat. No. 7,777,651, 216 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Birdwell et al., U.S. Patent No. 6,032,197.
Exhibit 6, Prior Art Chart for U.S. Pat. No. 7,777,651, 257 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Bledsoe, U.S. Patent No. 4,646,061.
Exhibit 7, Prior Art Chart for U.S. Pat. No. 7,777,651, 169 pages, *Realtime Data, LLC D/B/A IXO v. Morgan Stanley, et al.*, 6:09-cv-326-LED-JDL, 6:10-cv-248-LED-JDL, 6:10-cv-426-LED-JDL,

(56) References Cited

OTHER PUBLICATIONS

*Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Brickman et al., U.S. Patent No. 4,499,499.

Exhibit 8, Prior Art Chart for U.S. Pat. No. 7,777,651, 396 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing C. Bormann et al., "Robust Header Compression (ROHC)," Network Working Group Internet-Draft Sep. 18, 2000.

Exhibit 9, Prior Art Chart for U.S. Pat. No. 7,777,651, 253 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Carr, U.S. Patent No. 5,293,379.

Exhibit 10, Prior Art Chart for U.S. Pat. No. 7,777,651, 205 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Cellier et al., U.S. Patent No. 5,884,269.

Exhibit 11, Prior Art Chart for U.S. Pat. No. 7,777,651, 181 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Chu, U.S. Patent Nos. 5,374,916 & 5,467,087.

Exhibit 12, Prior Art Chart for U.S. Pat. No. 7,777,651, 175 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Cisco IOS Data Compression White Paper (Cisco Systems Inc., 1997).

Exhibit 13, Prior Art Chart for U.S. Pat. No. 7,777,651, 590 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Comstock—S&P ComStock Developers Guides (McGraw-Hill, 1994); Rich Barton, "S&P ComStock Network Character Set Definition"(Feb. 10, 1995).

Exhibit 14, Prior Art Chart for U.S. Pat. No. 7,777,651, 186 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing D.J. Craft. "A fast hardware data compression algorithm and some algorithmic extensions," IBM J. Res. Develop. vol. 42, No. 6 (Nov. 6, 1998).

Exhibit 15, Prior Art Chart for U.S. Pat. No. 7,777,651, 142 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Deering, U.S. Patent No. 6,459,429.

Exhibit 16, Prior Art Chart for U.S. Pat. No. 7,777,651, 284 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Dye et al., U.S. Patent No. 7,190,284 and International Publication No. WO 00/45516.

Exhibit 17, Prior Art Chart for U.S. Pat. No. 7,777,651, 269 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Earl et al., U.S. Patent No. 5,341,440.

Exhibit 18, Prior Art Chart for U.S. Pat. No. 7,777,651, 132 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Eastman et al., U.S. Patent No. 4,464,650.

Exhibit 19, Prior Art Chart for U.S. Pat. No. 7,777,651, 125 pages, *Realtime Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Elgamal et al., U.S. Patent No. 5,410,671.

Exhibit 20, Prior Art Chart for U.S. Pat. No. 7,777,651, 122 pages, *Reatitme Data, LLC D/B/A IXO v. Morgan Stanley, et al.,* 6:09-cv-326-LED-JDL, 6:10-cv-248-LED-JDL, 6:10-cv-426-LED-JDL, *Realtime Data, LLC D/B/A IXO v. CME Group Inc., et al.,* 6:09-cv-327-LED-JDL, 6:10-cv-246-LED-JDL, 6:10-cv-424-LED-JDL, *Realtime Data, LLC D/B/A IXO v. Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Enari et al., European Patent Application No. 0493130 A2.

Exhibit 21, Prior Art Chart for U.S. Pat. No. 7,777,651, 379 pages, *Realtime Data, LLC D/B/A IXO v. Morgan Stanley, et al.,* 6:09-cv-

(56) References Cited

OTHER PUBLICATIONS

326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Fascenda, U.S. Patent No. 5,045,848.

Exhibit 22, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Frachtenberg et al., U.S. Patent. Pub. 2003/0030575.

Exhibit 23, Prior Art Chart for U.S. Pat. No. 7,777,651, 247 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO V. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Franaszek et al., U. S. Patent No. 5,870,036.

Exhibit 24, Prior Art Chart for U.S. Pat. No. 7,777,651, 327 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing French et al., U.S. Patent No. 5,794,229.

Exhibit 25, Prior Art Chart for U.S. Pat. No. 7,777,651, 225 pages, Exhibit 24, Prior Art Chart for U.S. Pat. No. 7,777,651, 327 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Geiger et al., U.S. Patent No. 5,987,022.

Exhibit 26, Prior Art Chart for U.S. Pat. No. 7,777,651, 219 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., at al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gentile, U.S. Patent No. 5,504,842.

Exhibit 27, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 167 pages, citing Giltner et al., U.S. Patent No. 4,386,416.

Exhibit 28, Prior Art Chart for U.S. Pat. No. 7,777,651, 156 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gooch, U.S. Patent No. 4,325,085.

Exhibit 29, Prior Art Chart for U.S. Pat. No. 7,777,651, 132 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hauck, U.S. Patent No. 4,626,829.

Exhibit 30, Prior Art Chart for U.S. Pat. No. 7,777,651, 161 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Heath, U.S. Patent No. 5,955,976.

Exhibit 31, Prior Art Chart for U.S. Pat. No. 7,777,651, 359 pages, *Realtime Data, LLC D/B/A IXO v. Morgan Stanley, at al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., at al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hewlett-Packard Company, "Installing and Administering PPP," B2355-90137, HP 9000 Networking, E0948 (1st Ed. 1997).

Exhibit 32, Prior Art Chart for U.S. Pat. No. 7,777,651, 229 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hsu & Zwarico, Automatic Synthesis of Compression Techniques for Heterogeneous Files, Software-Practice & Experience, vol. 25(10), pp. 1097-1116 (Oct. 1995).

Exhibit 33, Prior Art Chart for U.S. Pat. No. 7,777,651, 206 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XML-Xpress White Paper (Intellient Compression Technologies Inc., 2000) & website.

Exhibit 34, Prior Art Chart for U.S. Pat. No. 7.777,651, 138 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XpressFiles White Paper (Intelligent Compression Technologies Inc., 1999) & website.

Exhibit 35, Prior Art Chart for U.S. Pat. No. 7,777,651, 128 pages, *Realtime Data, LLC D/B/A IXO v. Morgan Stanley, et al.*, 6:09-cv-

(56) References Cited

OTHER PUBLICATIONS

326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Iseda et al., E.P. 0405572 A2.
Exhibit 36, Prior Art Chart for U.S. Pat. No. 7,777,651, 205 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing J. Danskin. "Compressing the X Graphics Protocol," Princeton University (Jan. 1995).
Exhibit 37, Prior Art Chart for U.S. Pat. No. 7,777,651, 159 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Kalkstein, U.S. Patent No. 5,945,933.
Exhibit 38, Prior Art Chart for U.S. Pat. No. 7,777,651, 402 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Kari, U.S. Patent No. 6,434,168; International Publication No. WO97/48212 A1.
Exhibit 39, Prior Art Chart for U.S. Pat. No. 7,777,651, 209 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Koopmas et al., U.S. Patent No. 7,024,460.
Exhibit 40, Prior Art Chart for U.S. Pat. No. 7,777,651, 214 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Patent No. 5,825,830.
Exhibit 41, Prior Art Chart for U.S. Pat. No. 7,777,651, 281 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Patent No. 5,825,830.
Exhibit 42, Prior Art Chart for U.S. Pat. No. 7,777,651, 340 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Lane et al., U.S. Patent No. 5,521,940.
Exhibit 43, Prior Art Chart for U.S. Pat. No. 7,777,651, 164 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Langdon, Jr. et al., U.S. Patent No. 4,494,108.
Exhibit 44, Prior Art Chart for U.S. Pat. No. 7,777,651, 211 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Lavallee, U.S. Patent No. 6,215,904.
Exhibit 45, Prior Art Chart for U.S. Pat. No. 7,777,651, 103 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing M. Effros, P. Chou & R.M. Gray. "Variable Dimension Weighted Universal Vector Quantization and Noiseless Coding," IEEE 1068-0314/94 (1994).
Exhibit 46, Prior Art Chart for U.S. Pat. No. 7,777,651, 414 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL,6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing MacCrisken, U.S. Patent No. 4,730,348.
Exhibit 47, Prior Art Chart for U.S. Pat. No. 7,777,651, 319 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL,.6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Madany et al., U.S. Patent No. 5,774,715.
Exhibit 48, Prior Art Chart for U.S. Pat. No. 7,777,651, 228 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011,citing Mark A. Roth and Scott J. Van Horn, "Database Compression" SIGMOD Record, vol. 22, No. 3 (1993).
Exhibit 49, Prior Art Chart for U.S. Pat. No. 7,777,651, 235 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL,

(56) References Cited

OTHER PUBLICATIONS

*Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Miller et al., U.S. Patent No. 4,814,746.
Exhibit 50, Prior Art Chart for U.S. Pat. No. 7,777,651, 172 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing O'Brien et al., U.S. Patent No. 4,929,946.
Exhibit 51, Prior Art Chart for U.S. Pat. No. 7,777,651, 30 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Osler et al., U.S. Patent No. 6,768,749.
Exhibit 52, Prior Art Chart for U.S. Pat. No. 7,777,651, 103 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing P. G. Howard, F. Kossenti, S. Forchammer, and W. J. Rucklidge [1998]. "The Emerging JBIG2 Standard", IEEE Transactions On Circuits And Systems For Video Technology 8:7, 838-848.
Exhibit 53, Prior Art Chart for U.S. Pat. No. 7,777,651, 218 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Panaoussis, U.S. Patent No. 5,949,355.
Exhibit 54, Prior Art Chart for U.S. Pat. No. 7,777,651, 335 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Payne et al, U.S. Patent No. 6,021,433.
Exhibit 55, Prior Art Chart for U.S. Pat. No. 7,777,651, 273 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Reynar et al, U. S. Patent No. 5,951,623.
Exhibit 56, Prior Art Chart for U.S. Pat. No. 7,777,651, 399 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1144: V. Jacobson, "Compressing TCP/IP Headers for Low-Speed Serial Links," Network Working Group, Request for Comments: 1144 (Feb. 1990).
Exhibit 57, Prior Art Chart for U.S. Pat. No. 7,777,651, 103 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1661: Point-to-Point Protocol Working Group, "The Point-to-Point Protocol," RFC 1661 (William Simpson ed., Internet Engineering Task Force 1994); RFC 1662: Point-to-Point Protocol Working Group, "PPP in HDLC-like Framing," RFC 1662 (William Simpson ed., Internet Engineering Task Force 1994); RFC 1962: Dave Rand, "The PPP compression Control Protocol (CCP)," RFC 1962 (Internet Engineering Task Force 1996); RFC 1332: Glenn McGregor, "The PPP Internet Protocol Control Protocol (IPCP)," RFC 1332 (Internet Engineering Task Force 1992); RFC 2509: Mathias Engan et al., "IP Header Compression over IP," RFC 2509 (Internet Society 1999).
Exhibit 58, Prior Art Chart for U.S. Pat. No. 7,777,651, 218 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 2507: Mikael Degermark et al., "IP Header Compression," RFC 2507 (Internet Society 1999).
Exhibit 59, Prior Art Chart for U.S. Pat. No. 7,777,651, 335 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Roper et al., U.S. Patent No. 5,454,079.
Exhibit 60, Prior Art Chart for U.S. Pat. No. 7,777,651, 273 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Sebastian, U.S. Patent No. 6,253,264 and International Publication No. WO/1998/039699.
Exhibit 61, Prior Art Chart for U.S. Pat. No. 7,777,651, 399 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Patent No. 5,243,341.
Exhibit 62, Prior Art Chart for U.S. Pat. No. 7,777,651, 322 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL,

(56) References Cited

OTHER PUBLICATIONS

*Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Patent No. 5,389,922.
Exhibit 63, Prior Art Chart for U.S. Pat. No. 7,777,651, 102 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Shin, U.S. Patent No. 5,455,680.
Exhibit 64, Prior Art Chart for U.S. Pat. No. 7,777,651, 126 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Taaffe et al., U.S. Patent No. 5,179,651.
Exhibit 65, Prior Art Chart for U.S. Pat. No. 7,777,651, 313 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Telekurs Ticker—"Telekurs Ticker Service: Programmer's Reference," Telekurs (North America), Inc. (Jan. 11, 1993); C. Helck. "Encapsulated Ticker: Ver. 1.0," Telekurs NA, 1-22 (Jul. 14, 1993); A-T Financial Offers Manipulation, Redistribution of Ticker III, Micro Ticker Report, v 4, n 14 (Sep. 5, 1989); V. Kulkosky, "Upping the Ante" Wall Street & Technology, v11 n5 pp. 8-11 (Oct. 1993); "Telekurs to Launch New Int'l Feed/Internet Server," Wall Street & Technology, v15 n1 pp. 14 (Jan. 1997); I. Schmerken, "Time running out for old technologies", Wall Street Computer Review, v7 n7 p. 14(7) (Apr. 1990); Scrolling News, Inside Market Data, v 10, n 11 (Feb. 27, 1995); Telekurs Buys S&P Trading Systems and Its Ticker III Feed, Micro Ticker Report, v 4, n 11 (Jul. 10, 1989); Telekurs May Debut 128 KPS Ticker by Year's End, Inside Market Data, v 9, n 21 (Jul. 18, 1994); Telekurs Now Carries All Dow Jones' News on 56-KBPS Ticker, Inside Market Data, v9, n7 (Dec. 20, 1993); Telekurs Sells No. American Division in MGMT. Buyout, Inside Market Data, v11, n3 (Oct. 23, 1995).
Exhibit 66, Prior Art Chart for U.S. Pat. No. 7,777,651, 265 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Tyler et al., U.S. Patent No. 5,638,498.
Exhibit 67, Prior Art Chart for U.S. Pat. No. 7,777,651, 86 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing UNI International Standard ISO 3309-1984 (E) [1984]. "Information Processing Systems—Data Communication—High-level Data Link Control Procedures—Frame Structure," 1-6 (1984).
Exhibit 68, Prior Art Chart for U.S. Pat. No. 7,777,651, 236 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Unwired Planet, EP 0928070 A2.
Exhibit 69, Prior Art Chart for U.S. Pat. No. 7,777,651, 80 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Vange et al., U.S. Patent No. 7,127,518.
Exhibit 70, Prior Art Chart for U.S. Pat. No. 7,777,651, 197 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Wernikoff et al., U.S. Patent No. 3,394,352.
Exhibit 71, Prior Art Chart for U.S. Pat. No. 7,777,651, 253 pages, Exhibit 70, Prior Art Chart for U.S. Pat. No. 7,777,651, 197 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,*6:09-cv-333-LED-JDL, 6:10-cv-247-LED-JDL, 6:10-cv-425-LED-JDL, United States District Court for the Eastern District of Texas Tyler Division, Feb. 4, 2011, citing Willis et al., U.S. Patent No. 4,745,559; Boilen, U.S. Patent No. 4,750,135.
Exhibit 72, Prior Art Chart for U.S. Pat. No. 7,777,651, 277 pages, Exhibit 71, Prior Art Chart for U.S. Pat. No. 7,777,651, 253 pages, Exhibit 70, Prior Art Chart for U.S. Pat. No. 7,777,651, 197 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing XMill—Hartmut Liefke & Dan Suciu, "XMill: an Efficient Compressor for XML Data," University of Pennsylvania, Philadelphia, Pennsylvania, MS-CIS-99-26 (Oct. 18, 1999); Hartmut Liefke & Dan Suciu, "XMill: an Efficient Compressor for XML Data," Proceedings of SIGMOD, 2000; Hartmut Liefke & Dan Suciu, "An Extensible Compressor for XML Data," SIGMOD Record, vol. 29, No. 1 (Mar. 2000); Dan Suciu, "Data Management on the Web," Presentation at University of Washington College of Computer Science & Engineering, Seattle, WA (Apr. 4, 2000).
Bormann et al., "Robust Header Compression (ROHC)," Network Working Group Internet-Draft, Sep. 18, 2000, 111 pages.
Effros, M., P.A. Chou and R.M. Gray, "Variable Dimension Weighted Universal Vector Quantization and Noiseless Coding," IEEE 1068-0314/94, 1994, pp. 2-11.
Defendant Bloomberg L.P.'s Invalidity Contentions Pursuant to Patent Local Rule 3-3, *Realtime Data, LLC d/b/a IXO* vs. *Thomson Reuters Corp., et al.,* 6:2009-cv-00333 LED-JDL, 6:2010-cv-00247 LED-JDL, 6:2010-cv-00425 LED-JDL, Oct. 29, 2010, 17 pages.

(56) References Cited

OTHER PUBLICATIONS

Appendix A: U.S. Patent No. 6,624,761 (The "761 Patent"), from Defendant Bloomberg L.P.'s Invalidity Contentions Pursuant to Patent Local Rule 3-3, *Realtime Data, LLC d/b/a IXO* vs. *Thomson Reuters Corp., et al.,* 6:2009-cv-00333 LED-JDL, 6:2010-cv-00247 LED-JDL, 6:2010-cv-00425 LED-JDL, Oct. 29, 2010, 37 pages.
Appendix B: U.S. Patent No. 7,161,506 (The "506 Patent"), from Defendant Bloomberg L.P.'s Invalidity Contentions Pursuant to Patent Local Rule 3-3, *Realtime Data, LLC d/b/a IXO* vs. *Thomson Reuters Corp., et al.,* 6:2009-cv-00333 LED-JDL, 6:2010-cv-00247 LED-JDL, 6:2010-cv-00425 LED-JDL, Oct. 29, 2010, 63 pages.
Appendix C: U.S. Patent No. 7,400,274 (The 274 Patent), from Defendant Bloomberg L.P.'s Invalidity Contentions Pursuant to Patent Local Rule 3-3, *Realtime Data, LLC d/b/a IXO* vs. *Thomson Reuters Corp., et al.,* 6:2009-cv-00333 LED-JDL, 6:2010-cv-00247 LED-JDL, 6:2010-cv-00425 LED-JDL, Oct. 29, 2010, 95 pages.
Appendix D: U.S. Patent No. 7,417,568 (The 568 Patent), from Defendant Bloomberg L.P.'s Invalidity Contentions Pursuant to Patent Local Rule 3-3, *Realtime Data, LLC d/b/a IXO* vs. *Thomson Reuters Corp., et al.,* 6:2009-cv-00333 LED-JDL, 6:2010-cv-00247 LED-JDL, 6:2010-cv-00425 LED-JDL, Oct. 29, 2010, 147 pages.
Appendix E: U.S. Patent No. 7,714,747 (The "747 Patent"), from Defendant Bloomberg L.P.'s Invalidity Contentions Pursuant to Patent Local Rule 3-3, *Realtime Data, LLC d/b/a IXO* vs. *Thomson Reuters Corp., et al.,* 6:2009-cv-00333 LED-JDL, 6:2010-cv-00247 LED-JDL, 6:2010-cv-00425 LED-JDL, Oct. 29, 2010, 137 pages.
Appendix F: Comparison of FAST to the Prior Art, from Defendant Bloomberg L.P.'s Invalidity Contentions Pursuant to Patent Local Rule 3-3, *Realtime Data, LLC d/b/a IXO* vs. *Thomson Reuters Corp., et al.,* 6:2009-cv-00333 LED-JDL, 6:2010-cv-00247 LED-JDL, 6:2010-cv-00425 LED-JDL, Oct. 29, 2010, 7 pages.
Defendant Bloomberg L.P.'s Invalidity Contentions Pursuant to Patent Local Rule 3-3 Regarding U.S. Patent No. 7,777,651, *Realtime Data, LLC d/b/a IXO* vs. *Thomson Reuters Corp., et al.,* 6:2009-cv-00333 LED-JDL, 6:2010-cv-00425 LED-JDL, Feb. 4, 2011, 21 pages.
Appendix G: U.S. Patent No. 7,777,651 (The 651 Patent), Defendant Bloomberg L.P.'s Invalidity Contentions Pursuant to Patent Local Rule 3-3 Regarding U.S. Patent No. 7,777,651, *Realtime Data, LLC d/b/a IXO* vs. *Thomson Reuters Corp., et al.,* 6:2009-cv-00333 LED-JDL, 6:2010-cv-00247 LED-JDL, 6:2010-cv-00425 LED-JDL, Feb. 4, 2011, 480 pages.
Rice, Robert F., "Some Practical Universal Noiseless Coding Techniques", Jet Propulsion Laboratory, Pasadena, California, JPL Publication 79-22, March 15, 1979; 140 pgs.
Anderson, J., et al. "Codec squeezes color teleconferencing through digital telephone lines," Electronics 1984, pp. 13-15.
Venbrux, Jack, "A VLS1 Chip Set for High-Speed Lossless Data Compression", IEEE Trans. On Circuits and Systems for Video Technology, vol. 2, No. 4, Dec. 1992, pp. 381-391.
"Fast Dos Soft Boot", IBM Technical Disclosure Bulletin, Feb. 1994, vol. 37, Issue No. 2B, pp. 185-186.
"Operating System Platform Abstraction Method", IBM Technical Disclosure Bulletin, Feb. 1995, vol. 38, Issue No. 2, pp. 343-344.
Murashita, K., et al., "High-Speed Statistical Compression using Self-Organized Rules and Predetermined Code Tables", IEEE, 1996 Data Compression Conference.
Coene, W., et al. "A Fast Route For Application of Rate-distortion Optimal Quantization in an MPEG Video Encoder" Proceedings of the International Conference on Image Processing, US., New York, IEEE, Sep. 16, 1996, pp. 825-828.
Rice, Robert, "Lossless Coding Standards for Space Data Systems", IEEE 1058-6393197, Nov. 3-6, 1996, pp. 577-585.
Millman, Howard, "Image and video compression", Computerworld, vol. 33, Issue No. 3, Jan. 18, 1999, pp. 78.
"IBM boosts your memory", Geek.com [online], Jun. 26, 2000 [retrieved on Jul. 6, 20071, www.geek.com/ibm-boosts-your-memory/, 7 pages.

"IBM Research Breakthrough Doubles Computer Memory Capacity", IBM Press Release [online], Jun. 26, 2000 [retrieved on Jul. 6, 20071, www-03. ibm.com/press/us/en/pressrelease/1653.wss, 3 pages.
"ServerWorks To Deliver IBM's Memory expansion Technology in Next-Generation Core Logic for Servers", ServerWorks Press Release [online], Jun. 27, 2000 [retrieved on Jul. 14, 20001, http://www.serverworks.com/news/press/000627.html, 1 page.
Abali B., et al., "Memory Expansion Technology (MXT) Software support and performance", IBM Journal of Research and Development, vol. 45, Issue No. 2, Mar. 2001, pp. 287-301.
Franaszek, P. A,, et al., "Algorithms and data structures for compressed-memory machines", IBM Journal of Research and Development, vol. 45, Issue No. 2, Mar. 2001, pp. 245-258.
Franaszek, P. A,, et al., "On internal organization in compressed random-access memories", IBM Journal of Research and Development, vol. 45, Issue No. 2, Mar. 2001, pp. 259-270.
Smith, T.B., et al., "Memory Expansion Technology (MXT) Competitive impact", IBM Journal of Research and Development, vol. 45, Issue No. 2, Mar. 2001, pp. 303-309.
Tremaine, R. B., et al., "IBM Memory Expansion Technology (MXT)", IBM Journal of Research and Development, vol. 45, Issue No. 2, Mar. 2001, pp. 271-285.
Yeh, Pen-Shu, "The CCSDS Lossless Data Compression Recommendation for Space Applications", Chapter 16, Lossless Compression Handbook, Elsevier Science (USA), 2003, pp. 311-326.
Expand Networks Accelerator 4000 Series User's Guide, 1999, 101 pgs.
Tridgell, Andrew; "Efficient Algorithms for Sorting and Synchronization"; A thesis submitted for the degree of Doctor of Philosophy at The Australian National University; Feb. 1999; pp. iii-106.
Jung, et al.; "Performance optimization of wireless local area networks through VLSI data compression"; Wireless Networks, vol. 4, 1998; pp. 27-39.
Baker, K. et al., "Lossless Data Compression for Short Duration 3D Frames in Position Emission Tomography," 0-7803-1487, May 1994, pp. 1831-1834.
Maier, Mark W.; "Algorithm Evaluation for the Synchronous Data Compression Standard"; University of Alabama: 1995, pp. 1-10.
Bassiouni, et al.; "A Scheme for Data Compression in Supercomputers"; IEEE; 1988; pp. 272-278.
Welch, Terry A.; "A Technique for High-Performance Data Compression"; IEEE; Jun. 1984; pp. 8-19.
ALDC: Adaptive Lossless Data Compression; IBM; 1994, 2 pgs.
ALDC-Macro: Adaptive Lossless Data Compression; IBM Corporation; 1994, 2 pgs.
ALDC1-20S: Adaptive Lossless Data Compression; IBM Corporation; 1994, 2 pgs.
ALDC1-40S: Adaptive Lossless Data Compression; IBM Corporation; 1994, 2 pgs.
ALDC1-5S: Adaptive Lossless Data Compression; IBM Corporation; 1994, 2 pgs.
Craft, David J.; "Data Compression Choice No Easy Call"; Computer Technology Review; vol. XIV, No. 1; Jan. 1994, 2 pgs.
Costlow, Terry; "Sony designs faster, denser tape drive"; Electronic Engineering Times; May 20, 1996, pp. 86-87.
Wilson Ron; "IBM ups compression ante"; Electronic Engineering Times; Aug. 16, 1993; ppp. 1-94.
"IBM Announces New Feature for 3480 Subsystem"; Tucson Today; vol. 12, No. 337, Jul. 25, 1989, 1 pg.
Syngress Media, Inc.; "CCA Citrix Certified Administrator for MetaFrame 1.8 Study Guide"; 2000, 568 pgs.
International Telecommunication Union; "Data Compression Procedures for Data Circuit Terminating Equipment (DCE) Using Error Correction Procedures"; Geneva, 1990, 29 pgs.
Cheng, et al.; "A fast, highly reliable data compression chip and algorithm for storage systems"; IBM J. Res. Develop.; vol. 40, No. 6, Nov. 1996; pp. 603-613.
Cisco Systems; "Cisco IOS Data Compression"; 1997; pp. 1-10.
Craft, D. J.; "A fast hardware data compression algorithm and some algorithmic extensions"; IBM J. Res. Develop.; vol. 42; No. 6; Nov. 6, 1998; pp. 733-746.

(56) References Cited

OTHER PUBLICATIONS

Rustici, Robert; "Enhanced CU-SeeMe" 1995, Zero In Technologies, Inc., 308 pgs.
White Pine Software; "CU-SeeMe Pro: Quick Start Guide"; Version 4.0 for Windows; 1999, 86 pgs.
"CU-SeeMe Reflector"; www.geektimes.com/michael/CU-SeeMe/faqs/reflectors.html; accessed on Dec. 2, 2008, 5 pgs.
Daniels, et al.; "Citrix WinFrame 1.6 Beta"; May 1, 1996; license. icopyright.net/user/downloadLicense.act?lic=3.7009-9123; accessed Dec. 2, 2008, 4 pgs.
Held, et al.; "Data Compression"; Third Edition; John Wiley & Sons Ltd.; 1991, 150 pgs.
Data Compression Applications and Innovations Workshop; Proceedings of a Workshop held in Conjunction with the IEEE Data Compression Conference; Snowbird, Utah; Mar. 31, 1995, 64 pgs.
Britton, et al.; "Discovery Desktop Conferencing with NetMeeting 2.0"; IDG Books Worldwide, inc.; 1997, 244 pgs.
Sattler, Michael; "Internet TV with CU-SeeMe"; Sams.Net Publishing; 1995; First Edition, 80 pgs.
IBM Microelectronics Comdex Fall '93 Booth Location, 1 pg.
Disz, et al.; "Performance Model of the Argonne Voyager Multimedia Server"; IEEE; 1997; pp. 316-327.
"Downloading and Installing NetMeeting"; www.w4mq.com/help/h3.htm; accessed on December 2, 2008; 6 pgs.
Fox, et al.; "Adapting to Network and Client Variability via On-Demand Dynamic Distillation"; ASPLOS VII; Oct. 1996; pp. 160-170.
Fox, et al.; "Adapting to Network and Client Variation Using Infrastructural Proxies: Lessons and Perspectives"; IEEE Personal Communcations, Aug. 1998; pp. 10-19.
Han, et al.; "CU-SeeMe VR Immersive Desktop Teleconferencing"; Department of Computer Science; Cornell University; To appear in ACM Multimedia 1996, 9 pgs.
Howard, et al.; "Parallel Lossless Image Compression Using Huffman and Arithmetic Coding"; 1992, pp. 1-9.
Howard, Paul G.; "Text Image Compression Using Soft Pattern Matching"; The Computer Journal; vol. 40, No. 213; 1997; pp. 146-156.
Howard, et al.; "The Emerging JBIG2 Standard"; IEEE Transactions on Circuits and Systems for Video Technology, vol. 8, No. 7, Nov. 1998; pp. 838-848.
Craft, D. J.; "A fast hardware data compression algorithm and some algorithmic extensions"; Journal of Research and Development; vol. 42, No. 6, Nov. 1998; pp. 733-745.
"Direct Access Storage Device Compression and Decompression Data Flow"; IBM Technical Disclosure Bulletin; vol. 38, No. 11; Nov. 1995; pp. 291-295.
ICA Timeline, Sep. 24, 2007, 3 pgs.
Converse, et al.; "Low Bandwidth X Extension"; Protocol Version 1.O; X Consortium; Dec. 21, 1996, 55 pgs.
Magstar and IBM 3590 High Performance Tape Subsystem Technical Guide; Nov. 1996; IBM International Technical Support Organization, 288 pgs.
MetaFrame Administration Student Workbook; Jun. 1998; Citrix Professional Courseware; Citrix Systems, Inc., 113 pgs.
NCD Wincenter 3.1 : Bringing Windows to Every Desktop, 1998; 2 pgs.
Overview NetMeeting, 2.1; Microsoft TechNet; technet.microsoft.com1en-usllibrary1cc767141 (printer).aspx; accessed Dec. 2, 2008; 7 pgs.
NetMeeting 2.1 Resource Kit; Microsoft TechNet; technet.microsoft.com1en-usllibrary1cc767142(printer).aspx; accessed on Dec. 2, 2008, 34 pgs.
Conferencing Standards: NetMeeting 2.1 Resource Kit: Microsoft TechNet; technet.microsoft.com/—us/library/cc767150(printer).aspx; accessed Dec. 2, 2008, 14 pgs.
Summers, Bob; "Official Microsoft NetMeeting Book"; Microsoft Press; 1998, 374 pgs.
Zebrose, Katherine L.; "Integrating Hardware Accelerators into Internetworking Switches"; Telco Systems, 10 pgs (no date listed).
Simpson, et al.; "A Multiple Processor Approach to Data Compression"; ACM; 1998; pp. 641-649, 9 pgs.
"IBM Technology Products Introduces New Family of High-Performance Data Compression Products"; IBM; Aug. 16, 1993, 6 pgs.
ReadMe; PowerQuest Drive Image Pro; Version 3.00; 1994-1999; PowerQuest Corporation, pp. 1-6.
Scbulzrinne, et al., "*RTP Profile for Audio and Video Conferences with Minimal Control,*" Jan. 1996; www.ietf.org/rfc/rfc1890.txt, accessed on Dec. 3, 2008; 17 pgs.
Zhu, C.; "RTP Payload Format for H.263 Video Streams"; Standards Track; Sep. 1997; pp. 1-12.
Simpson, W.; "The Point-To-Point Protocol (PPP)," Standards Track, Jul. 1994, pp. i-52.
Reynolds, et al., "Assigned Numbers," Standards Track; Oct. 1994, pp. 1-230.
Deutsch, et al.; "ZLIB Compressed Data Format Specification version 3.3," Informational, May 1996, pp. 1-10.
Deutsch, P., "DEFLATE Compressed Data Format Specification version 1.3," Informational, May 1996, pp. 1-15.
Rand, D., "The PPP Compression Control Protocol (CCP)," Standards Track, Jun. 1996, pp. 1-9.
Schneider, et al., "PPP LZS-DCP Compression Protocol (LZS-DCP)," Informational, Aug. 1996, pp. 1-18.
Friend, et al., "PPP Stac LZS Compression Protocol," Informational, Aug. 1996; pp. 1-20.
Schneider, et al., "PPP for Data Compression in Data Circuit-Terminating Equipment (DCE)," Informational, Aug. 1996, pp. 1-10.
Atkins, et al., "PGP Message Exchange Formats," Informational, Aug. 1996, pp. 1-21.
Castineyra, et al., "The Nimrod Routing Architecture," Informational, Aug. 1996, pp. 1-27.
Freed, et al., "Multipurpose Internet Mail Extensions (MIME) Part Four: Registration Procedures," Best Current Practice, Nov. 1996, pp. 1-21.
Shacham, et al., "IP Payload Compression Protocol (IPComp)," Standards Track, Dec. 1998, pp. 1-10.
Sidewinder 50 Product Manual, Seagate Technology, Inc., 1997, 189 pgs.
IBM RAMAC Virtual Array, IBM, Jul. 1997, 490 pgs.
Bruni, et al., "DB2 for OS/390 and Data Compression" IBM Corporation, Nov. 1998, 172 pgs.
Smith, Mark, "Thin Client/Server Computing Works," WindowsITPro, Nov. 1, 1998, pp. 1-13, license.icopyright.net/user/downloadLicense.act?lic=3.7009-8355, accessed Dec. 2, 2008.
International Telecommunication Union, "Information Technology—Digital Compression and Coding of Continuous-Tone Still Images-Requirements and Guidelines," 1993, 186 pgs.
International Telecommunications Union, "Information technology—Lossless and near-lossless compression of continuous-tone still images—Baseline," 1999, 75 pgs.
Davis, Andrew W., "The Video Answering Machine: Intel Proshare's Next Step," Advanced Imaging, vol. 12, No. 3, Mar. 1997, pp. 28, 30.
Abbott, III, Walter D., "A Simple, Low Overhead Data Compression Algorithm for Converting Lossy Compression Processes to Lossless," Naval Postgraduate School Thesis; Dec. 1993, 93 pgs.
Thomborson. Clark, "V.42bis and Other Ziv-Lemoel Variants," IEEE, 1991, p. 460.
Thomborson, Clark, "The V.42bis Standard for Data-Compressing Modems," IEEE, Oct. 1992, pp. 41-53.
Sun, Andrew, "Using and Managing PPP," O'Reilly & Associates, Inc., 1999, 89 pgs.
"What is the V42bis Standard?," www.faqs.org/faqs/compression-faq/part1/section-10.html, accessed on Dec. 2, 2008, 2 pgs.
"The WSDC Download Guide: Drive Image Professional for DOS, OS/2, and Windows," wsdcds01 .watson.ibm.com/WSDC.nsf/Guides/Download/Applications-DriveImage.htm, Accessed Nov. 22, 1999, 4 pgs.
"The WSDC Download Guide: Drive Image Professional,"wsdcds01.watson.ibm.com/wsdc.nsf/Guides/Download/Applications-DriveImage.htm, accessed on May 3, 2001, 5 pgs.
APPNOTE-TXT from pkware.txt, Version 6.3.2, PKWARE Inc., 1989, 52 pgs.
CU-SeeMe readme.txt, Dec. 2, 1995, 9 pgs.

(56) References Cited

OTHER PUBLICATIONS

CU-seeme txt from indstate.txt, readme.txt for CU-SeeMe version 0.90b1, Mar. 23, 1997, 5 pgs.
Cuseeme txt 19960221 .txt; cuseeme.txt, Feb. 21, 1996, 9 pgs.
Citrix Technology Guide, 1997, 413 pgs.
Lettieri, et al., "Data Compression in the V.42bis Modems," 1992, pp. 398-403.
High Performance x2/V.34+N.42bis 56K BPS Plug & Play External Voice/FAX/Data Modem User's Manual, 1997, 27 pgs.
H.323 Protocols Suite, www.protocols.com/pbook~h323.htm, 26 pgs., identified in Defendants' Joint Preliminary Invalidity Contentions filed in *Realtime Data, LLC D/B/A IXO v. Packeteer, Inc., et al.,* Civil Action No. 6:08-cv-144-LED, United States District Court for the Eastern District of Texas Tyler Division, Dec. 8, 2008.
LBX X Consortium Algorithms; rzdocs.uni-hohenheim.de/aix~4. 33/ext~doc/usr/share/man/info/en~US/a~doc~lib./.x."1;1 X I 1R 6 Technical Specifications, 3 pgs.
Basics of Images; www.geom.uiuc.edu/events/courses/1996/cmwh/Stills/basics.html, 1996, 5 pgs.
Parties' Joint Claim Construction and Prehearing Statement Pursuant to P.R. 4-3, filed in *Realtime Data, LLC d/b/a/IXO v. Packeteer, Inc. et al.,* Civil Action No. 6:08-cv-00144-LED; U.S. District Court for the Eastern District of Texas, Feb. 18, 2009, 168 pages.
Declaration of Professor James A. Storer, Ph.D., relating to U.S. Patent No. 6,604,158, Mar. 18, 2009, 10 pgs.
Declaration of Professor James A. Storer, Ph.D., relating to U.S. Patent No. 6,601,104, Mar. 18, 2009, 8 pgs.
Declaration of Professor James A. Storer, Ph.D., relating to U.S. Patent No. 7,321,937, May 4, 2009, 15 pgs.
Declaration of Professor James A. Storer, Ph.D., relating to U.S. Patent No. 6,624,761, May 4, 2009, 6 pgs.
Declaration of Professor James A. Storer, Ph.D., relating to U.S. Patent No. 7,378,992, May 20, 2009, 6 pgs.
Declaration of Professor James A. Storer, Ph.D., relating to U.S. Patent No. 7,161,506, May 26, 2009, 5 pgs.
"Video Coding for Low Bit Rate Communication", International Telecommunication Union (ITU), Recommendation H.263, §3.4 (Mar. 1996) ("ITU H.263"), 52 pgs.
Order Adopting Report and Recommendation of United States Magistrate Judge, *Realtime Data, LLC D/B/A Ixo v. Packeteer, Inc., et al.,* District Court for the Eastern District of Texas, No. 6:08cv144, Aug. 24, 2009, 2 pgs.
Second Amended Answer filed on behalf of Citrix Systems, Inc, (includes allegations of inequitable conduct on at least pp. 24-43) filed in *Realtime Data, LLC d/b/a/IXO v. Packeteer, Inc. et al.,* Civil Action No. 6:08-cv-00144-LED; U.S. District Court for the Eastern District of Texas, Feb. 10, 2009, 45 pgs.
Expert Report of James B. Gambrell on Inequitable Conduct filed on behalf of some of the defendants [Includes Appendices—Exhibits A-I] filed in *Realtime Data, LLC , d/b/a/IXO v. Packeteer, Inc. et al.,* Civil Action No. 6:08-cv-00144-LED; U.S. District Court for the Eastern District of Texas, Jun. 10, 2009, 199 pgs.
Expert Report of Dr. James A. Storer on Invalidity filed on behalf of some of the defendants [Includes Appendices—Exhibits A-K (Exhibit A has been redacted pursuant to a protective order)] filed in *Realtime Data, LLC d/b/a/IXO v. Packeteer, Inc. et al.,* Civil Action No. 6:08-cv-00144-LED; U.S. District Court for the Eastern District of Texas, Jun. 10, 2009, 1090 pgs.
Supplemental Expert Report of Dr. James A. Storer on Invalidity filed on behalf of some of the defendants [Includes Appendices—Exhibits 1-8]filed in *Realtime Data, LLC d/b/a/IXO v. Packeteer, Inc. et al.,* Civil Action No. 6:09-cv-00144-LED; U.S. District Court for the Eastern District of Texas, Jun. 19, 2009, 301 pgs.
Deposition of Dr. James A. Storer conducted on behalf of the plaintiffs filed in *Realtime Data, LLC d/b/a/IXO v. Packeeteer, Inc. et al.,* Civil Action No. 6:08-cv-00144-LED; U.S. District Court for the Eastern District of Texas, Feb. 27, 2009, 242 pgs.
Deposition of Brian Von Herzen conducted on behalf of the plaintiffs filed in *Realtime Data, LLC d/b/a/IXO v. Packeteer, Inc. et al.,* Civil Action No. 6:08-cv-00144-LED; U.S. District Court for the Eastern District of Texas, Feb. 26, 2009, 241 pgs.
Second Amended Complaint filed on behalf of the Plaintiff in *Realtime Data, LLC d/b/a/IXO v. Packeteer, Inc. et al.,* Civil Action No. 6:08-cv-00144-LED; U.S. District Court for the Eastern District of Texas, Feb. 10, 2009, 28 pgs.
Answers to the Second Amended Complaint and Counterclaims filed by Citrix Systems, Inc, in *Realtime Data, LLC d/b/a/IXO v. Packeteer, Inc. et al.,* Civil Action No. 6:08-cv-00144-LED; U.S. District Court for the Eastern District of Texas, Feb. 11, 2009, 46 pgs.
Answers to the Second Amended Complaint and Counterclaims filed by F5 Networks, Inc, in *Realtime Data, LLC d/b/a/IXO v. Packeteer, Inc. et al.,* Civil Action No. 6:08-cv-00144-LED; U.S. District Court for the Eastern District of Texas, Feb. 17, 2009, 17 pgs.
Answers to the Second Amended Complaint and Counterclaims filed by Averitt Express, Inc, in *Realtime Data, LLC d/b/a/IXO v. Packeteer, Inc. et al.,* Civil Action No. 6:08-cv-00144-LED; U.S. District Court for the Eastern District of Texas, Feb. 17, 2009, 17 pgs.
Answers to the Second Amended Complaint and Counterclaims filed by DHL Express, Inc, in *Realtime Data, LLC d/b/a/IXO v. Packeteer, Inc. et al.,* Civil Action No. 6:08-cv-00144-LED; U.S. District Court for the Eastern District of Texas, Feb. 17, 2009, 37 pgs.
Answers to the Second Amended Complaint and Counterclaims filed by Expand Networks, Inc, interstate Battery System of America, Inc., and O'Reilly Automotive, Inc. in *Realtime Data, LLC d/b/a/IXO v. Packeteer, Inc. et al.,* Civil Action No. 6:08-cv-00144-LED; U.S. District Court for the Eastern District of Texas, Feb. 17, 2009, 21 pgs.
Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in *Realtime Data, LLC d/b/a/IXO v. Packeteer, Inc. et al.,* Civil Action No. 6:08-cv-00144-LED; U.S. District Court for the Eastern District of Texas, Feb. 18, 2009, 84 pgs.
Plaintiff's Response to the Answers to the Second Amended Complaint and Counterclaims filed by Citrix Systems, Inc, in *Realtime Data, LLC d/b/a/IXO v. Packeteer, Inc. et al.,* Civil Action No. 6:08-cv-00144-LED; U.S. District Court for the Eastern District of Texas, Mar. 4, 2009, 24 pgs.
Plaintiff's Responses to the Answers to the Second Amended Complaint and Counterclaims filed by F5 Networks, Inc, in *Realtime Data, LLC d/b/a/IXO v. Packeteer, Inc. et al.,* Civil Action No. 6:08-cv-00144-LED; U.S. District Court for the Eastern District of Texas, Mar. 4, 2009, 5 pgs.
Plaintiff's Responses to the Answers to the Second Amended Complaint and Counterclaims filed by Averitt Express, Inc, in *Realtime Data, LLC d/b/a/IXO v. Packeteer, Inc. et al.,* Civil Action No. 6:08-cv-00144-LED; U.S. District Court for the Eastern District of Texas, Mar. 4, 2009, 5 pgs.
Plaintiff's Responses to the Answers to the Second Amended Complaint and Counterclaims filed by DHL Express, Inc, in *Realtime Data, LLC d/b/a/IXO v. Packeteer, Inc. et al.,* Civil Action No. 6:08-cv-00144-LED; U.S. District Court for the Eastern District of Texas, Mar. 4, 2009, 17 pgs.
Plaintiff's Responses to the Answers to the Second Amended Complaint and Counterclaims filed by Expand Networks, Inc, Interstate Battery System of America, Inc., and O'Reilly Automotive, Inc. in *Realtime Data. LLC d/b/a/IXO v. Packeteer, Inc. et al.,* Civil Action No. 6:08-cv-00144-LED; U.S. District Court for the Eastern District of Texas, Mar. 4, 2009, 15 pgs.
Plaintiff's Responses to the Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in *Realtime Data, LLC d/b/a/IXO v. Packeteer, Inc. et al.,* Civil Action No. 6:08-cv-00144-LED; U.S. District Court for the Eastern District of Texas, Mar. 4, 2009, 34 pgs.
Opening Claim Construction Brief filed in *Realtime Data, LLC d/b/a/IXO v. Packeteer, Inc. et al.,* Civil Action No. 6:08-cv-00144-LED; U.S. District Court for the Eastern District of Texas, Mar. 5, 2009, 36 pgs.
Declaration of Jordan Adler in support of the Opening Claim Construction Brief filed in *Realtime Data, LLC d/b/a/IXO v. Packeteer,*

(56) References Cited

OTHER PUBLICATIONS

*Inc. et al.*, Civil Action No. 6:08-cv-00144-LED; U.S. District Court for the Eastern District of Texas, Mar. 5, 2009, 214 pgs.
Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-ov-00144-LED; U.S. District Court for the Eastern District of Texas, Mar. 16, 2009, 22 pgs.
Declaration of Michele E. Moreland in support Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-001444-LE, Mar. 16, 2009, 168 pgs.
Declaration of James A. Storer in support Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Mar. 16, 2009, 27 pgs.
Joint Defendants Reply regarding Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc, et al.*, Civil Action No. 6:08-cv-00144-LE, Apr. 2, 2009, 20 pgs.
Responsive Briefs in Support of Claim Construction filed by Blue Coats Systems, Inc., Packeteer, Inc., 7-Eleven, Inc., ABM Industries, Inc., ABM Janitonal Services-South Central, Inc. and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 451 pgs.
Responsive Briefs in Support of Claim Construction filed by F5 Networks, Inc. and Averitt Express, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 20 pgs.
Responsive Briefs in Support of Claim Construction filed by Citrix Systems, Inc., Expand Networks, Inc., DHL Express (USA), Inc., Interstate Battery System of America, Inc., and O'Reilly Automotive Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 377 pgs.
Declaration of Dr. James A. Storer filed in Support of the Brief in Support of Claim Construction filed on behalf of F5 Networks, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 778 pgs.
Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Mar. 20, 2009, 244 pgs.
Plaintiff's Opposition to Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 20 pgs.
Declaration of Karim Oussayef submitted in support of the Opposition of Plaintiff's Opposition to Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 119 pgs.
Order of the Court Denying Defendant Citrix Systems, Inc.'s Motion to Exclude Dr. Brian Von Herzen's Opinions Regarding Claim Construction, *Realtime Data, LLC D/B/A IXO v. Packeteer, Inc., et al.*, District Court for the Eastern District of Texas, No. 6:08cv144, Apr. 6, 2009, 1 pg.
Parties Joint Submission of Terms to be Heard at the Markman Hearing filed in *Realtime Data, LLC d/b/a/IXO v. Packeteer, Inc. et al.*, Civil Action No. 6:08-cv-00144-LED; U.S. District Court for the Eastern District of Texas, Mar. 24, 2009, 5 pgs.

Order of the Court Regarding the terms to be heard at the Markman Hearing in *Realtime Data, LLC d/b/a/IXO v. Packeteer, Inc. et al.*, Civil Action No. 6:08-cv-00144-LED; U.S. District Court for the Eastern District of Texas, Mar. 24, 2009, 2 pgs.
Transcript of the Markman Hearing held on Apr. 9, 2009 in *Realtime Data, LLC d/b/a/IXO v. Packeteer, Inc. et al.*, Civil Action No. 6:08-cv-00144-LED; U.S. District Court for the Eastern District of Texas, 174 pgs.
Plaintiff's Reply Claim Construction Brief tiled in *Realtime Data, LLC d/b/a/IXO v. Packeteer, Inc. et al.*, Civil Action No. 6:08-cv-00144-LED; U.S. District Court for the Eastern District of Texas, Mar. 30, 2009, 30 pgs.
Declaration of Brian von Herzen in Support of the Plaintiff's Reply Claim Construction Brief filed in *Realtime Data, LLC d/b/a/IXO v. Packeteer, Inc. et al.*, Civil Action No. 6:08-cv-00144-LED; U.S. District Court for the Eastern District of Texas, Mar. 30, 2009, 25 pgs.
F5 Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 12 pg.
Citrix Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 13 pgs.
Blue Coat Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 12 pgs.
Declaration of Michele Moreland in Support of Sur-Replies to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 8 pgs.
Declaration of James Storer in Support of Sur-Replies to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 7, 2009, 6 pgs.
Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, Apr. 8, 2009, 123 pgs.
Motion for Reconsideration of the Court's Order Denying Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, Jul. 13, 2009, 3 pgs.
Citrix Systems' Opposition to Realtime Data's Motion for Reconsideration of Realtime's Motion for Leave to Supplement the Parties' Joint Claim Construction, filed in *Realtime Data, LLC d/b/a/IXO v. Packeteer, Inc. et al.*, Civil Action No. 6;08-cv-00144-LED; U.S. District Court for the Eastern Distric of Texas, Jul. 27, 2009, 6 pgs.
Notice of Agreement to Claim Term between Plaintiff and Defendant filed in *Realtime Data, LLC d/b/a/IXO v. Packeteer, Inc. et al.*, Civil Action No. 6;08-cv-00144-LED; U.S. District Court for the Eastern District of Texas, Apr. 22, 2009, 3 pgs.
Provisional Claim Construction Order issued by the Court on Jun. 2, 2009 in *Realtime Data, LLC d/b/a/IXO v. Packeteer, Inc. et al.*, Civil Action No. 6:08-cv-00144-LED; U.S. District Court for the Eastern District of Texas, 28 pgs.
Citrix Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 9, 2009, 22 pgs.
Blue Coat Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED, U.S. District Court for the Eastern District of Texas, Jul. 10, 2009, 9 pgs.

(56) References Cited

OTHER PUBLICATIONS

F5 Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 10, 2009, 15 pgs.
Comtech AHA Corporation's Complaint in Intervention against the Plaintiff filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 8 pgs.
Report and Recommendation of United States Magistrate Judge on Motion for Partial Summary Judgment issued on Jun. 23, 2009, in *Realtime Data, LLC d/b/a/IXO v. Packeteer, Inc. et al.*, Civil Action No. 6:08-cv-00144-LED; U.S. District Court for the Eastern District of Texas, 22 pgs.
Blue Coat Defendants' Report and Recommendations Regarding Motion for Partial Summary Judgement of Invalidity for Indefiniteness in *Realtime Data, LLC d/b/a/IXOv. Packeteer, Inc. et al.*, Civil Action No. 6:08-cv-00144-LED; U.S. District Court for the Eastern District of Texas, Jul. 8, 2009, 18 pgs.
Plaintiff's Objections To and Partially Unopposed Motion for Reconsideration of United States Magistrate Judge's Claim Construction Memorandum and Order, in *Realtime Data, LLC d/b/a/IXO v. Packeteer, Inc. et al.*, Civil Action No. 6:08-cv-00144-LED; U.S. District Court for the Eastern District of Texas, Jul. 13, 2009, 11 pgs.
Defendant Citrix Opposition to Realtime's Objections to and Partially Unopposed Motion for Reconsideration of Magistrate Love's Claim Construction Memorandum and Order filed by Citrix Systems, Inc., filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 8 pgs.
Defendant F5 Networks, Inc.'s Opposition to Plaintiff's Objections and Partially Unopposed Motion for Reconsideration of Magistrate Judge Love's Claim Construction and Order, filed on behalf of some of the defendants in *Realtime Data, LLC d/b/a/IXO v. Packeteer, Inc. et al.*, Civil Action No. 6:08-cv-00144-LED, U.S. Distract Court for the Eastern District of Texas, Jul. 27, 2009, 4 pgs.
Defendants' Response in Opposition to Realtime Data's Objections to and Partially Unopposed Motion for Reconsideration of Magistrate Judge Love's Claim Construction Memorandum and Order, filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 9 pgs.
Realtime Data's Response in Opposition to Defendant Citrix Systems Objections to and Request for Reconsideration of Magistrate's Order Regarding Claim Construction, in *Realtime Data, LLC d/b/a/IXO v. Packeteer, Inc. et al.*, Civil Action No. 6:08-cv-00144-LED; U.S; District Court for the Eastern District of Texas, Jul. 27, 2009, 13 pgs.
Plaintiff Realtime Data's Response in Opposition to Blue Coat Defendants' Objection to Magistrate's Memorandum Opinion and Order Regarding Claim Construction, in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 9 pgs.
Plaintiff's selected Responses to Defendant Citrix System's Interrogatories and First Set of Requests for Admission filed in *Realtime Data, LLC d/b/a/IXO v. Packeteer, Inc. et al.*, Civil Action No. 6:08-cv-00144-LED; U.S. District Court for the Eastern District of Texas, Jul. 15, 2009, 151 pgs.
Script for Defendants' Joint Claim Construction Technology TUtorial Presented to the Magistrate Judge in *Realtime Data, LLC d/b/a/IXO v. Packeteer, Inc. et al*, Civil Action No. 6:08-cv-00144-LED; U.S. District Court for the Eastern District of Texas, filed on Apr. 18, 2008 and terminated Feb. 2, 95 pgs.
Preliminary Data Sheet, 9600 Data Compressor Processor, Hi/fn, 1997-99 HIFN 000001-68, 68 pgs.

Data Sheet, 9751 Data Compression Processor, 1997-99, HIFN 000069-187, 119 pgs.
Signal Termination Guide, Application Note, Hi/fn, 1997-98, HIFN 000188-194, 7 pgs.
How LZS Data Compression Works, Application Note, Hi/fn, 1997-99, HIFN 000195-207, 13 pgs.
Reference Hardware, 9751 Compression Processor, Hi/fn, 1997-99, HIFN 000208-221, 14 pgs.
Using 9751 in Big Endian Systems, Application Note, Hi/fn, 1997-99, HIFN 000222-234, 13 pgs.
Specification Update, 9751 Compression Processor, Hi/fn, 1997-2000, HIFN 000235-245, 11 pgs.
9732AM Product Release, Hi/fn, 1994-99, HIFN 000246-302, 57 pgs.
Data Sheet, 9732A Data Compression Processor, Hi/fn, 1997-99, HIFN 000303-353, 51 pgs.
9711 to 7711 Migration, Application Note, Hi/fn, 1997-99, HIFN 000354-361, 8 pgs.
Specification 9711 Data Compression Processor, Hi/fn, 1997-99, HIFN 000362-370, 9 pgs.
Differences Between the 9710 & 9711 Processors, Application Note, Hi/fn, 1997-99, HIFN 000371-77, 7 pgs.
Specification Update, 9710 Data Compression Processor, Hi/fn, 1997-99, HIFN 000378-388, 11 pgs.
9706/9706A Data Compression Coprocessor Data Sheet, Stac Electronics, 1991-97, HIFN 000389-473, 85 pgs.
9705/9705A Data Compression Coprocessor, Stac Electronics, 1988-96, HIFN 000474-562, 88 pgs.
9705/9705A Data Compression Coprocessor Data Sheet, Stac Electronics, 1988-96, HIFN 000563-649, 87 pgs.
9700/9701 Compression Coprocessors, Hi/fn, 1997 HIFN 000650-702, 53 pgs.
Data Sheet 9610 Data Compression Processor, Hi/fn, 1997-98, HIFN 000703-744, 42 pgs.
Specification Update 9610 Data Compression Processor, Hi/fn, 1997-99, HIFN 000745-751, 7 pgs.
9705 Data Compression Coprocessor, Stac Electronics, 1988-92, HIFN 000752-831, 80 pgs.
9705 Network Software Design Guide, Application Note, Stac Electronics, 1990-91, HIFN 000832-861, 30 pgs.
Data Sheet 9601 Data Compression Processor, Hi/fn, May 21, 1998, HIFN 000862-920, 59 pgs.
7751 Encryption Processor Reference Kit, Hi/fn, Apr. 1999, HIFN 000921-1114, 194 pgs.
Hardware Data Book, Hi/fn, Nov. 1998, HIFN 001115-1430, 316 pgs.
Data Compression Data Book, Hi/fn, Jan. 1999, HIFN 001431-1889, 459 pgs.
Reference Software 7751 Encryption Processor, Hi/fn, Nov. 1998, HIFN 002164-2201, 38 pgs.
Interface Specification for Synergize Encoding/Decoding Program, JPB, Oct. 10, 1997, HIFN 002215-2216, 2 pgs.
Anderson, Chip, Extended Memory Specification Driver, 1998, HIFN 002217-2264, 48 pgs.
Whiting, Doug, LZS Hardware API, Mar. 12, 1993, HIFN 002265-68, 4 pgs.
Whiting, Doug, Encryption in Sequoia, Apr. 28, 1997, HIFN 002309-2313, 5 pgs.
LZS221-C Version 4 Data Compression Software, Data Sheet, Hi/fn, 1994-97, HIFN 002508-2525, 18 pgs.
eXtended Memory Specification (XMS), ver. 2.0, Microsoft, Jul. 19, 1988, HIFN 002670-2683, 14 pgs.
King, Stanley, Just for Your info—From Microsoft 2, May 4, 1992, HIFN 002684-2710, 27 pgs.
eXtended Memory Specification (XMS), ver. 2.0, Microsoft, Jul. 19, 1988, HIFN 002711-2724, 14 pgs.
Advanced LZS Technology (ALZS), Whitepaper, Hi/fn, Jun. 1, 1998, HIFN 002725-2727, 3 pgs.
Secure Tape Technology (STT) Whitepaper, Hi/fn, Jun. 1, 1998, HIFN 002728-2733, 6 pgs.
SSLRef 3.0 API Details, Netscape, Nov. 19, 1996, HIFN 002734-2778, 45 pgs.

(56) References Cited

OTHER PUBLICATIONS

LZS221-C Version 4 Data Compression Software Data Sheet, Hi/fn, 1994-97, HIFN 002779-2796, 18 pgs.
MPPC-C Version 4 Data Compression Software Data Sheet, Hi/fn, 1994-1997, HIFN 002797-2810, 14 pgs.
Magstar MP Hardware Reference B Series Models Document GA32-0365-01, 1996-1997, [IBM_1_601 pp. 1-338], 338 pages.
Magstar MP 3570 Tape Subsystem, Operator Guide, B-Series Models, 1998-1999, [IBM_1_601 pp. 339-525], 188 pages.
Preview, IBM Magstar 3590 Tape System Enhancements, Hardware Announcement, Feb. 16, 1999, [IBM_1_601 pp. 526-527], 2 pgs.
New IBM Magstar 3590 Models E11 and E1A Enhance Tape Drive Performance, Hardware Announcement, Apr. 20, 1999, [IBM_1_601 pp. 528-540] 13 pgs.
New IBM Magstar 3590 Model A60 Dramatically Enhances Tape Drive Performance, Hardware Announcement Jul. 27, 1999, [IBM_1_601 pp. 541-550] 10 pgs.
The IBM Magstar MP Tape Subsystem Provides Fast Access to Data, Sep. 3, 1996, Announcement No. 196-176, [IBM_1_601 pp. 551-563] 13 pgs.
IBM 3590 High Performance Tape Subsystem, Apr. 10, 1995, Announcement 195-106, [IBM_1_601 pp. 564-581] 18 pgs.
Standard ECMA-222 (Jun. 1995): ECMA—Standardizing Information and Communications Systems, Adaptive Lossless Data Compression Algorithm, [IBM_1_601 pp. 582-601] 20 pgs.
IBM 3590 and 3494 Revised Availability, Hardware Announcement Aug. 8, 1995, [IBM_743_1241 p. 1] 1 pg.
Direct Delivery of IBM 3494, 3466, and 3590 Storage Products, Hardware Announcement, Sep. 30, 1997, Announcement 197-297, [IBM_743_1241 pp. 2-3] 2 pgs.
IBM Magstar 3590 Enhances Open Systems, Hardware Announcement Feb. 9, 1996, Announcement 198-014, [IBM_743_1241 pp. 4-7] 4 pgs.
Hardware Withdrawal: IBM Magstar 3590 A00 Controller—Replacement Available, Announcement No. 197-267, Withdrawal Announcement, Dec. 9, 1997, [IBM_743_1241 p. 9] 1 pg.
IBM Magstar 3590 Tape Subsystem, Introduction and Planning Guide, Document No. GA32-0329007, [IBM_743_1241 pp. 10-499] 490 pgs.
NetMeeting 2.0 Reviewers Guide, Apr. 1997, [MSCS_298_339] 42 pgs.
Microsoft NetMeeting Compatible Products and Services Directory, Apr. 1997, [MSCS_242_297] 56 pgs.
Microsoft NetMeeting "Try This!" Guide, 1997, [MSCS_340_345] 6 pgs.
The Professional Companion to NetMeeting 2—The Technical Guide to Installing, Configuring, and Supporting NetMeeting 2.0 in Your Organization—Microsoft NetMeeting 2.0, 1996-97, [MSCS_2_241] 240 pgs.
CUSeeMe 3.1.2 User Guide, Nov. 1998, [RAD_1_220] 220 pgs.
Meeting-Point Conference Server Users Guide 3.0, Nov. 1997, [RAD_221_548] 328 pgs.
MeetingPoint Conference Server Users Guide 4.0.2, Dec. 1999, [RAD_549_818] 270 pgs.
MeetingPoint Conference Service Users Guide 3.5.1, Dec. 1998, [RAD_819_1062] 244 pgs.
Enhanced CUSeeMe—Authorized Guide, 1995-1996, [RAD_1063_1372] 310 pgs.
Meeting Point Reader File, Jun. 1999, [RAD_1437_1445] 9 pgs.
Press Release—White Pine Announces Launch of MeetingPoint Conferences Server, Oct. 9, 1997, [RAD_1738_1739] 2 pgs.
Press Release—Leading Network Service Providers Line Up to Support White Pine's MeetingPoint Conference Server Technology, Oct. 9, 1997, [RAD_1740_1743] 4 pgs.
BYTE—A New MeetingPoint for Videoconferencing, Oct. 9, 1997, [RAD_1744_1750] 7 pgs.
Declaration of Patrick Gogerty, *Realtime Data, LLC D/B/A Ixo v. Packeteer, Inc., et al.*, District Court for the Eastern District of Texas, No. 6:08cv144, executed May 8, 2009, 3 pgs.
Other Responses to Interrogatories, Requests for Admission, and Objections to Requests for Admission filed in *Realtime Data, LLC d/b/a/IXO v. Packeteer, Inc. et al.*, Civil Action No. 6:08-cv-00144-LED; U.S. District Court for the Eastern District of Texas. (PTO Notified—Document Not submitted).
Deposition Transcript of persons involved in litigation, including inventor James Fallon, and third-party witnesses Jim Karp, Ke-Chiang Chu, and Frank V. DeRosa filed in *Realtime Data, LLC d/b/a/IXO v. Packeteer, Inc. et al.*, Civil Action No. 6:08-cv-00144-LED; U.S. District Court for the Eastern District of Texas. (PTO Notified—Document Not submitted).
Office of Rebuttal Expert Reports of Dr. Brian Von Herzen, Lester L. Hewitt and Dr. James A. Storer, and Expert Reports of Dr. James A. Storer and Dr. Nathaniel Polish filed in *Realtime Data, LLC d/b/a/ IXO v. Packeteer, Inc. et al.*, Civil Action No. 6:08-cv-00144-LED; U.S. District Court for the Eastern District of Texas. (PTO Notified—Document Not submitted).
Proposed Amended Infringement Contentions filed in *Realtime Data, LLC d/b/a/IXO v. Packeteer, Inc. et al.*, Civil Action No. 6:08-cv-00144-LED; U.S. District Court for the Eastern District of Texas. (PTO Notified—Document Not submitted).
Documents Concerning Agreements for Meiations and Mediation Proceedings Between Plaintiffs and Some of the Defendants filed in *Realtime Data, LLC d/b/a/IXO v. Packeteer, Inc. et al.*, Civil Action No. 6:08-cv-00144-LED; U.S. District Court for the Eastern District of Texas. (PTO Notified—Document Not submitted).
Plaintiff's Opposition to Joint Defendants' Motion for Parital Summary Judgment of Invalidity of some of the patents in Suit for indefiniteness, including the '104 patent, Blue Coat's response to this objection, Blue Coat's Reply to Plaintiff's response and Plaintiff's Sur-Reply to Blue Coat's Reply filed in *Realtime Data, LLC d/b/a/ IXO v. Packeteer, Inc. et al.*, Civil Action No. 6:08-cv-00144-LED; U.S. District Court for the Eastern District of Texas. (PTO Notified—Document Not submitted).
Plaintiff's Amended P.R. 3-1 Disclosures and Infringement Contentions, Defendants' Motions to Strick unauthorized portions of these disclosures, and Sur-Replies to these Motions filed in *Realtime Data, LLC d/b/a/IXO v. Packeteer, Inc. et al.*, Civil Action No. 6:08-cv-00144-LED; U.S. District Court for the Eastern District of Texas. (PTO Notified—Document Not submitted).
Expert Report of Dr. James A. Storer Regarding Non-Infringement that contains positions related to the validity of the patents in suit filed in *Realtime Data, LLC d/b/a/IXO v. Packeteer, Inc. et al.*, Civil Action No. 6:08-cv-00144-LED; U.S. District Court for the Eastern District of Texas. (PTO Notified—Document Not submitted).
*Thomson Reuters Corporation v. Realtime Data, LLC D/B/A IXO*, No. 09 CV 7868 (S.D.N.Y.) Sep. 23, 2009 Order Dismissing Case in Favor of Texas Action, 1 pg.
*Thomson Reuters Corporation v. Realtime Data, LLC D/B/A IXO*, No. 09 CV 7868 (S.D.N.Y.) Sep. 30, 2009 Response to Order re Transfer, 103 pgs.
*Thomson Reuters Corporation v. Realtime Data, LLC D/B/A IXO*, No. 09 CV 7868 (S.D.N.Y.) Oct. 7, 2009 Reply Letter regarding judge Berman Sep. 23, 2009 Order re Transfer, 182 pgs.
*Thomson Reuters Corporation v. Realtime Data, LLC D/B/A IXO*, No. 09 CV 7868 (S.D.N.Y.) Oct. 15, 2009 Order Staying Case Until TX Action Decided, 3 pgs.
*Thomson Reuters Corporation v. Realtime Data, LLC D/B/A IXO*, No. 09 CV 7868.(S.D.N.Y.) Sep. 11, 2009 Complaint—DJ SD NY, 41 pgs.
*Thomson Reuters Corporation v. Realtime Data, LLC D/B/A IXO*, No. 09 CV 7868 (S.D.N.Y.) Sep. 11, 2009 Rule 7.1 Disclosure Statement for Thomson Reuters, 1 pg.
*Thomson Reuters Corporation v. Realtime Data, LLC D/B/A IXO*, No. 09 CV 7868 (S.D.N.Y.) Order-Stay Pending Transfer Motion Confirmed 10_15_09, 3 pgs.
Opinion and Order of United States Magistrate Judge regarding Claim Construction, *Realtime Data, LLC D/B/A IXO v. Packeteer, Inc., et al.*, District Court for the Eastern District of Texas, No. 6:08cv144, issued Jun. 22, 2009, 75 pgs.
Script for Realtimes' Technology Tutorial Presented to the Magistrate Judge in *Realtime Data, LLC d/b/a/IXO v. Packeteer, Inc. et al.*,

(56) References Cited

OTHER PUBLICATIONS

Civil Action No. 6:08-cv-00144-LED; U.S. District Court for the Eastern District of Texas, Mar. 16, 2009, 69 pgs.

Opinion and Order of United States Magistrate Judge regarding Plaintiff's Motion to Strike Unauthorized New Invalidity Theories from Defendant Citrix's Opening and Reply Briefs in Support of its Motion for Summary Judgment of Invalidity, *Realtime Data, LLD/B/A Ixo v. Packeteer, Inc., et al.*, District Court for the Eastern District of Texas, No. 6:08cv144, issued Dec. 8, 2009, 10 pgs.

Defendant Citrix Systems, Inc.'s Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.

Blue Coat Defendants' Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.

Expand Networks' 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 4 pgs.

Expand Networks' U.S.C. Section 282 Disclosures (Amended), *Realtime Data, LLC D/B/A Ixo v. Packeteer, Inc., et al.*, District Court for the Eastern District of Texas, No. 6:08cv144, filed Dec. 11, 2009, 5 pgs.

Defendant Citrix Systems, Inc.'s Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 11, 2009, 3 pgs.

Order of United States Magistrate Judge regarding Motion to Limit the Number Of Prior Art References to be Asserted at Trial, *Realtime Data, LLC D/B/A Ixo v. Packeteer, Inc., et al.*, District Court for the Eastern District of Texas, No. 6:08cv144, filed Dec. 21, 2009, 6 pgs.

Expand Defendants' Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 22, 2009, 3 pgs.

Blue Coat Systems, Inc. and 7-Eleven, Inc.'s Notice of Obviousness Combinations to be Used at Trial, *Realtime Data, LLC D/B/A Ixo v. Packeteer, Inc., et al.*, District Court for the Eastern District of Texas, No. 6:08cv144, filed Dec. 22, 2009, 38 pgs.

Defendant Citrix Systems, Inc's Notice of Other Prior Art References Within the Scope of the References Discussed at the Dec. 17, 2009 Hearing, *Realtime Data, LLC D/B/A Ixo v. Packeteer, Inc., et al.*, District Court for the Eastern District of Texas, No. 6:08cv144, filed Dec. 29, 2009, 6 pgs.

Docket Listing downloaded Mar. 10, 2010 for *Realtime Data, LLC D/B/A Ixo v. Packeteer, Inc., et al.*, District Court for the Eastern District of Texas, No. 6:08cv144, filed Apr. 18, 2008, 165 pgs.

CCITT Draft Recommendation T.4, RFC 804, Jan. 1981, 12 pgs.

SNA Formats, IBM Corporation, 14th Ed., Nov. 1993, 3 pgs.

Munteanu et al, "Wavelet-Based Lossless Compression Scheme with Progressive Transmission Capability," John Wiley & Sons, Inc., Int'l J. Imaging Sys. Tech., vol. 10, (1999) pp. 76-85.

Forchhammer and Jensen, "Data Compression of Scanned Halftone Images," IEEE Trans. Commun., vol. 42, Feb.-Apr. 1994, pp. 1881-1893.

Christopher Eoyang et al., "The Birth of the Second Generation: The Hitachi S-820/80," Proceedings of the 1998 ACM/IEEE Conference on Supercomputing, pp. 296-303 (1998).

Transcript for Hearing on Motions for Summary Judgment, *Realtime Data, LLC d/b/a IXO v. Packeteer, Inc. et al*, Civil Action No. 6:08-cv-00144-LED; U.S. District Court for the Eastern District of Texas, 133 pgs, Nov. 8, 2009.

Transcript for Motions Hearing (Including Supplemental Claim Construction Hearing), *Realtime Data, LLC d/b/a IXO v. Packeteer, Inc. et al*, Civil Action No. 6:08-cv-00144-LED; U.S. District Court for the Eastern District of Texas, 88 pgs, Nov. 10, 2009.

Nelson, "The Data Compression Book," M&T Books (2nd Ed. 1996), 283 pgs.

"The Authoritative Dictionary of IEEE Standards Terms," 7th Ed. 2000, p. 273.

Larousse Dictionary of Science and Technology, 1st Ed., 1995, p. 916.

Plantiff Realtime Data's Motion to Strike Unauthorized New Invalidity Theories from Defendant Citrix's Opening and Reply Briefs in Support Its Motion for Summary Judgment of Invalidity of U.S. Patent No. 7,352,300 (Sep. 22, 2009),14 pgs.

Realtime Data's Reply in Support of Its Motion to Strike Unauthorized New Invalidity Theories from Defendant Citrix's Opening and Reply Briefs in Support of Its Motion for Summary Judgment of Invalidity of U.S. Patent No. 7,352,300 (Oct. 19, 2009), 17 pgs.

Defendant Citrix Systems, Inc.'s Sur-Reply in Opposition to Realtime Data LLC's Motion to Strike Unauthorized New Invalidity Theories from Citrix's Opening and Reply Briefs in Support of Its Motion for Summary Judgment of Invalidity of U.S. Patent No. 7,352,300 (Oct. 30, 2009), 9 pgs.

Blue Coat Defendants' Response to Realtime Data, LLC's Notice Re Proposed Construction of "Data Storage Rate" (Nov. 11, 2009), 3 pgs.

Order for Supplemental Briefing on Blue Coat 7-11 Motion for Partial SJ on Non-infringement of Pat 6,601,104 (Nov. 13, 2009), 6 pgs.

Memorandum Opinion and Order, *Realtime Data, LLC D/B/A IXO v. Packeteer, Inc., et al.*, Civil No. 6:08-cv-144-LED-JDL, U.S. District Court for the Eastern District of Texas, 15 pages, Nov. 23, 2009.

Memorandum Opinion and Order, *Realtime Data, LLC, v. Packeteer, Inc., et al.*, Civil No. 6:08-cv-144-LED-JDL, U.S. District Court for the Eastern District of Texas, 10 pages, Dec. 8, 2009.

Expand's Conclusions of Fact and Law Regarding Defense of Inequitable Conduct Concerning the Unenforceability of U.S. Patent No. 7,321,937 (Nov. 12, 2009), 3 pgs.

Realtime Data's Sur-reply Supplemental Claim Construction Brief Concerning Whether the Asserted Claims of the '104 Patent are Product Claims (Dec. 23, 2009), 6 pgs.

Order regarding Defendant Citrix Systems, Inc's Notice of Other Prior Art References Within the Scope of the References Discussed at the Dec. 17, 2009 Hearing (Dec. 30, 2009), 3 pgs.

Network Working group RFC 2068 (Jan. 1997), 163 pgs.

Network Working group RFC 2616 (Jun. 1999), 114 pgs.

Network Working group RFC 1945 (May 1996), 61 pgs.

Network Working group RFC 1950 (May 1996), 10 pgs.

Network Working group RFC 1951 (May 1996), 15 pgs.

Network Working group RFC 1952 (May 1996), 12 pgs.

Notice of Plaintiff Realtime Data LLC's Proposed Supplemental Construction of "Data Storage Rate" In Response to the Court's Comments During the Nov. 10, 2009 Supplemental Claim Construction Hearing (Nov. 10, 2009), 4 pgs.

Citrix's Amended Invalidity Contentions, Including Appendices G2-G8 (Dec. 15, 2009), 509 pgs.

"Plaintiff Realtime Data's Opposition to Defendant F5 Networks' Motion for Summary Judgment that Claims 18-20 of U.S. Patent No. 7,321,937 are Invalid (Aug. 25, 2009)" Civil Action No. 6:08-cv-00144-LED Jury Trial Demanded Filed Under Seal; In the United States District Court for the Eastern District of Texas Tyler Division, [Under Seal—Document Not Submitted].

Declaration of Dr. James W. Modestino relating to U.S. Patent No. 7,161,506, Mar. 15, 2010, 49 pgs.

Second Declaration of Dr. George T. Ligler under 37 C.F.R. §1.132 relating to U.S. Patent No. 6,601,104, executed May 5, 2010, 3 pgs.

Realtime Data, LLC Complaint for Patent infringement, *Realtime Data, LLC D/B/A IXO v. CME Group Inc., et al.* (II), District Court for the Eastern District of Texas, No. 6:10-cv-246, filed May 11, 2010, 24 pages.

Realtime Data, LLC Complaint for Patent Infringement, *Realtime Data, LLC D/B/A IXO v. Thompson Reuters Corporation, et al.* (II), District Court for the Eastern District of Texas, No. 6:10-cv-247, filed May 11, 2010, 15 pages.

Realtime Data, LLC Complaint for Patent Infringement, *Realtime Data, LLC D/B/A IXO v. Morgan Stanley, et al.* (II), District Court for the Eastern District of Texas, No. 6:10-cv-248, filed May 11, 2010, 27 pages.

(56) References Cited

OTHER PUBLICATIONS

Declaration of Padmaja Chinta In Support of Realtime Data's Reply Claim Construction Brief (including Exhibits A-S), *Realtime Data, LLC D/B/A IXO* v. *Packeteer, Inc., et al.*, District Court for the Eastern District of Texas, No. 6:08-cv-00144-LED, dated Mar. 30, 2009, 217 pgs.
Extended European search report issuing from European Patent Application 09150508.1, Aug. 3, 2010, 5 pgs.
Complaint, *Thomson Reuters Corporation* v. *Realtime Data, LLC D/B/A IXO*, Southern District of New York, No. 2:09-cv-7868-RMB, filed Sep. 11, 2009, 6 pages.
Realtime Data, LLC Complaint for Patent Infringement, *Realtime Data, LLC D/B/A IXO* v. *MetroPCS Texas, LLC at al.*, District Court for the Eastern District of Texas, No. 6:10-cv-00493, filed Sep. 23, 2010, 14 pages.
Complaint and Demand for Jury Trial, *Chicago Board Options Exchange, Incorporated* v. *Realtime Data, LLC D/B/A IXO*, United States District Court for the Northern District of Illinois, No. 09 CV 4486, filed Jul. 24, 2009, 6 pages.
Realtime's Response in Opposition to the Defendants' Joint Objections to Report and Recommendation of Magistrate Regarding Motion for Partial Summary Judgment of Invalidity for indefiniteness, in *Realtime Data, LLC d/b/a/IXO* v. *Packeteer, Inc. et al.*, Civil Action No. 6:08-cv-00144-LED; U.S. District Court for the Eastern District of Texas, Jul. 27, 2009, 15 pgs.
Reply to Realtime's Response to Blue Coat Defendants' Objections to Report and Recommendation of United States Magistrate Judge Regarding Motion for Partial Summary Judgment of Invalidity for Indefiniteness Entered Jun. 23, 2009, in *Realtime Data, LLC d/b/a/ IXO* v. *Packeteer, Inc. et al.*, Civil Action No. 6:08-cv-00144-LED; U.S. District Court for the Eastern Distract of Texas, Jul. 31, 2009, 3 pgs.
Realtime Data's Sur-Reply in Opposition to the Defendants' Joint Objections to Report and Recommendation of Magistrate Regarding Motion for Partial Summary Judgment of Invalidity for Indefiniteness, in *Realtime Data, LLC d/b/a/IXO* v. *Packeteer, Inc. et al.*, Civil Action No. 6:08-cv-00144-LED; U.S. District Court for the Eastern District of Texas, Aug. 3, 2009, 3 pgs.
Defendants' Invalidity Contentions, *Realtime Data, LLC d/b/a IXO*, vs. *MetroPCS Texas, LLC, et al.*, Case No. 6:10-CV-00493-LED, In the United States District Court Eastern District of Texas Tyler Division, Jun. 17, 2011, 138 pages.
Appendix A, Claim Charts A-1 to A-25, from Invalidity Contentions, *Realtime Data LLC* v. *MetroPCS Texas, LLC, et al.*, Case No. 6:10-CV-00493-LED, Jun. 17, 2011, 173 pages.
Appendix B, Claim Charts B-1 to B-23, from *Realtime Data LLC* v. *MetroPCS Texas, LLC et al.*, Case No. 6:10-CV-00493-LED, Jun. 17, 2011, 809 pages.
Appendix C, Claim Charts C-1 to C-22, from *Realtime Data LLC* v. *MetroPCS Texas, LLC et al.*, Case No. 6:10-CV-00493-LED, Jun. 17, 2011, 530 pages.
Appendix D, Claim Charts D-1 to D-16, from *Realtime Data LLC* v. *MetroPCS Texas, LLC et al.*, Case No. 6:10-CV-00493-LED, Jun. 17, 2011, 253 pages.
Appendix E, Claim Charts E-1 to E-20, from *Realtime Data LLC* v. *MetroPCS Texas, LLC et al.*, Case No. 6:10-CV-00493-LED, Jun. 17, 2011, 397 pages.
Appendix F, Claim Charts F-1 to F-19, from *Realtime Data LLC* v. *MetroPCS Texas, LLC et al.*, Case No. 6:10-CV-00493-LED, Jun. 17, 2011, 462 pages.
Appendix G, Claim Charts G-1 to G-18, from *Realtime Data LLC* v. *MetroPCS Texas, LLC et al.*, Case No. 6:10-CV-00493-LED, Jun. 17, 2011, 548 pages.
Appendix H, Claim Charts H-1 to H-22, from *Realtime Data LLC* v. *MetroPCS Texas, LLC et al.*, Case No. 6:10-CV-00493-LED, Jun. 17, 2011, 151 pages.
Amir et al., "An Application Level Video Gateway," 1995, 11 pages.

Katz, Randy H. and Eric A. Brewer, "The Bay Area Research Wireless Access Network: Towards a Wireless Overlay Internetworking Architecture," Computer Science Division, EECS Department, U.C. Berkeley, 1995, 56 pages.
Katz, R.H. and E.A. Brewer, "The Bay Area Research Wireless Access Network (BARWAN)," UC Berkeley, 1995, 68 pages.
Bruckman, Alfred and Andreas UHL, "Selective Medical Image Compression Using Wavelet Techniques," Jun. 1998, 23 pages.
Crowley et al., "Dynamic Compression During System Save Operations," May 1, 1984, 3 pages.
Hershkovits, "Universal Data Compression with Finite-Memory," Feb. 1995, 99 pages.
Katz et al., "The Bay Area Research Wireless Access Networks (BARWAN)," 1996, 6 pages.
Klein, "Compression and Coding in Information Retrieval Systems," Jun. 1987, pp. vii-viii, 1-4, 10-15, 22-30, 43-48, 62-66, 86-89, 108-111.
Reghbati, "An Overview of Data Compression Techniques," Apr. 1981, pp. 71-75.
Court Docket Listing for 6:10-cv-00493-LED *Realtime Data, LLC D/B/A/IXO*, v. *MetroPCS Texas, LLC et al.*, dated Jul. 20, 2011, 13 pages.
Court Docket History for 1:09-cv-04486 *Chicago Board Options Exchange, Incorporated* v. *Realtime Data, LLC*, dated Jul. 20, 2011, 7 pages.
Court Docket History for 6:08-cv-00144-LED-JDL *Realtime Data, LLC d/b/a IXO* v. *Packeteer, Inc. et al*, dated Jul. 20, 2011, 119 pages.
Court Docket History for 6.09-cv-00326-LED-JDL *Realtime Data, LLC D/B/A/ IXO*, v. *Morgan Stanley et al*, dated Jul. 20, 2011, 44 pages.
Court Docket History for 6:09-cv-00327-LED-JDL *Realtime Data, LLC D/B/A/IXO*, v. *CME Group Inc. et al*, dated Jul. 20, 2011, 55 pages.
Court Docket History for 6:09-cv-00333-LED-JDL *Realtime Data, LLC d/b/a IXO* v. *Thomson Reuters et al*, dated Jul. 20, 2011, 29 pages.
Court Docket History for 1:09-cv-07868-RMB *Thomson Reuters Corporation* v. *Realtime Data, LLC*, dated Jul. 20, 2011, 3 pages.
Notice of Allowance in Commonly-Assigned U.S. Appl. No. 11/651,366, issued Apr. 10, 2009, 7 pgs.
Non-Final Office Action for U.S. Appl. No. 12/684,624, mailed Nov. 10, 2010, 5 pgs.
Notice of Allowance for U S. Appl. No. 12/123,081, mailed Feb. 17, 2011, 7 pgs.
Non-Final Office Action for U.S. Appl. No. 12/688,413, mailed Sep. 27, 2010, 13 pgs.
Notice of Allowance for U.S. Appl. No. 11/551,211, mailed Jan. 31, 2011, 4 pgs.
Notice of Allowance for U.S. Appl. No. 11/551,211, mailed Sep. 22, 2010, 4 pgs.
Notice of Allowance for U .S. Appl. No. 11/551,204, mailed Jan. 11, 2011, 4 pgs.
Notice of Allowance for U.S. Appl. No. 11/553,419, mailed Sep. 22, 2010, 4 pgs.
Non-Final Office Action for U.S. Appl. No. 11/400,008, mailed Nov. 23, 2010, 7 pgs.
Notice of Allowance for U.S. Appl. No. 11/651,365, mailed Feb. 4, 2010, 8 pgs.
Notice of Allowance for U.S. Appl. No. 11/651,365, mailed Nov. 19, 2009, 8 pgs.
Non-Final Office Action for U.S. Appl. No. 09/969,987, mailed Aug. 27, 2010, 13 pgs.
Final Office Action for U.S. Appl. No. 09/969,987, mailed Jan. 28, 2010, 11 pgs.
Notice of Allowance for U.S. Appl. No. 12/131,631, mailed Jun. 22, 2010, 5 pgs.
Final Office Action for U.S. Appl. No. 11/400,008, mailed Oct. 30, 2009, 7 pgs.
Final Office Action for U.S. Appl. No. 11/400,008, mailed May 11, 2010, 7 pgs.
Notice of Allowance for U.S. Appl. No. 11/551,204, maied Sep. 30, 2010; 4 pages.

(56) References Cited

OTHER PUBLICATIONS

Non-Final Office Action for U.S. Appl. No. 11/551,204, mailed Jun. 16, 2009, 5 pgs.
Notice of Allowance for U.S. Appl. No. 11/551,204, mailed Jun. 21, 2010, 4 pgs.
Non-Final Office Action for U.S. Appl. No. 11/551,204, mailed Sep. 22, 2008, 9 pgs.
Notice of Allowance for U.S. Appl. No. 11/551,204, mailed Jan. 27, 2010, 4 pgs.
Non-Final Office Action for U.S. Appl. No. 12/690,125, mailed Sep. 21, 2010, 12 pgs.
Final Office Action for U.S. Appl. No. 09/969,987, mailed May 24, 2011, 17 pgs.
Notice of Allowance for U.S. Appl. No. 11/551,211, mailed May 6, 2011, 5 pages.
Notice of Allowance for U.S. Appl. No. 12/703,042, mailed May 5, 2011, 8 pages.
Notice of Allowance for U.S. Appl. No. 11/553,427, mailed Mar. 24, 2011, 5 pages.
Notice of Allowance for U.S. Appl. No. 11/553,419, mailed May 20, 2011, 5 pages.
Final Office Action for U.S. Appl. No. 11/400,008, mailed Jun. 27, 2011, 6 pages.
Notice of Allowance for U.S. Appl. No. 11/553,427, mailed May 31, 2011, 5 pages.
Final Office Action for U.S. Appl. No. 12/690,125, mailed Jun. 7, 2011, 11 pages.
Final Office Action for U.S. Appl. No. 12/688,413, mailed Jun. 7, 2011, 15 pages.
International Search Report for PCT/US00/42018, mailed Jul. 31, 2001, 3 pages.
International Search Report for PCT/US01/03712, mailed May 10, 2002, 2 pages.
International Search Report for PCT/US01/03711, mailed Jan. 28, 2001, 5 pages.
Submission of prior art under 37 CFR 1.501, for U.S. Pat. No. 6,604,158, Mar. 3, 2011, 5 pgs.
Submission of prior art under 37 CFR 1.501, for U.S. Pat. No. 7,415,530, Mar. 3, 2011, 14 pgs.
Submission of prior art under 37 CFR 1.501, for U.S. Pat. No. 6,601,104, Mar. 3, 2011, 5 pgs.
Submission of prior art under 37 CFR 1.501, for U.S. Pat. No. 7,161,506, Mar. 3, 2011, 12 pgs.
Submission of prior art under 37 CFR 1.501, for U.S. Pat. No. 7,395,345, Mar. 3, 2011, 14 pgs.
Submission of prior art under 37 CFR 1.501, for U.S. Pat. No. 7,321,937, Mar. 3, 2011, 14 pgs.
Submission of prior art under 37 CFR 1.501, for U.S. Pat. No. 7,352,300, Mar. 3, 2011, 14 pgs.
Copy of submission of prior art under 37 CFR 1.501, for U.S. Pat. No, 7,378,992, Mar. 3, 2011, 14 pgs.
Ex Parte Reexamination Interview Summary, mailed Dec. 3, 2009, for U.S. Appl. No. 90/009,428, 4 pgs.
Request for Inter Partes Reexamination of U.S. Patent No. 7,714,747, Control No. 95/001,517, filed Dec. 30, 2010, 696 pages.
Replacement Request for Inter Partes Reexamination of U.S. Patent No. 7,417,568, Control No. 95/001,533, filed Mar. 1, 2011, 357 pages.
L. Gannoun, "RTP Payload Format for X Protocol Media Streams," Audio-Visual Transport WG Internet Draft, Internet Engineering Task Force, Mar. 11, 1998, 15 pgs.
Offical Order Granting Request for Inter Partes Reexamination of U.S. Pat. No. 6,624,761, Control No. 95/000,464, issued Jul. 24, 2009, 29 pgs.
Non-Final Office Action in Inter Partes Reexamination of U.S. Pat. No. 6,624,761, Control No. 95/000,464, issued Dec. 15, 2009, 20 pgs.
Non-Final Office Action in Inter Partes Reexamination of U.S. Pat. No. 7,321,937, Control No. 95/000,466, issued Jun. 22, 2009, 11 pgs.
Official Order Granting Request for Inter Partes Reexamination of U.S. Pat. No. 7,321,937, Control No. 95/000,466, issued Jun. 22, 2009, 16 pgs.
Official Action Closing Prosecution for Inter Partes Reexamination of U.S. Pat. No. 7,321,937, Control No. 95/000,466, issued Dec. 22, 2009, 20 pgs.
Comments by Third Party Requester to Patent Owner's Response Inter Partes Reexamination of U.S. Patent No. 7,321,937, Control No. 95/000,466, filed Nov. 10, 2009, 30 pgs.
Supplemental Declaration of Professor James A. Storer, Ph.D, under 37 C.F.R. §1,132 in Inter Partes Reexamination of U.S. Patent No. 7,321,937, Control No. 95/000,466, executed on Nov. 10, 2009, 16 pgs.
Examiner Interview Summary in Ex Parte Reexamination of U.S. Pat. No. 6,601,104, Control No. 90/009,428, issued Dec. 3, 2009, 3 pgs.
Non-Final Office Action in Ex Parte Reexamination of U.S. Pat. No. 6,601,104, Control No. 90/009,428, issued Nov. 2, 2009, 13 pgs.
Official Order Granting Request for Ex Parte Reexamination of U.S. Pat. No. 6,601,104, Control No. 90/009,428, issued Jun. 1, 2009, 12 pgs.
Declaration of Dr. George T. Ligler under 37 C.F.R. §1.132 in Ex Parte Reexamination of U.S. Pat. No. 6,601,104, Control No. 90/009,428, executed Dec. 28, 2009 16 pgs.
Supplementary Declaration of Dr. George T. Ligler under 37 C.F.R. §1.132 in Ex Parte Reexamination of U.S. Pat. No. 6,601,104, Control No. 90/009,428, executed Dec. 30, 2009 1 pg.
Declaration of Dr. George T. Ligler under 37 C.F.R. §1.132 in Inter Partes Reexamination of U.S. Pat. No. 7,321,937, Control No. 95/000,466, executed Aug. 24, 2009, 30 pgs.
Official Order Granting Request for Inter Partes Reexamination of U.S. Pat No. 7,161,506, Control No. 95/000,479, issued Aug. 14, 2009, 41 pgs.
Non-Final Office Action in Inter Partes Reexamination of U.S. Pat. No. 7,161,506, Control No. 95/000,479, issued Dec. 15, 2009, 37 pgs.
Official Order Granting Request for Inter Partes Reexamination of U.S. Pat. No. 7,378,992, Control No. 95/000,478, issued Aug. 13, 2009, 60 pgs.
Non-Final Office Action in Inter Partes Reexamination of U.S Pat. No. 7,378,992, Control No. 95/000,478, issued Dec. 15, 2009, 27 pgs.
Official Order Granting Request for Inter Partes Reexamination of U.S. Pat. No. 6,604,158 Control No. 95/000,486, issued Aug. 14, 2009, 35 pgs.
Non-Final Office Action in Inter Partes Reexamination of U.S. Pat. No. 6,604,158, Control No. 95/000,486, issued Nov. 12, 2009, 199 pgs.
Right of Appeal Notice in Inter Partes Reexamination of U.S. Pat. No. 6,624,761, Control No. 95/000,464, issued Jan. 6, 2011, 15 pgs.
Action Closing Prosecution in Inter Partes Reexamination of U.S. Pat. No. 6,624,761, Control No. 95/000,464, issued Aug. 27, 2010, 25 pgs.
Right of Appeal Notice in Inter Partes Reexamination of U.S. Pat. No. 7,321,937, Control No. 95/000,466, issued May 24, 2010, 23 pgs.
Final Office Action in Ex Parte Reexamination of U.S. Pat. No. 6,601,104, Control No. 90/009,428, issued Feb. 5, 2010, 16 pgs.
Right of Appeal Notice for Inter Partes Reexamination of U.S. Pat. No. 7,161,506, Control No. 95/000,479, issued Jan. 6, 2011, 18 pgs.
Action Closing Prosecution in Inter Partes Reexamination of U.S. Pat. No. 7,161,506, Control No. 95/000,479, issued Aug. 27, 2010, 34 pgs.
Right of Appeal Notice for Inter Partes Reexamination of U.S. Pat. No. 7,378,992, Control No. 95/000,478, issued Jan. 6, 2011, 15 pgs.
Action Closing Prosecution in Inter Partes Reexamination of U.S. Pat. No. 7,378,992, Control No. 95/000,478, issued Aug. 23, 2010, 31 pgs.
Action Closing Prosecution in Inter Partes Reexamination of U.S. Pat. No. 6,604,158 Control No. 95/000,486, issued Mar. 7, 2011, 257 pgs.
Patent Owner's reply to Office Action in Inter Partes Reexamination of U.S. Patent No. 7,378,992, mailed Mar. 15, 2010, 23 pages.

(56) References Cited

OTHER PUBLICATIONS

Patent Owner's reply to Office Action in Inter Partes Reexamination of U.S. Patent No. 7,161,506, mailed Mar. 15, 2010, 23 pages.
Patent Owner's reply to Action Closing Prosecution of Aug. 23, 2010 in Inter Partes Reexamination of U.S. Patent 7,378,992, mailed Sep. 23, 2010, 23 pages.
Patent Owner's reply to Action Closing Prosecution of Aug. 27, 2010 in Inter Partes Reexamination of U.S. Patent No. 7,161,506, mailed Sep. 27, 2010, 26 pages.
Patent Owner's reply to Action Closing Prosecution of Aug. 27, 2010 in Inter Partes Reexamination of U.S. Patent No. 6,624,761, mailed Sep. 27, 2010, 20 pages.
Corrected Request for Inter Partes Reexamination of U.S. Patent No. 6,624,761, filed Jun. 15, 2009, 241 pages.
Request for Inter Partes Reexamination of U.S. Patent No. 7 378,992, filed May 21, 2009, 255 pages.
Request for Inter Partes Reexamination of U.S. Patent No. 7,161,506, filed May 28, 22009, 455 pages.
Request for Inter Partes Reexamination of U.S. Patent No. 7,777,651, Control No. 95/001,581, filed Mar. 21, 2011, 2,136 pages.
Request for Inter Partes Reexamination of U.S. Patent No. 7,400,274, Control No. 95/001,544, filed Feb. 14, 2011, 420 pages.
Action Closing Prosecution in Inter Partes Reexamination of U.S. Pat. No. 7,321,937, Control No. 95/000,466 issued Dec. 22, 2009, 20 pages.
Order Granting request for inter partes reexamination of U.S. Patent No. 7,400,274 and Non-Final Office Action in Inter Partes reexam of U.S. Patent No. 7,400,274, Control No. 95/001,544, issued Mar. 25, 2011, 47 pages.
Non-Final Office Action in Inter Partes Reexamination of U.S. Patent No. 7,400,274, Control No. 95/001,544, mailed May 20, 2011, 47 pages.
Order Granting Request for Inter Partes Reexamination of U.S. Patent No. 7,777,651, Control No. 95/001,581, mailed Jun. 15, 2011, 22 pages.
Non-Final Office Action in Inter Partes Reexamination of U.S. Patent No. 7,417,568, Control No. 95/001,553, mailed May 6, 2011, 105 pages.
Order Granting Reexamination of U.S. Patent No. 7,714,747, Control No. 95/001,517, mailed Mar. 9, 2011, 21 pages.
Appeal Brief filed in Inter Partes Reexamination of U.S. Patent No. 6,601,104, Control No. 90/009,428, mailed Sep. 2, 2010, 28 pages.
Defendants' Joint Preliminary Invalidity Contentions filed in *Realtime Data, LLC D/B/A IXO* v. *Packeteer, Inc., et al.*, Civil Action No. 6:08-cv-144-LED, United States District Court for the Eastern District of Texas Tyler Division, Dec. 8, 2008, 19 pages.
Appendix A, Claim Charts A-1 to A-46, from *Realtime Data, LLC* v. *Packeteer, Inc., et al.*, Civil Action No. 6:08-cv-144-LED, Dec. 8, 2008, 345 pages.
Appendix B, Claim Charts B-1 to B-17, from *Realtime Data, LLC* v. *Packeteer, Inc., et al.*, Civil Action No. 6:08-cv-144-LED, Dec. 8, 2008, 1893 pages.
Appendix C, Claim Charts C-1 to C-34, from *Realtime Data, LLC* v. *Packeteer, Inc., et al.*, Civil Action No. 6:08-cv-144-LED, Dec. 8, 2008, 993 pages.
Appendix D, Claim Charts D-1 to D-14, from *Realtime Data, LLC* v. *Packeteer, Inc., et al.*, Civil Action No. 6:08-cv-144-LED, Dec. 8, 2008, 197 pages.
Appendix E, Claim Charts E-1 to E-11, from *Realtime Data, LLC* v. *Packeteer, Inc., et al.*, Civil Action No. 6:08-cv-144-LED, Dec. 8, 2008, 735 pages.
Appendix F, Claim Charts F-1 to F-11, from *Realtime Data, LLC* v. *Packeteer et al.* Civil Action No. 6:08-cv-144-LED, Dec. 8, 2008, 775 pages.
Appendix G Claim Charts G-1 to G-8 from *Realtime Data, LLC* v. *Packeteer et al.*, Civil Action No. 6:08-cv-144-LED, Dec. 8, 2008, 567 pages.
Appendix H, Claim Charts H-1 to H-18, from *Realtime Data, LLC* v. *Packeteer, Inc., et al.*, Civil Action No. 6:08-cv-144-LED, Dec. 8, 2008, 94 pages.

Appendix I, Claim Charts I-1 to I-18, from *Realtime Data, LLC* v. *Packeteer, Inc., et al.*, Civil Action No. 6:08-cv-144-LED, Dec. 8, 2008, 145 pages.
Appendix J, Prior Art Chart, from *Realtime Data, LLC* v. *Packeteer, Inc. et al.*, Civil Action No. 6:08-cv-144-LED, Dec. 8, 2008, 25 pages.
Realtime Data, LLC's [Corrected]P.R. 3-1 Disclosures and Preliminary Infringement Contentions filed in *Realtime Data, LLC D/B/A IXO* v. *Packeteer, Inc., et al.*, Civil Action No. 6:08-cv-00144-LED, United States District Court for the Eistern District of Texas Tyler Division, Oct. 8, 2008, 591 pages.
"Hard Disk Data Control Method", IBM Technical Disclosure Bulletin NN9302301, vol. 36, No. 2, Feb. 1993, pp. 301-302.
Notice of Allowance for U.S. Appl. No. 12/123,081, mailed Sep. 26, 2011, 9 pages.
Notice of Allowance for U.S. Appl. No. 11/551,204, mailed Sep. 28, 2011, 5 pages.
Notice of Allowance for U.S. Appl. No. 11/551,211, mailed Oct. 18, 2011, 5 pages.
Notice of Allowance for U.S. Appl. No. 12/702,042, mailed Nov. 15, 2011, 8 pages.
Non-Final Office Action for U.S. Appl. No. 12/688,413, mailed Nov. 28, 2011, 14 pages.
Notice of Allowance for U.S. Appl. No. 12/857,238, mailed Dec. 30, 2011, 5 pages.
Notice of Allowance for U.S. Appl. No. 11/400,008, mailed Feb. 6, 2012, 8 pages.
Non-Final Office Action for U.S. Appl. No. 12/690,125, mailed Mar. 8, 2012, 7 pages.
Notice of Allowance for U.S. Appl. No. 12/703,042, mailed Mar. 30, 2012, 8 pages.
Non-Final Office Action for U.S. Appl. No. 09/969,987, mailed Apr. 11, 2012, 6 pages.
Notice of Allowance for U.S. Appl. No. 11/553,419, mailed Apr. 23, 2012, 6 pages.
Notice of Allowance for U.S. Appl. No. 11/553,427, mailed May 7, 2012, 7 pages.
Non-Final Office Action for U.S. Appl. No. 13/118,122, mailed May 16, 2012, 9 pages.
Non-Final Office Action for U.S. Appl. No. 13/101,994, mailed May 23, 2012, 12 pages.
Notice of Allowance for U.S. Appl. No. 12/857,238, mailed May 29, 2012, 5 pages.
Non-Final Action Closing Prosecution in Inter Partes Reexamination of U.S. Patent No. 7,714,747, Control No. 95/001,517, mailed Sep. 21, 2011, 29 pages.
Definition of "data packet", Academic Press Dictionary of Science and Technology, Copyright 1992, 1996, cited by Examiner in Inter Partes Reexamination of U.S. Patent No. 7,714,747, Control No. 95/001,517, mailed Sep. 21, 2011, 2 pages.
Patent Owner's Reply to Office Action in Inter Partes Reexamination of U.S. Patent No. 7,777,651, Control No. 95/001,581, mailed Sep. 26, 2011, 44 pages.
Examiner's Answer to Appeal Brief in Inter Partes Reexamination of U.S. Patent No. 6,624,761, Control No. 95/000,464, mailed Sep. 28, 2011, 20 pages.
Examiner's Answer to Appeal Brief in Inter Partes Reexamination of U.S. Patent No. 7,161,506, Control No. 95/000,479, mailed Sep. 28, 2011, 25 pages.
Examiner's Answer to Appeal Brief in Inter Partes Reexamination of U.S. Patent No. 7,378,992, Control No. 95/000,478, mailed Sep. 29, 2011, 27 pages.
Decision on Appeal in Ex parte Reexamination of U.S. Patent No. 6,601,104 B1, Control No. 90/009,428, dated Mar. 18, 2011, 14 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No. 6,624,761, Control No. 95/000,464, dated Oct. 28, 2011, 9 pages.
Patent Owner's Rebuttal Brief Under 37 C.F.R § 41.71 Retracting the Arguments Made to Overcome the Claim Rejections and Thereby

(56) References Cited

OTHER PUBLICATIONS

Eliminating the Issues on Appeal in Inter Partes Reexamination of U.S. Patent No. 7,378,992, Control No. 95/000,478, dated Oct. 28, 2011, 10 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No. 7,161,506, Control No. 95/000,479, dated Oct. 28, 2011, 9 pages.
Non-Final Action Closing Prosecution in Inter Partes Reexamination of U.S. Patent No. 7,400,274, Control No. 95/001,544, mailed Nov. 18, 2011, 39 pages.
Non-Final Action Closing Prosecution in In Inter Partes Reexamination of U.S. Patent No. 7,417.568, Control No. 95/001,533, mailed Dec. 9, 2011, 42 pages.
Patent Owner's Reply to Action Closing Prosecution of Nov. 18, 2011 in Inter Partes Reexamination of U.S. Patent No. 7,400,274, Control No. 95/001,544, mailed Dec. 19, 2011, 9 pages.
Patent Owner's Reply to Action Closing Prosecution of Dec. 9, 2011 in Inter Partes Reexamination of U.S. Patent No. 7,417,568, Control No. 95/001,533, mailed Dec. 29, 2011, 14 pages.
Notice of Intent to Issue Ex Parte Reexamination Certificate in Ex Parte Reexamination of U.S. Patent No. 6,601,104, Control No. 90/009,428, mailed Jan. 13, 2012, 5 pages.
Decision on Appeal in Inter Partes Reexamination of U.S. Patent No. 6,624,761, Control No. 95/000,464, mailed Jan. 18, 2012, 5 pages.
Decision on Appeal in Inter Partes Reexamination of U.S. Patent No. 7,321,937, Control No. 95/000,466, mailed Jan. 18, 2012, 8 pages.
Decision on Appeal in Inter Partes Reexamination of U.S. Patent No. 7,378,992, Control No. 95/000,478, mailed Jan. 18, 2012, 5 pages.
Decision on Appeal in Inter Partes Reexamination of U.S. Patent No. 7,161,506, Control No. 95/000,479, mailed Jan. 18, 2012, 6 pages.
Non-Final Office Action in Inter Partes Reexamination of U.S. Patent No. 7,777,651, Control No. 95/001,581, mailed Jan. 27, 2012, 152 pages.
Patent Owner's Respondent Brief on Appeal Under 37 C.F.R. § 41.68 in Inter Partes Reexamination of U.S. Patent No. 7,714,747, Control No. 95/001,517, filed Feb. 17, 2012, 20 pages.
Patent Owner's Reply to Second Non-Final Office Action of Jan. 27, 2012 in Inter Partes Reexamination of U.S. Patent No. 7,777,651, Control No. 95/001,581, filed Feb. 24, 2012, 30 pages.
Ex Parte Reexamination Certificate in Ex Parte Reexamination of U.S. Patent No. 6,601,104, Control No. 90/009,428, issued Feb. 28, 2012, 2 pages.
Examiner's Answer to Appeal Brief in Inter Partes Reexamination of U.S. Patent No. 7,714,747, Control No. 95/001,517, mailed Mar. 1, 2012, 4 pages.
Right of Appeal Notice in Inter Partes Reexamination of U.S. Patent No. 7,417,568, Control No. 95/001,533, mailed Mar. 1, 2012, 8 pages.
Right of Appeal Notice in Inter Partes Reexamination of U.S. Patent No. 7,400,274, Control No. 95/001,544, mailed Mar. 6, 2012, 7 pages.
Request for Inter Partes Reexamination of U.S. Patent No. 7,321,937, Control No. 95/001,922, filed Mar. 2, 2012, including accompanying Exhibits PA-A to PA-D, PAT-A to PAT-C, CC-A to CC-D, Oth-A, and Form PTO/SB/08a, 2865 pages.
Request for Inter Partes Reexamination of U.S. Patent No. 6,604,158, Control No. 95/001,923, filed Mar. 2, 2012, including accompanying Exhibits PA-A to PA-D, PAT-A to PAT-B, CC-A to CC-F, Oth-A, and Form PTO/SB/08a, 560 pages.
Request for Inter Partes Reexamination of U.S. Patent No. 7,352,300, Control No. 95/001,924, filed Mar. 2, 2012, including accompanying Exhibits PA-A to PA-H, PAT-A to PAT-B, CC-A to CC-F, Oth-A, and Form PTO/SB/08a, 1012 pages.
Request for Inter Partes Reexamination of U.S. Patent No. 7,395,345, Control No. 95/001,925, filed Mar. 2, 2012, including accompanying Exhibits PA-A to PA-C, PAT-A, CC-A to CC-C, Oth-A, and Form PTO/SB/08a, 204 pages.
Request for Inter Partes Reexamination of U.S. Patent No. 7,161,506, Control No. 95/001,926, filed Mar. 2, 2012, with accompanying Exhibits PA-A to PA-C, PAT-A to PAT-C, CC-A to CC-B, Oth-A to Oth-B, and Form PTO/SB/08a, 2651 pages.
Request for Inter Partes Reexamination of U.S. Patent No. 7,415,530, Control No. 95/001,927, filed Mar. 2, 2012, including accompanying Exhibits PA-A to PA-F, PAT-A to PAT-B, CC-A to CC-O, Oth-A, and Form PTO/SB/08a, 700 pages.
Request for Inter Partes Reexamination of U.S. Patent No. 7,378,992, Control No. 95/001,928, filed Mar. 2, 2012, including Exhibits PA-A to PA-D, PAT-A to PAT-C, CC-A to CC-B, Oth-A, and Form PTO/SB/08a, 2316 pages.
Official Order Granting Request for Inter Partes Reexamination of U.S. Patent No. 7,395,345, Control No. 95/001,925, mailed Mar. 19, 2012, 11 pages.
Non-Final Office Action in Inter Partes Reexamination of U.S. Patent No. 7,395,345, Control No. 95/001,925, mailed Mar. 19, 2012, 20 pages.
Notice of Intent to Issue Inter Partes Reexamination Certificate in Inter Partes Reexamination of U.S. Patent No. 7,321,937, Control No. 95/000,466, mailed Mar. 21, 2012, 7 pages.
Right of Appeal Notice for Inter Partes Reexamination of U.S. Patent No. 6,604,158, Control No. 95/000,486, mailed Mar. 26, 2012, 253 pages.
Notice of Intent to Issue Inter Partes Reexamination Certificate in Inter Partes Reexamination of U.S. Patent No. 6,624,761, Control No. 95/000,464, mailed Apr. 3, 2012, 7 pages.
Notice of Intent to Issue Inter Partes Reexamination Certificate in Inter Partes Reexamination of U.S. Patent No. 7,161,506, Control No. 95/000,479, mailed Apr. 4, 2012, 15 pages.
Notice of Intent to Issue Inter Partes Reexamination Certificate in Inter Partes Reexamination of U.S. Patent No. 7,378,992, Control No. 95/000,478, mailed Apr. 6, 2012, 5 pages.
Official Order Granting Request for Inter Partes Reexamination of U.S. Patent No. 7,321,937, Control No. 95/001,922, mailed Apr. 20, 2012, 17 pages.
Non-Final Office Action in Inter Partes Reexamination of U.S. Patent No. 7.321.937, Control No. 95/001,922, mailed Apr. 20, 2012, 8 pages.
Official Order Granting Request for Inter Partes Reexamination of U.S. Patent No. 7,161,506, Control No. 95/001,926, mailed Apr. 25, 2012, 9 pages.
Non-Final Office Action in Inter Partes Reexamination of U.S. Patent No. 7,161,506, Control No. 95/001,926, mailed Apr. 25, 2012, 7 pages.
Official Order Granting Request for Inter Partes Reexamination of U.S. Patent No. 7,378,992, Control No. 95/001,928, mailed Apr. 25, 2012, 8 pages.
Non-Final Office Action in Inter Partes Reexamination of U.S. Patent No. 7.378,992, Control No. 95/001,928, mailed Apr. 25, 2012, 8 pages.
Official Order Denying Request for Inter Partes Reexamination of U.S. Patent No. 7,415,530, Control No. 95/001,927, mailed Apr. 27, 2012, 52 pages.
Official Order Granting Request for Inter Partes Reexamination of U.S. Patent No. 6,604,158, Control No. 95/001,923, mailed May 7, 2012, 14 pages.
Non-Final Office Action in Inter Partes Reexamination of U.S. Patent No. 6,604,158, Control No. 95/001,923, mailed May 7, 2012, 8 pages.
Petition Under 37 C.F.R. §§ 1.181 and 1.182 for Correction of Notice of Intent to Issue Reexamination Certificate in Inter Partes Reexamination of U.S. Patent No. 7,378,992, Contol No. 95/000,478, filed May 9, 2012, 8 pages.
Inter Partes Reexamination Certificate in Inter Partes Reexamination of U.S. Patent No. 7,321,937, Control No. 95/000,466, issued May 15, 2012, 2 pages.
Official Order Granting Request for Inter Partes Reexamination of U.S. Patent No. 7,352,300, Control No. 95/001,924, mailed May 17, 2012, 12 pages.
Non-Final Office Action in Inter Partes Reexamination of U.S. Patent No. 7,352,300, Control No. 95/001,924, mailed May 17, 2012, 18 pages.

(56) References Cited

OTHER PUBLICATIONS

Patent Owner's Response to Office Action of Mar. 19, 2012, in Inter Partes Reexamination of U.S. Patent No. 7,395,345, Control No. 95/001,925, filed May 21, 2012, 21 pages.
Inter Partes Reexamination Certificate in Inter Partes Reexamination of U.S. Patent No. 7,161,506, Control No. 95/000,479, issued May 22, 2012, 2 pages.
Inter Partes Reexamination Certificate in Inter Partes Reexamination of U.S. Patent No. 6,624,761, Control No. 95/000,464, issued Jun. 12, 2012, 2 pages.
Court Docket History for 6:10-cv-00493-LED-JDL, *Realtime Data, LLC d/b/a IXO, v. MetroPCS Texas, LLC et al.*, dated Jun. 19, 2012, 38 pages.
Court Docket History for 1:11-cv-06696-RJH, *Realtime Data, LLC d/b/a IXO, v. Morgan Stanley et al.*, Jun. 19, 2012, 66 pages.
Court Docket History for 1:11-cv-06697-UA, *Realtime Data, LLC d/b/a IXO, v. CME Group Inc. et al.*, dated Jun. 19, 2012, 74 pages.
Court Docket History for 1:11-cv-06698-UA, *Realtime Data, LLC d/b/a IXO, v. Thomson Reuters et al.*, dated Jun. 19, 2012, 45 pages.
Defendants' Supplemetal Invalidity Contentions, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed May 17, 2012, 54 pages.
Expert Report of Michael Brogioli Regarding Asserted Claims of U.S. Patent Nos. 7,417,568 and 7,777,651, with Exhibit A: List of Materials Reviewed, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 26 pages.
Exhibit 1, Curriculum Vitae of Michael C. Brogioli, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 9 pages.
Exhibit 2, [Proposed] Order Adopting the Parties' Agreed Claim Constructions, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 6 pages.
Exhibit 3, The Parties' Disputed Claim Constructions, revised May 3, 2012, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 6 pages.
Exhibit 4, E-Mail Correspondence between James Shalek and Brett Cooper, dated May 17 and 18, 2012, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 3 pages.
Exhibit 5, Source Code Chart for U.S. Pat. No. 7,417,568 comparing representative elements of the NQDSLIB source code (Apr. 29, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 3 pages.
Exhibit 6, Source Code Chart for U.S. Pat. No. 7,417,568 comparing representative elements of the NQDSLIB source code (May 2, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 3 pages.
Exhibit 7, Source Code Chart for U.S. Pat. No. 7,777,651 comparing representative elements of the NQDSLIB source code (Apr. 29, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 21 pages.
Exhibit 8, Source Code Chart for U.S. Pat. No. 7,777,651 comparing representative elements of the NQDSLIB source code (May 2, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 21 pages.
Invalidity Expert Report of Dr. James A. Storer (Redacted), filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 227 pages.
Defendants' Claim Construction Tutorial, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 54 pages.
Opinion and Order (Markman), filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 22, 2012, 41 pages.
Opinion and Order (Partial Motion for Summary Judgement re Written Description: "Data Packets"), filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 26, 2012, 8 pages.
Opinion and Order (Partial Motion for Summary Judgement re Data Decompression) filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 27, 2012, 21 pages.
Technology Tutorial (.exe file), presentation filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thomson Reuters, et al.*, Civil Action No. 1:11-cv-6698, United States District Court Southern District of New York, filed Jun. 2012 (submitted on accompanying CD-ROM).
Lilley, J., et al., "A Unified Header Compression Framework for Low-Bandwidth Links," MobiCom 2000, Aug. 6-11, 2000. Boston, MA, 12 pages.
"WAN Link Compression on HP Routers," Hewlett Packard Application Note, May 1995, 7 pages.
"User Manual for XMill," 2001, 21 pages.

(56) References Cited

OTHER PUBLICATIONS

"High Speed Network, Developer's Guide," Standard & Poor's Comstock, Version 1.1, 1994, pp. 1-42, and 53-124.

Larmouth, J., "ASN.1 Complete", Academic Press, 2000, pp. xxi-xxvii, 1-45, 115-130, 168-172, 174, 270-276, and 443-472.

Petty, J., "PPP Hewlett-Packard Packet-by-Packet Compression (HP PPC) Protocol," draft-ietf-ppext-hpppc-00.txt., Oct. 1993, 7 pages.

Friend, R., et al., "IP Payload Compression Using LZS," Network Working Group, Request for Comments: 2395, Category: Informational, Dec. 1998, 9 pages.

"Information technology—Abstract Syntax Notation One (ASN.1): Specification of basic notation," Series X: Data Networks and Open System Communications, OSI networking and system aspect—Abstract Syntax Notation One (ASN.1), International Telecommunication Union, ITU-T Recommendation X.680, Dec. 1997, 109 pages.

Information technology—ASN.1 encoding rules—Specification of Packed Encoding Rules (PER), Series X: Data Networks and Open System Communications, OSI networking and system aspects—Abstract Syntax Notation One (ASN.1), International Telecommunication Union, ITU-T Recommendation X.691, Dec. 1997, 51 pages.

Opinion and Order, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Acion No. 1:11-cv-6697, and *Realtime Data, LLC d/b/a IXO v. Thompson Reuters, et al.*, Civil Action No. 1:11-cv-6698, United States District Court Southern District of New York, filed Sep. 24, 2012, 48 pages.

Memorandum Opinion and Order, filed in *Realtime, LLC d/b/a IXO, v. MetroPCS Texas, LLC, et al.*, Civil Action No. 6:10-cv-00493, United States District Court for the Eastern District of Texas, filed Oct, 1, 2012, 22 pages.

T-Mobile's Motion for Leave to Supplement Trial Witness List & Invalidity Contentions, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 16 pages.

Exhibit 2, Defendant T-Mobile's Supplemental Invalidity Contentions, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 13 pages.

Exhibit 3, FNLTD-74478, Flash Networks: Commercial Part Written by Flash Networks for Cegetel, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 6 pages.

Exhibit 4, FNLTD-74444, Response to Cegetel RFP: Technical Section, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 5 pages.

Exhibit 5, FNLTD-74926, Flash Networks Optimization Products Selected by AT&T Wireless, Flash Networks, Inc. Press Release, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 3 pages.

Exhibit 6, Flash Networks: Harmony, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 6 pages.

Exhibit 7, Declaration of Adi Weiser, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 4 pages.

Exhibit 8, Declaration of Yoav Weiss, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 4 pages.

Exhibit 9, Declaration of Richard Luthi, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 4 pages.

Exhibit 13, Declaration of Gali Weiss, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 4 pages.

Exhibit 17, P.R. 3-1 Claim Chart for T-Mobile, U.S. Pat. No. 7,161,506, filed in *Realtime, LLC d/b/a IXO, v. MetroPCS Texas, LLC, et al.*, Civil Action No. 6:10-cv-00493, United States District Court for the Eastern District of Texas, filed Dec. 17, 2012, 33 pages.

"Flash Networks Introduces NettGain 1100, New Products for Carriers & Enterprises that Enables Immediate Deployment of Wireless Data Solutions," Press Release, dated Mar. 20, 2001, 2 pages.

Amended Expert Report of Dr. Cliff Reader, filed in *Realtime, LLC d/b/a IXO, v. MetroPCS Texas, LLC, et al.*, Civil Action No. 6:10-cv-00493, United States District Court for the Eastern District of Texas, filed Jul. 30, 2012, 205 pages.

Final Judgement, filed in *Realtime, LLC d/b/a IXO, v. T-Mobile USA, Inc.*, Civil Action No. 6:10-cv-00493, United States District Court for the Eastern District of Texas, filed Mar. 28, 2012, 1 page.

Notice of Allowance for U.S. Appl. No. 11/400,008, mailed Jun. 21, 2012, 8 pages.

Notice of Allowance for U.S. Appl. No. 12/703,042, mailed Jul. 16, 2012, 8 pages.

Notice of Allowance for U.S. Appl. No. 12/857,238, mailed Jul. 12, 2012, 5 pages.

Non-Final Office Action for U.S. Appl. No. 13/482,800, mailed Jul. 20, 2012, 14 pages.

Notice of Allowance for U.S. Appl. No. 11/553,427, mailed Nov. 6, 2012, 5 pages.

Notice of Allowance for U.S. Appl. No. 12/703,042, mailed Nov. 15, 2012, 9 pages.

Non-Final Office Action for U.S. Appl. No. 12/857,238, mailed Nov. 29, 2012, 17 pages.

Final Office Action for U.S. Appl. No. 09/969,987, mailed Dec. 4, 2012, 7 pages.

Final Office Action for U.S. Appl. No. 13/101,994, mailed Dec. 13, 2012, 5 pages.

Supplemental Notice of Allowability for U.S. Appl. No. 12/703,042, mailed Dec. 18, 2012, 6 pages.

Notice of Allowance for U.S. Appl. No. 12/690,125, mailed Dec. 28, 2012, 5 pages.

Final Office Action for U.S. Appl. No. 13/118/122, mailed Jan. 9, 2013, 11 pages.

Non-Final Office Action for U.S. Appl. No. 11/553,419, mailed Jan. 15, 2013, 4 pages.

Non-Final Office Action for U.S. Appl. No. 13/482,800, mailed Feb. 19, 2013, 15 pages.

Notice of Allowance for U.S. Appl. No. 12/703,042, mailed Mar. 4, 2013, 9 pages.

Non-Final Office Action for U.S. Appl. No. 12/690,125, mailed Apr. 15, 2013, 11 pages.

Notice of Allowance for U.S. Appl. No. 11/553,427, mailed May 14, 2013, 6 pages.

Supplemental Notice of Allowance for U.S. Appl. No. 11/553,427, mailed May 15, 2013, 6 pages.

Notice of Allowance for U.S. Appl. No. 12/857,238, mailed Jun. 17, 2013, 6 pages.

Supplemental Notice of Allowance for U.S. Appl. No. 12/703,042, mailed Jun. 18, 2013, 6 pages.

Supplemental Notice of Allowance for U.S. Appl. No. 11/553,427, mailed Jul. 2, 2013, 2 pages.

Non-Final Office Action for U.S. Appl. No. 09/969,987, mailed Jul. 3, 2013, 8 pages.

Notice of Allowance for U.S. Appl. No. 13/154,211, mailed Jul. 11, 2013, 10 pages.

Action Closing Prosecution in Inter Partes Reexamination of U.S. Patent No. 7,777,651, Control No. 95/001,581, mailed Jun. 18, 2012, 45 pages.

Patent Owner's Response to Office Action of Apr. 20, 2012 in Inter Partes Reexamination of U.S. Patent No. 7,321,937, Control No. 95/001,922, filed Jun. 20, 2012, 11 pages.

Patent Owner's Response to Office Action of Apr. 25, 2012 in Inter Partes Reexamination of U.S. Patent No. 7,161,506, Control No. 95/001,926, filed Jun. 25, 2012, 20 pages.

(56) References Cited

OTHER PUBLICATIONS

Patent Owner's Response to Office Action of Apr. 25, 2012 in Inter Partes Reexamination of U.S. Patent No. 7,378,992, Control No. 95/001,928, filed Jun. 25, 2012, 20 pages.
Patent Owner's Response to Office Action of May 7, 2012 in Inter Partes Reexamination of U.S. Patent No. 6,604,158, Control No. 95/001,923, filed Jul. 9, 2012, 19 pages.
Patent Owner's Response to Office Action of May 17, 2012 in Inter Partes Reexamination of U.S. Patent No. 7,352,300, Control No. 95/001,924, filed Jul. 17, 2012, 31 pages.
New Decision on Appeal after Board Decision in Inter Partes Reexamination of U.S. Patent No. 7,714,747, Control No. 95/001,517, mailed Jul. 24, 2012, 24 pages.
Right of Appeal Notice for Inter Partes Reexamination of U.S. Patent No. 7,777,651, Control No. 95/001,581, mailed Aug. 3, 2012, 7 pages.
Notice of Intent to Issue Inter Partes Reexamination Certificate in Inter Partes Reexamination of U.S. Patent No. 6,604,158, Control No. 95/000,486, mailed Aug. 30, 2012, 5 pages.
Notice of Intent to Issue Inter Partes Reexamination Certificate in Inter Partes Reexamination of U.S. Patent No. 7,378,992, Control No. 95/000,478, mailed Aug. 31, 2012, 6 pages.
Decision on Petition for Supervisory Review of Refusal to Order Reexamination for Claims 1-2, 16-21, and 23 (37 CFR §§ 1.927 and 1.181) in Inter Partes Reexamination of U.S. Patent No. 7,415,530, Control No. 95/001,927, mailed Aug. 31, 2012, 10 pages.
Decision on Petition Under 37 C.F.R. §§ 1.181 and 1.182 for Correction of Notice of Intent to Issue Reexamination Certificate in Inter Partes Reexamination of U.S. Patent No. 7,378,992, Control No. 95/000,478, mailed Sep. 10, 2012, 6 pages.
Decision on Petition for Supervisory Review of Refusal to Order Reexamination of Claims 5-7, 14-16, and 18-19 (37 CFR §§ 1.927 and 1.181) in Inter Partes Reexamination of U.S. Patent No. 7,321,937, Control No. 95/001,922, mailed Sep. 10, 2012, 12 pages.
Decision on Petition for Supervisory Review of Refusal to Order Reexamination for Claims 86, 89, 90, 92-96, and 98 (37 CFR §§ 1.927 and 1.181) in Inter Partes Reexamination of U.S. Patent No. 7,161,506, Control No. 95/001,926, mailed Sep. 21, 2012, 10 pages.
Non-Final Office Action in Inter Partes Reexamination of U.S. Patent No. 7,415,530, Control No. 95/001,927, mailed Sep. 21, 2012, 15 pages.
Patent Owner's Request to Reopen Prosecution Before the Examiner Under 37 C.F.R. § 41.77(b) in Inter Partes Reexamination of U.S. Patent No. 7,714,747, Control No. 95/001,517, filed Sep. 24, 2012, 29 pages.
Examiner's Answer to Appeal Brief in Ex Parte Reexamination of U.S. Patent No. 7,400,274, Control No. 95/001,544, mailed Oct. 1, 2012, 17 pages.
Inter Partes Reexam Certificate in Inter Partes Reexamination of U.S. Patent No. 7,378,992, Control No. 95/000,478, issued Oct. 4, 2012, 2 pages.
Inter Partes Reexam Certificate in Inter Partes Reexamination of U.S. Patent No. 6,604,158, Control No. 95/000,486, issued Oct. 10, 2012, 2 pages.
Examiner's Answer to Apeal Brief in Inter Partes Reexamination of U.S. Patent No. 7,417,568, Control No. 95/001,533, mailed Oct. 15, 2012, 44 pages.
Non-Final Office Action in Inter Partes Reexamination of U.S. Patent No. 7,321,937, Control No. 95/001,922, mailed Oct. 18, 2012, 10 pages.
Patent Owner's Rebuttal Brief Under 37 C.F.R § 41.71 in Inter Partes Reexamination of U.S. Patent No. 7,417,568, Control No. 95/001,533, filed Nov. 15, 2012, 15 pages.
Patent Owner's Response to Office Action of Oct. 18, 2012 in Inter Partes Reexamination of U.S. Patent No. 7,321,937, Control No. 95/001,922, filed Nov. 19, 2012, 30 pages.
Patent Owner's Supplemental Amendment Subsequent to Timely Submission of Response to Office Action of Oct. 18, 2012 in Inter Partes Reexamination of U.S. Patent No. 7,321,937, Control No. 95/001,922, filed Nov. 27, 2012, 6 pages.

Patent Owner's Response to Office Action of Sep. 21, 2012 in Inter Partes Reexamination of U.S. Patent No. 7,415,530, Control No. 95/001,927, filed Dec. 21, 2012, 51 pages.
Action Closing Prosecution in Inter Partes Reexamination of U.S. Patent No. 7,161,506, Control No. 95/001,926, mailed Mar. 5, 2013, 23 pages.
Action Closing Prosecution in Inter Partes Reexamination of U.S. Patent No. 7,378,992, Control No. 95/001,928, mailed Mar. 5, 2013, 29 pages.
Examiner's Answer to Appeal Brief in Inter Partes Reexamination of U.S. Patent No. 7,777,651, Control No. 95/001,581, mailed Mar. 14, 2013, 21 pages.
Decision on Petition to Strike Patent Owner's Rebuttal Brief in Inter Partes Reexamination of U.S. Patent No. 7,417,568, Control No. 95/001,533, mailed Mar. 15, 2013, 7 pages.
Order Remanding Inter Partes Reexamination Under 37 C.F.R. § 41.77(d) to the Examiner in Inter Partes Reexamination of U.S. Patent No. 7,714,747, Control No. 95/001,517, mailed Mar. 18, 2013, 3 pages.
Decision on Petition Under 37 C.F.R. § 1.183 to Request Examiner Enter Evidence in Inter Partes Reexamination of U.S. Patent No. 7,417,568, Control No. 95/001,533, mailed Mar. 20, 2013, 7 pages.
Action Closing Prosecution in Inter Partes Reexamination of U.S. Patent No. 7,415,530, Control No. 95/001,927, mailed Apr. 3, 2013, 24 pages.
Patent Owner's Reply to Action Closing Prosecution of Mar. 5, 2013 in Inter Partes Reexamination of U.S. Patent No. 7,161,506, Control No. 95/001,926, mailed Apr. 5, 2013, 19 pages.
Patent Owner's Reply to Action Closing Prosecution of Mar. 5, 2013 in Inter Partes Reexamination of U.S. Patent No. 7,378,992, Control No. 95/001,928, mailed Apr. 5, 2013, 23 pages.
Action Closing Prosecution in Inter Partes Reexamination of U.S. Patent No. 7,321,937, Control No. 95/001,922, mailed Apr. 9, 2013, 59 pages.
"Data Transfer Rate (DTR)," accessed at http://searchunifiedcommunications.techtarget.com/definition/data-transfer-rate, published May 18, 2011, 1 page.
"Bandwidth—technical definition," accessed at http://computer.yourdictionary.com/bandwidth, accessed on Mar. 7, 2013, 4 pages.
"Bandwidth—Definition," accessed at http://www.yourdictionary.com/bandwidth, accessed on Mar. 7, 2013, 2 pages.
"Bandwidth," accessed at http://searchenterprisewan.techtarget.com/definitions/bandwidth, published Mar. 24, 2010, 1 page.
Action Closing Prosecution in Inter Partes Reexamination of U.S. Patent No. 7,352,300, Control No. 95/001,924, mailed Apr. 9, 2013, 30 pages.
Examiner's Determination Under 37 C.F.R § 41.77(d) in Inter Partes Reexamination of U.S. Patent No. 7,714,747, Control No. 95/001,517, mailed Apr. 10, 2013, 7 pages.
Patent Owner's Supplemental Response to Office Action of May 7, 2012 in Inter Partes Reexamination of U.S. Patent No. 6,604,158, Control No. 95/001,923, filed Apr. 29, 2013, 20 pages
Patent Owner's Supplemental Response to Office Action of Mar. 19, 2012 in Inter Partes Reexamination of U.S. Patent No. 7,395,345, Control No. 95/001,925, filed May 6, 2013, 24 pages.
Patent Owner's Response to Action Closing Prosecution of Apr. 9, 2013 in Inter Partes Reexamination of U.S. Patent No. 7,321,937, Control No. 95/001,922, filed May 9, 2013, 13 pages.
Patent Owner's Response to Action Closing Prosecution of Apr. 9, 2013 in Inter Partes Reexamination of U.S. Patent No. 7,352,300, Control No. 95/001,924, filed May 9, 2013, 29 pages.
Patent Owner's Comments in Response to Examiner's Determination Under 37 C.F.R. § 41.77(e) in Inter Partes Reexamination of U.S. Patent No. 7,714,747, Control No. 95/001,517, filed May 10, 2013, 20 pages.
Patent Owner's Supplemental Response to Action Closing Prosecution of Apr. 9, 2013 in Inter Partes Reexamination of U.S. Patent No. 7,321,937, Control No. 95/001,922, filed May 15, 2013, 13 pages.
Right of Appeal Notice in Inter Partes Reexamination of U.S. Patent No. 7,415,530, Control No. 95/001,927, filed May 31, 2013, 26 pages.
Petition Under 37 C.F.R. § 1.181 to Expunge Third Party Requester's Improper Submission of Declarations Under 34 C.F.R. § 1.132 and

(56) References Cited

OTHER PUBLICATIONS

Strike Comments Directed to Examiner's Determination in Inter Partes Reexamination of U.S. Patent No. 7,714,747, Control No. 95/001,517, filed Jun. 26, 2013, 6 pages.

Notice of Intent to Issue a Reexam Certificate in Inter Partes Reexamination of U.S. Patent No. 7,415,530, Control No. 95/001,927, mailed Jul. 22, 2013, 5 pages.

ChangeLog file for zlib, zlib.net/ChangeLog.txt file, accessed on May 23, 2013, with date references Apr. 11, 1995-Apr. 28, 2013, 26 pages.

2.0.39 Kernel Release History, accessed at 1wn.net/2001/1018/a/hist-2.0.39.php3, dated Oct. 14, 2001, 8 pages.

"Linux Kernel," Wikipedia—the Free Encyclopedia, accessed at en.wikipedia.org/wiki/Linux_kernel, accessed on May 9, 2013, 20 pages.

Rubini, A., "Booting the Kernel," accessed at www.linux.it/~rubini/docs/boot/, Jun. 1997, 6 pages.

Zadok, E., et al., "Fast Indexing: Support for Size-Changing Algorithms in Stackable File Systems," Proceedings of the 2001 Annual USENIX Technical Conference, Jun. 2001, 16 pages.

Non-Final Office Action for U.S. Appl. No. 13/118,122, mailed Jul. 19, 2013, 12 pages.

Court Docket History for 6:10-cv-00493-LED-JDL, *Realtime Data, LLC d/b/a IXO,* v. *T-Mobile, USA Inc.*, dated Jul. 8, 2013, 77 pages.

Court Docket History for 1:11-cv-06696-RJH, *Realtime Data, LLC d/b/a IXO,* v. *Morgan Stanley et al.*, dated Jul. 8, 2013, 80 pages.

Court Docket History for 1:11-cv-06697-UA, *Realtime Data, LLC d/b/a IXO,* v. *CME Group Inc. et al.*, dated Jul. 8, 2013, 105 pages.

Court Docket History for 1:11-cv-06698-UA, *Realtime Data, LLC d/b/a IXO,* v. *Thomson Reuters et al.*, dated Jul. 8, 2013, 59 pages.

BANDWIDTH SENSITIVE DATA COMPRESSION AND DECOMPRESSION

CROSS-REFERENCE TO RELATED APPLICATION

This application is a continuation of U.S. patent application Ser. No. 12/123,081, filed on May 19, 2008, now U.S. Pat. No. 8,073,047, which is a continuation of U.S. patent application Ser. No. 10/076,013, filed on Feb. 13, 2002, now U.S. Pat. No. 7,386,046, which claims the benefit of U.S. Provisional Application No. 60/268,394, filed on Feb. 13, 2001, each of which is fully incorporated herein by reference.

BACKGROUND

1. Technical Field

The present invention relates generally to data compression and decompression and, in particular, to a system and method for compressing and decompressing data based on an actual or expected throughput (bandwidth) of a system that employs data compression. Additionally the present invention relates to the subsequent storage, retrieval, and management of information in data storage devices utilizing either compression and/or accelerated data storage and retrieval bandwidth.

2. Description of the Related Art

There are a variety of data compression algorithms that are currently available, both well-defined and novel. Many compression algorithms define one or more parameters that can be varied, either dynamically or a-priori, to change the performance characteristics of the algorithm. For example, with a typical dictionary based compression algorithm such as Lempel-Ziv, the size of the dictionary can affect the performance of the algorithm. Indeed, a large dictionary may be employed to yield very good compression ratios but the algorithm may take a long time to execute. If speed were more important than compression ratio, then the algorithm can be limited by selecting a smaller dictionary, thereby obtaining a much faster compression time, but at the possible cost of a lower compression ratio. The desired performance of a compression algorithm and the system in which the data compression is employed, will vary depending on the application.

Thus, one challenge in employing data compression for a given application or system is selecting one or more optimal compression algorithms from the variety of available algorithms. Indeed, the desired balance between speed and efficiency is typically a significant factor that is considered in determining which algorithm to employ for a given set of data. Algorithms that compress particularly well usually take longer to execute whereas algorithms that execute quickly usually do not compress particularly well.

Accordingly, a system and method that would provide dynamic modification of compression system parameters so as to provide an optimal balance between execution speed of the algorithm (compression rate) and the resulting compression ratio, is highly desirable.

Yet another problem within the current art is data storage and retrieval bandwidth limitations. Modern computers utilize a hierarchy of memory devices. In order to achieve maximum performance levels, modern processors utilize onboard memory and on board cache to obtain high bandwidth access to both program and data. Limitations in process technologies currently prohibit placing a sufficient quantity of onboard memory for most applications. Thus, in order to offer sufficient memory for the operating system(s), application programs, and user data, computers often use various forms of popular off-processor high speed memory including static random access memory (SRAM), synchronous dynamic random access memory (SDRAM), synchronous burst static ram (SBSRAM). Due to the prohibitive cost of the high-speed random access memory, coupled with their power volatility, a third lower level of the hierarchy exists for non-volatile mass storage devices. While mass storage devices offer increased capacity and fairly economical data storage, their data storage and retrieval bandwidth is often much less in relation to the other elements of a computing system.

Computers systems represent information in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video, frequently exists in the natural world as analog information. As is well known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

Modern computers utilize digital data representation because of its inherent advantages. For example, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossless and lossy data compression.

Over the last decade, computer processor performance has improved by at least a factor of 50. During this same period, magnetic disk storage has only improved by a factor of 5. Thus one additional problem with the existing art is that memory storage devices severely limit the performance of consumer, entertainment, office, workstation, servers, and mainframe computers for all disk and memory intensive operations.

For example, magnetic disk mass storage devices currently employed in a variety of home, business, and scientific computing applications suffer from significant seek-time access delays along with profound read/write data rate limitations. Currently the fastest available (15,000) rpm disk drives support only a 40.0 Megabyte per second data rate (MB/sec). This is in stark contrast to the modern Personal Computer's Peripheral Component Interconnect (PCI) Bus's input/output capability of 512 MB/sec and internal local bus capability of 1600 MB/sec.

Another problem within the current art is that emergent high performance disk interface standards such as the Small Computer Systems Interface (SCSI-3), iSCSI, Fibre Channel, AT Attachment UltraDMA/100+, Serial Storage Architecture, and Universal Serial Bus offer only higher data transfer rates through intermediate data buffering in random access memory. These interconnect strategies do not address the fundamental problem that all modern magnetic disk storage devices for the personal computer marketplace are still limited by the same typical physical media restriction. In practice, faster disk access data rates are only achieved by the high cost solution of simultaneously accessing multiple disk drives with a technique known within the art as data striping and redundant array of independent disks (RAID).

RAID systems often afford the user the benefit of increased data bandwidth for data storage and retrieval. By simultaneously accessing two or more disk drives, data bandwidth may be increased at a maximum rate that is linear and directly proportional to the number of disks employed. Thus another problem with modern data storage systems utilizing RAID systems is that a linear increase in data bandwidth requires a proportional number of added disk storage devices.

Another problem with most modern mass storage devices is their inherent unreliability. Many modern mass storage devices utilize rotating assemblies and other types of electromechanical components that possess failure rates one or more orders of magnitude higher than equivalent solid state devices. RAID systems employ data redundancy distributed across multiple disks to enhance data storage and retrieval reliability. In the simplest case, data may be explicitly repeated on multiple places on a single disk drive, on multiple places on two or more independent disk drives. More complex techniques are also employed that support various tradeoffs between data bandwidth and data reliability.

Standard types of RAID systems currently available include RAID Levels 0, 1, and 5. The configuration selected depends on the goals to be achieved. Specifically data reliability, data validation, data storage/retrieval bandwidth, and cost all play a role in defining the appropriate RAID data storage solution. RAID level 0 entails pure data striping across multiple disk drives. This increases data bandwidth at best linearly with the number of disk drives utilized. Data reliability and validation capability are decreased. A failure of a single drive results in a complete loss of all data. Thus another problem with RAID systems is that low cost improved bandwidth requires a significant decrease in reliability.

RAID Level 1 utilizes disk mirroring where data is duplicated on an independent disk subsystem. Validation of data amongst the two independent drives is possible if the data is simultaneously accessed on both disks and subsequently compared. This tends to decrease data bandwidth from even that of a single comparable disk drive. In systems that offer hot swap capability, the failed drive is removed and a replacement drive is inserted. The data on the failed drive is then copied in the background while the entire system continues to operate in a performance degraded but fully operational mode. Once the data rebuild is complete, normal operation resumes. Hence, another problem with RAID systems is the high cost of increased reliability and associated decrease in performance.

RAID Level 5 employs disk data striping and parity error detection to increase both data bandwidth and reliability simultaneously. A minimum of three disk drives is required for this technique. In the event of a single disk drive failure, that drive may be rebuilt from parity and other data encoded on disk remaining disk drives. In systems that offer hot swap capability, the failed drive is removed and a replacement drive is inserted. The data on the failed drive is then rebuilt in the background while the entire system continues to operate in a performance degraded but fully operational mode. Once the data rebuild is complete, normal operation resumes.

Thus another problem with redundant modern mass storage devices is the degradation of data bandwidth when a storage device fails. Additional problems with bandwidth limitations and reliability similarly occur within the art by all other forms of sequential, pseudo-random, and random access mass storage devices. Typically mass storage devices include magnetic and optical tape, magnetic and optical disks, and various solid-state mass storage devices. It should be noted that the present invention applies to all forms and manners of memory devices including storage devices utilizing magnetic, optical, neural and chemical techniques or any combination thereof.

Yet another problem within the current art is the application and use of various data compression techniques. It is well known within the current art that data compression provides several unique benefits. First, data compression can reduce the time to transmit data by more efficiently utilizing low bandwidth data links. Second, data compression economizes on data storage and allows more information to be stored for a fixed memory size by representing information more efficiently.

For purposes of discussion, data compression is canonically divided into lossy and lossless techniques. Lossy data compression techniques provide for an inexact representation of the original uncompressed data such that the decoded (or reconstructed) data differs from the original unencoded/uncompressed data. Lossy data compression is also known as irreversible or noisy compression. Negentropy is defined as the quantity of information in a given set of data. Thus, one obvious advantage of lossy data compression is that the compression ratios can be larger than that dictated by the negentropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio of the target display device.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the entropy of a given data set.

A rich and highly diverse set of lossless data compression and decompression algorithms exist within the current art. These range from the simplest "adhoc" approaches to highly sophisticated formalized techniques that span the sciences of information theory, statistics, and artificial intelligence. One fundamental problem with almost all modern approaches is the compression ratio to encoding and decoding speed achieved. As previously stated, the current theoretical limit for data compression is the entropy limit of the data set to be encoded. However, in practice, many factors actually limit the compression ratio achieved. Most modern compression algorithms are highly content dependent. Content dependency exceeds the actual statistics of individual elements and often includes a variety of other factors including their spatial location within the data set.

Of popular compression techniques, arithmetic coding possesses the highest degree of algorithmic effectiveness, and as expected, is the slowest to execute. This is followed in turn by dictionary compression, Huffman coding, and run-length coding with respectively decreasing execute times. What is not apparent from these algorithms, that is also one major deficiency within the current art, is knowledge of their algorithmic efficiency. More specifically, given a compression ratio that is within the effectiveness of multiple algorithms, the question arises as their corresponding efficiency.

Within the current art there also presently exists a strong inverse relationship between achieving the maximum (current) theoretical compression ratio, which we define as algorithmic effectiveness, and requisite processing time. For a given single algorithm the effectiveness over a broad class of data sets including text, graphics, databases, and executable object code is highly dependent upon the processing effort applied. Given a baseline data set, processor operating speed and target architecture, along with its associated supporting memory and peripheral set, we define algorithmic efficiency as the time required to achieve a given compression ratio. Algorithmic efficiency assumes that a given algorithm is implemented in an optimum object code representation executing from the optimum places in memory. This is almost never achieved in practice due to limitations within modern optimizing software compilers. It should be further noted that an optimum algorithmic implementation for a given input data set may not be optimum for a different data set. Much work remains in developing a comprehensive set of metrics for measuring data compression algorithmic performance, however for present purposes the previously defined terms of algorithmic effectiveness and efficiency should suffice.

Various solutions to this problem of optimizing algorithmic implementation are found in U.S. Pat. Nos. 6,195,024 and 6,309,424, issued on Feb. 27, 2001 and Oct. 30, 2001, respectively, to James Fallon, both of which are entitled "Content Independent Data Compression Method and System," and are incorporated herein by reference. These patents describe data compression methods that provide content-independent data compression, wherein an optimal compression ratio for an encoded stream can be achieved regardless of the data content of the input data stream. As more fully described in the above incorporated patents, a data compression protocol comprises applying an input data stream to each of a plurality of different encoders to, in effect, generate a plurality of encoded data streams. The plurality of encoders are preferably selected based on their ability to effectively encode different types of input data. The final compressed data stream is generated by selectively combining blocks of the compressed streams output from the plurality of encoders based on one or more factors such as the optimal compression ratios obtained by the plurality of decoders. The resulting compressed output stream can achieve the greatest possible compression, preferably in real-time, regardless of the data content.

Yet another problem within the current art relates to data management and the use of existing file management systems. Present computer operating systems utilize file management systems to store and retrieve information in a uniform, easily identifiable, format. Files are collections of executable programs and/or various data objects. Files occur in a wide variety of lengths and must be stored within a data storage device. Most storage devices, and in particular, mass storage devices, work most efficiently with specific quantities of data. For example, modern magnetic disks are often divided into cylinders, heads and sectors. This breakout arises from legacy electro-mechanical considerations with the format of an individual sector often some binary multiple of bytes (512, 1024, . . . ). A fixed or variable quantity of sectors housed on an individual track. The number of sectors permitted on a single track is limited by the number of reliable flux reversals that can be encoded on the storage media per linear inch, often referred to as linear bit density. In disk drives with multiple heads and disk media, a single cylinder is comprised of multiple tracks.

A file allocation table is often used to organize both used and unused space on a mass storage device. Since a file often comprises more than one sector of data, and individual sectors or contiguous strings of sectors may be widely dispersed over multiple tracks and cylinders, a file allocation table provides a methodology of retrieving a file or portion thereof. File allocation tables are usually comprised of strings of pointers or indices that identify where various portions of a file are stored.

In-order to provide greater flexibility in the management of disk storage at the media side of the interface, logical block addresses have been substituted for legacy cylinder, head, sector addressing. This permits the individual disk to optimize its mapping from the logical address space to the physical sectors on the disk drive. Advantages with this technique include faster disk accesses by allowing the disk manufacturer greater flexibility in managing data interleaves and other high-speed access techniques. In addition, the replacement of bad media sectors can take place at the physical level and need not be the concern of the file allocation table or host computer. Furthermore, these bad sector replacement maps are definable on a disk by disk basis.

Practical limitations in the size of the data required to both represent and process an individual data block address, along with the size of individual data blocks, governs the type of file allocation tables currently in use. For example, a 4096 byte logical block size (8 sectors) employed with 32 bit logical block addresses. This yields an addressable data space of 17.59 Terabytes. Smaller logical blocks permit more efficient use of disk space. Larger logical blocks support a larger addressable data space. Thus one limitation within the current art is that disk file allocation tables and associated file management systems are a compromise between efficient data storage, access speed, and addressable data space.

Data in a computer has various levels of information content. Even within a single file, many data types and formats are utilized. Each data representation has specific meaning and each may hold differing quantities of information. Within the current art, computers process data in a native, uncompressed, format. Thus compressed data must often be decompressed prior to performing various data processing functions or operations. Modern file systems have been designed to work with data in its native format. Thus another significant problem within the current art is that file systems are not able to randomly access compressed data in an efficient manner.

Further aggravating this problem is the fact that when data is decompressed, processed and recompressed it may not fit back into its original disk space, causing disk fragmentation or complex disk space reallocation requirements. Several solutions exist within the current art including file by file and block structured compressed data management.

In file by file compression, each file is compressed when stored on disk and decompressed when retrieved. For very small files this technique is often adequate, however for larger files the compression and decompression times are too slow, resulting in inadequate system level performance. In addition, the ability to access randomly access data within a specific file is lost. The one advantage to file by file compression techniques is that they are easy to develop and are compatible with existing file systems. Thus file by file compressed data management is not an adequate solution.

Block structured disk compression operates by compressing and decompressing fixed block sizes of data. Block sizes are often fixed, but may be variable in size. A single file usually is comprised of multiple blocks, however a file may be so small as to fit within a single block. Blocks are grouped together and stored in one or more disk sectors as a group of Blocks (GOBs). A group of blocks is compressed and decompressed as a unit, thus there exists practical limitations on the size of GOBs. Most compression algorithms achieve a higher level of algorithmic effectiveness when operating on larger quantities of data. Restated, the larger the quantity of data processed with a uniform information density, the higher the compressions ratio achieved. If GOBs are small compression ratios are low and processing time short. Conversely, when GOBS are large compression ratios are higher and processing time is longer. Large GOBs tend to perform in a manner analogous to file by file compression. The two obvious benefits to block structured disk compression are psuedo-random data access and reduced data compression/decompression processing time.

Several problems exist within the current art for the management of compressed blocks. One method for storage of compressed files on disk is by contiguously storing all GOBs corresponding to a single file. However as files are processed within the computers, files may grow or shrink in size. Inefficient disk storage results when a substantial file size reduction occurs. Conversely when a file grows substantially, the additional space required to store the data may not be available contiguously. The result of this process is substantial disk fragmentation and slower access times.

An alternate method is to map compressed GOBs into the next logical free space on the disk. One problem with this method is that average file access times are substantially increased by this technique due to the random data storage. Peak access delays may be reduced since the statistics behave with a more uniform white spectral density, however this is not guaranteed.

A further layer of complexity is encountered when compressed information is to be managed on more than one data storage device. Competing requirements of data access bandwidth, data reliability/redundancy, and efficiency of storage space are encountered.

These and other limitations within the current art are solved with the present invention.

SUMMARY OF THE INVENTION

The present invention is directed to a system and method for compressing and decompressing based on the actual or expected throughput (bandwidth) of a system employing data compression and a technique of optimizing based upon planned, expected, predicted, or actual usage.

In one aspect of the present invention, a system for providing bandwidth sensitive data compression comprises:

a data compression system for compressing and decompressing data input to the system;

a plurality of compression routines selectively utilized by the data compression system; and a controller for tracking the throughput of the system and generating a control signal to select a compression routine based on the system throughput. In a preferred embodiment, when the controller determines that the system throughput falls below a predetermined throughput threshold, the controller commands the data compression engine to use a compression routine providing a faster rate of compression so as to increase the throughput.

In another aspect, a system for providing bandwidth sensitive data compression comprises a plurality of access profiles, operatively accessible by the controller that enables the controller to determine a compression routine that is associated with a data type of the data to be compressed. The access profiles comprise information that enables the controller to select a suitable compression algorithm that provides a desired balance between execution speed (rate of compression) and efficiency (compression ratio).

In yet another aspect, a system comprises a data storage controller for controlling the compression and storage of compressed data to a storage device and the retrieval and decompression of compressed data from the storage device. The system throughput tracked by the controller preferably comprises a number of pending access requests to a storage device.

In another aspect, the system comprises a data transmission controller for controlling the compression and transmission of compressed data, as well as the decompression of compressed data received over a communication channel. The system throughput tracked by the controller comprises a number of pending transmission requests over the communication channel.

In yet another aspect of the present invention, a method for providing bandwidth sensitive data compression in a data processing system, comprises the steps of:

compressing data using an first compression routine providing a first compression rate;

tracking the throughput of the data processing system to determine if the first compression rate provides a throughput that meets a predetermined throughput threshold; and compressing data using a second compression routine providing a second compression rate that is greater than the first compression rate, if the tracked throughput does not meet the predetermined throughput threshold.

Preferably, the first compression routine comprises a default asymmetric routine and wherein the second compression routine comprises a symmetric routine.

In another aspect, the method comprises processing a user command to load a user-selected compression routine for compressing data.

In another aspect, the method further comprises processing a user command to compress user-provided data and automatically selecting a compression routine associated with a data type of the user-provided data.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
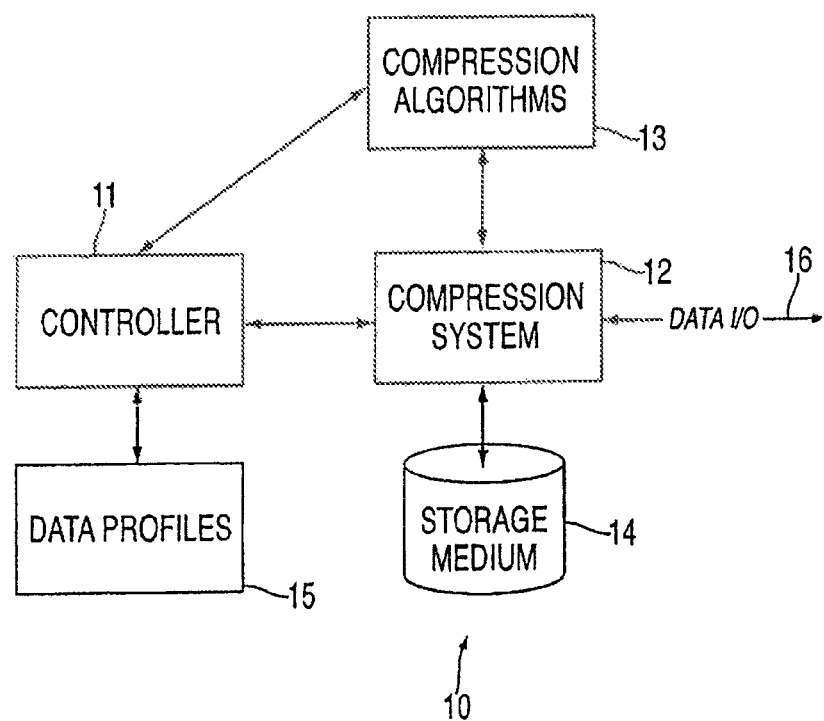
FIG. 1 is a high-level block diagram of a system for providing bandwidth sensitive data compression/decompression according to an embodiment of the present invention.

The present invention is directed to a system and method for compressing and decompressing based on the actual or expected throughput (bandwidth) of a system employing data compression. Although one of ordinary skill in the art could readily envision various implementations for the present invention, a preferred system in which this invention is employed comprises a data storage controller that preferably utilizes a real-time data compression system to provide "accelerated" data storage and retrieval bandwidths. The concept of "accelerated" data storage and retrieval was introduced in co-pending U.S. patent application Ser. No. 09/266,394, filed Mar. 11, 1999, entitled "System and Methods For Accelerated Data Storage and Retrieval" and co-pending U.S. patent application Ser. No. 09/481,243, filed Jan. 11, 2000, entitled "System and Methods For Accelerated Data Storage and Retrieval," both of which are commonly assigned and incorporated herein by reference.

In general, as described in the above-incorporated applications, "accelerated" data storage comprises receiving a digital data stream at a data transmission rate which is greater than the data storage rate of a target storage device, compressing the input stream at a compression rate that increases the effective data storage rate of the target storage device and storing the compressed data in the target storage device. For instance, assume that a mass storage device (such as a hard disk) has a data storage rate of 20 megabytes per second. If a storage controller for the mass storage device is capable of compressing (in real time) an input data stream with an average compression rate of 3:1, then data can be stored in the mass storage device at a rate of 60 megabytes per second, thereby effectively increasing the storage bandwidth ("storewidth") of the mass storage device by a factor of three. Similarly, accelerated data retrieval comprises retrieving a compressed digital data stream from a target storage device at the rate equal to, e.g., the data access rate of the target storage device and then decompressing the compressed data at a rate that increases the effective data access rate of the target storage device. Advantageously, providing accelerated data storage and retrieval at (or close to) real-time can reduce or eliminate traditional bottlenecks associated with, e.g., local and network disk accesses.

In a preferred embodiment, the present invention is implemented for providing accelerated data storage and retrieval. In one embodiment, a controller tracks and monitors the throughput (data storage and retrieval) of a data compression system and generates control signals to enable/disable different compression algorithms when, e.g., a bottleneck occurs so as to increase the throughput and eliminate the bottleneck.

In the following description of preferred embodiments, two categories of compression algorithms are defined—an "asymmetrical" data compression algorithm and a "symmetrical data compression algorithms. An asymmetrical data compression algorithm is referred to herein as one in which the execution time for the compression and decompression routines differ significantly. In particular, with an asymmetrical algorithm, either the compression routine is slow and the decompression routine is fast or the compression routine is fast and the decompression routine is slow. Examples of asymmetrical compression algorithms include dictionary-based compression schemes such as Lempel-Ziv.

On the other hand, a "symmetrical" data compression algorithm is referred to herein as one in which the execution time for the compression and the decompression routines are substantially similar. Examples of symmetrical algorithms include table-based compression schemes such as Huffman.

For asymmetrical algorithms, the total execution time to perform one compress and one decompress of a data set is typically greater than the total execution time of symmetrical algorithms. But an asymmetrical algorithm typically achieves higher compression ratios than a symmetrical algorithm.

It is to be appreciated that in accordance with the present invention, symmetry may be defined in terms of overall effective bandwidth, compression ratio, or time or any combination thereof. In particular, in instances of frequent data read/writes, bandwidth is the optimal parameter for symmetry. In asymmetric applications such as operating systems and programs, the governing factor is net decompression bandwidth, which is a function of both compression speed, which governs data retrieval time, and decompression speed, wherein the total governs the net effective data read bandwidth. These factors work in an analogous manner for data storage where the governing factors are both compression ratio (storage time) and compression speed. The present invention applies to any combination or subset thereof, which is utilized to optimize overall bandwidth, storage space, or any operating point in between.

Referring now to FIG. 1, a high-level block diagram illustrates a system for providing bandwidth sensitive data compression/decompression according to an embodiment of the present invention. In particular, FIG. 1 depicts a host system 10 comprising a controller 11 (e.g., a file management system), a compression/decompression system 12, a plurality of compression algorithms 13, a storage medium 14, and a plurality of data profiles 15. The controller tracks and monitors the throughput (e.g., data storage and retrieval) of the data compression system 12 and generates control signals to enable/disable different compression algorithms 13 when the throughput falls below a predetermined threshold. In one embodiment, the system throughput that is tracked by the controller 11 preferably comprises a number of pending access requests to the memory system.

The compression system 12 is operatively connected to the storage medium 14 using suitable protocols to write and read compressed data to and from the storage medium 14. It is to be understood that the storage medium 14 may comprise any form of memory device including all forms of sequential, pseudo-random, and random access storage devices. The memory storage device 14 may be volatile or non-volatile in nature, or any combination thereof. Storage devices as known within the current art include all forms of random access memory, magnetic and optical tape, magnetic and optical disks, along with various other forms of solid-state mass storage devices. Thus it should be noted that the current invention applies to all forms and manners of memory devices including, but not limited to, storage devices utilizing magnetic, optical, and chemical techniques, or any combination thereof. The data compression system 12 preferably operates in real-time (or substantially real-time) to compress data to be stored on the storage device 14 and to decompress data that is retrieved from the storage device 14. In addition, the compression system 12 may receive data (compressed or not compressed) via an I/O (input/output) port 16 that is transmitted over a transmission line or communication channel from a remote location, and then process such data (e.g., decompress or compress the data). The compression system 12 may further transmit data (compressed or decompressed) via the I/O port 16 to another network device for remote processing or storage.

The controller 11 utilizes information comprising a plurality of data profiles 15 to determine which compression algorithms 13 should be used by the compression system 12. In a preferred embodiment, the compression algorithms 13 comprise one or more asymmetric algorithms. As noted above, with asymmetric algorithms, the compression ratio is typically greater than the compression ratios obtained using symmetrical algorithms. Preferably, a plurality of asymmetric algorithms are selected to provide one or more asymmetric algorithms comprising a slow compress and fast decompress routine, as well as one or more asymmetric algorithms comprising a fast compress and slow decompress routine.

The compression algorithms 14 further comprise one or more symmetric algorithms, each having a compression rate and corresponding decompression rate that is substantially equal. Preferably, a plurality of symmetric algorithms are selected to provide a desired range of compression and decompression rates for data to be processed by a symmetric algorithm.

In a preferred embodiment, the overall throughput (bandwidth) of the system 10 is one factor considered by the controller 11 in deciding whether to use an asymmetrical or symmetrical compression algorithm for processing data stored to, and retrieved from, the storage device 14. Another factor that is used to determine the compression algorithm is the type of data to be processed. In a preferred embodiment, the data profiles 15 comprise information regarding predetermined access profiles of different data sets, which enables the controller 11 to select a suitable compression algorithm based on the data type. For instance, the data profiles may comprise a map that associates different data types (based on, e.g., a file extension) with preferred one(s) of the compression algorithms 13. For example, preferred access profiles considered by the controller 11 are set forth in the following table.

| Access Profile 1: | Access Profile 2 | Access Profile 3 |
| --- | --- | --- |
| Data is written to a storage medium once (or very few times) but is read from the storage medium many times | Data is written to the storage medium often but read few Times | The amount of times data is read from and written to the storage medium is substantially the same. |

With Access Profile 1, the decompression routine would be executed significantly more times than the corresponding compression routine. This is typical with operating systems, applications and websites, for example. Indeed, an asymmetrical application can be used to (offline) compress an (OS) operating system, application or Website using a slow compression routine to achieve a high compression ratio. After the compressed OS, application or website is stored, the asymmetric algorithm is then used during runtime to decompress, at a significant rate, the OS, application or website launched or accessed by a user.

Therefore, with data sets falling within Access Profile 1, it is preferable to utilize an asymmetrical algorithm that provides a slow compression routine and a fast decompression routine so as to provide an increase in the overall system performance as compared the performance that would be obtained using a symmetrical algorithm. Further, the compression ratio obtained using the asymmetrical algorithm would likely be higher than that obtained using a symmetrical algorithm (thus effectively increasing the storage capacity of the storage device).

With Access Profile 2, the compression routine would be executed significantly more times than the decompression routine. This is typical with a system for automatically updating an inventory database, for example, wherein an asymmetric algorithm that provides a fast compression routine and a slow decompression routine would provide an overall faster (higher throughput) and efficient (higher compression ratio) system performance than would be obtained using a symmetrical algorithm.

With Access Profile 3, where data is accessed with a similar number of reads and writes, the compression routine would be executed approximately the same number of times as the decompression routine. This is typical of most user-generated data such as documents and spreadsheets. Therefore, it is preferable to utilize a symmetrical algorithm that provides a relatively fast compression and decompression routine. This would result in an overall system performance that would be faster as compared to using an asymmetrical algorithm (although the compression ratio achieved may be lower).

The following table summarizes the three data access profiles and the type of compression algorithm that would produce optimum throughput.

| Access Profile | Example Data Types | Compression Algorithm | Compressed Data Characteristics | Decompression Algorithm |
| --- | --- | --- | --- | --- |
| 1. Write few, Read many | Operating systems, Programs, Web sites | Asymmetrical (Slow compress) | Very high compression ratio | Asymmetrical (Fast decompress) |
| 2. Write many, Read few | Automatically updated inventory database | Asymmetrical (Fast compress) | Very high compression ratio | Asymmetrical (Slow decompress) |
| 3. Similar number of Reads and Writes | User generated documents | Symmetrical | Standard compression ratio | Symmetrical |

In accordance with the present invention, the access profile of a given data set is known a priori or determined prior to compression so that the optimum category of compression algorithm can be selected. As explained below, the selection process may be performed either manually or automatically by the controller 11 of the data compression system 12. Further, the decision regarding which routines will be used at compression time (write) and at decompression time (read) is preferably made before or at the time of compression. This is because once data is compressed using a certain algorithm, only the matching decompression routine can be used to decompress the data, regardless of how much processing time is available at the time of decompression.

Figure 2:
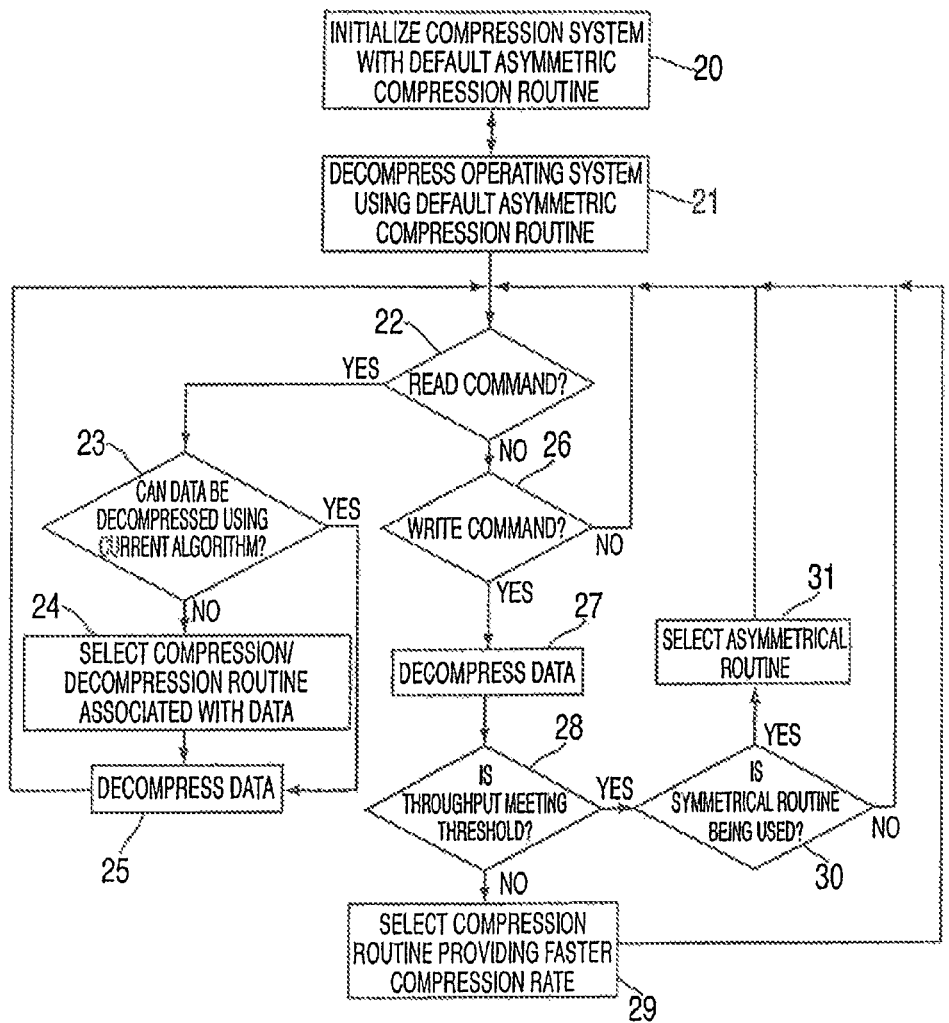
FIG. 2 is a flow diagram of a method for providing bandwidth sensitive data compression/decompression according to one aspect of the present invention.

Referring now to FIG. 2, a flow diagram illustrates a method for providing bandwidth sensitive data compression according to one aspect of the present invention. For purposes of illustration, it is assumed that the method depicted in FIG. 2 is implemented with a disk controller for providing accelerated data storage and retrieval from a hard disk on a PC (personal computer). The data compression system is initialized during a boot-up process after the PC is powered-on and a default compression/decompression routine is instantiated (step 20).

In a preferred embodiment, the default algorithm comprises an asymmetrical algorithm since an operating system and application programs will be read from hard disk memory and decompressed during the initial use of the system 10. Indeed, as discussed above, an asymmetric algorithm that provides slow compression and fast decompression is preferable for compressing operating systems and applications so as to obtain a high compression ratio (to effectively increase the storage capacity of the hard disk) and fast data access (to effectively increase the retrieval rate from the hard disk). The initial asymmetric routine that is applied (by, e.g., a vendor) to compress the operating system and applications is preferably set as the default. The operating system will be retrieved and then decompressed using the default asymmetric routine (step 21).

During initial runtime, the controller will maintain use the default algorithm until certain conditions are met. For instance, if a read command is received (affirmative result in step 22), the controller will determine whether the data to be read from disk can be compressed using the current routine (step 23). For this determination, the controller could, e.g., read a flag value that indicates the algorithm that was used to compress the file. If the data can be decompressed using the current algorithm (affirmative determination in step 23), then the file will be retrieved and decompressed (step 25). On the other hand, if the data cannot be decompressed using the current algorithm (negative determination in step 23), the controller will issue the appropriate control signal to the compression system to load the algorithm associated with the file (step 24) and, subsequently, decompress the file (step 25).

If a write command is received (affirmative result in step 26), the data to be stored will be compressed using the current algorithm (step 27). During the process of compression and storing the compressed data, the controller will track the throughput to determine whether the throughput is meeting a predetermined threshold (step 28). For example, the controller may track the number of pending disk accesses (access requests) to determine whether a bottleneck is occurring. If the throughput of the system is not meeting the desired threshold (e.g., the compression system cannot maintain the required or requested data rates) (negative determination in step 28), then the controller will command the data compression system to utilize a compression routine providing faster compression (e.g., a fast symmetric compression algorithm) (step 29) so as to mitigate or eliminate the bottleneck.

If, on the other hand, the system throughput is meeting or exceeding the threshold (affirmative determination in step 28) and the current algorithm being used is a symmetrical routine (affirmative determination in step 30), in an effort to achieve optimal compression ratios, the controller will command the data compression system to use an asymmetric compression algorithm (step 31) that may provide a slower rate of compression, but provide efficient compression.

This process is repeated such that whenever the controller determines that the compression system can maintain the required/requested data throughput using a slow (highly efficient) asymmetrical compression algorithm, the controller will allow the compression system to operate in the asymmetrical mode. This will allow the system to obtain maximum storage capacity on the disk. Further, the controller will command the compression system to use a symmetric routine comprising a fast compression routine when the desired throughput is not met. This will allow the system to, e.g., service the backlogged disk accesses. Then, when the controller determines that the required/requested data rates are subsequently lower and the compression system can maintain the data rate, the controller can command the compression system to use a slower (but more efficient) asymmetric compression algorithm.

With the above-described method depicted in FIG. 2, the selection of the compression routine is performed automatically by the controller so as to optimize system throughput. In another embodiment, a user that desires to install a program or text files, for example, can command the system (via a software utility) to utilize a desired compression routine for compressing and storing the compressed program or files to disk. For example, for a power user, a GUI menu can be displayed that allows the user to directly select a given algorithm. Alternatively, the system can detect the type of data being installed or stored to disk (via file extension, etc.) and automatically select an appropriate algorithm using the Access Profile information as described above. For instance, the user could indicate to the controller that the data being installed comprises an application program which the controller would determine falls under Access Profile 1. The controller would then command the compression engine to utilize an asymmetric compression algorithm employing a slow compression routine and a fast decompression routine. The result would be a one-time penalty during program installation (slow compression), but with fast access to the data on all subsequent executions (reads) of the program, as well as a high compression ratio.

It is to be appreciated that the present invention may be implemented in any data processing system, device, or apparatus using data compression. For instance, the present invention may be employed in a data transmission controller in a network environment to provide accelerated data transmission over a communication channel (i.e., effectively increase the transmission bandwidth by compressing the data at the source and decompressing data at the receiver, in real-time).

Further, the present invention can be implemented with a data storage controller utilizing data compression and decompression to provided accelerated data storage and retrieval from a mass storage device. Exemplary embodiments of preferred data storage controllers in which the present invention may be implemented are described, for example, in U.S. patent application Ser. No. 09/775,905, filed on Feb. 2, 2001, entitled "Data Storewidth Accelerator", which is commonly assigned and fully incorporated herein by reference.

Figure 3:
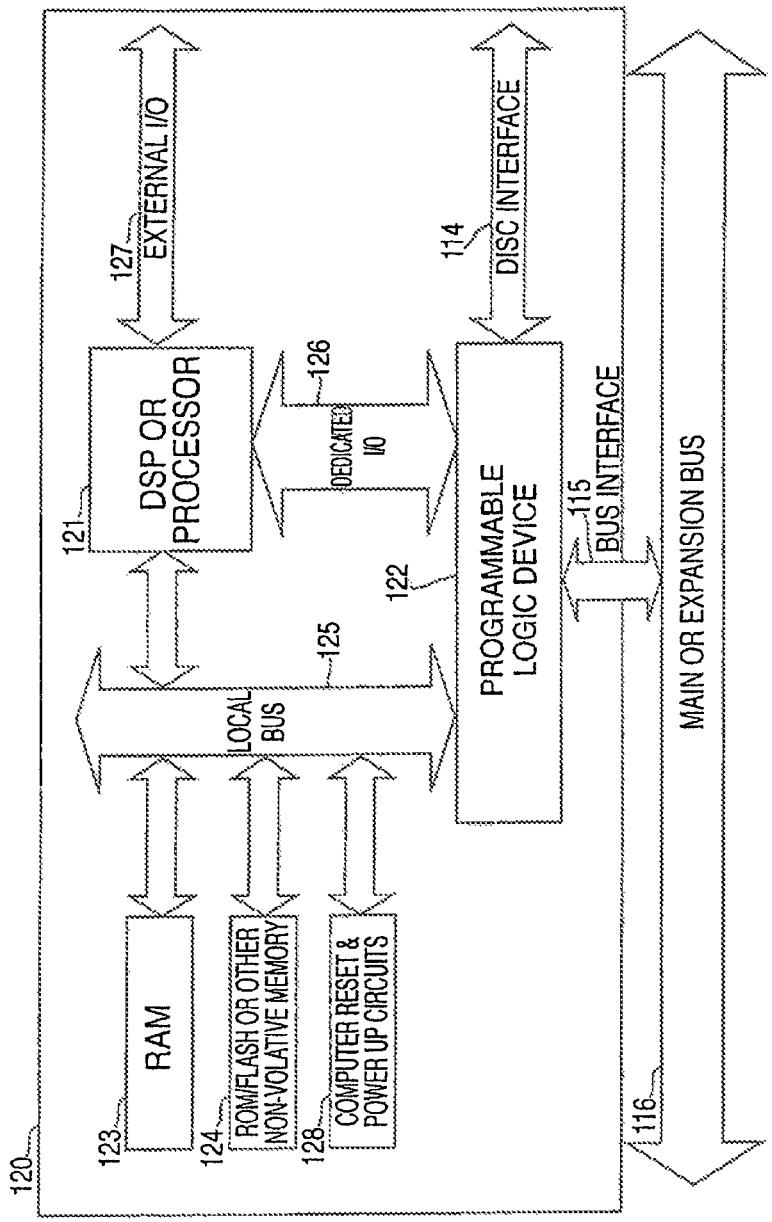
FIG. 3 is a block diagram of a preferred system for implementing a bandwidth sensitive data compression/decompression method according to an embodiment of the present invention.

FIG. 3 illustrates a preferred embodiment of a data storage controller 120 as described in the above-incorporated U.S. Ser. No. 09/775,905 for implementing a bandwidth sensitive data compression protocol as described herein. The storage controller 120 comprises a DSP (digital signal processor) 121 (or any other micro-processor device) that implements a data compression/decompression routine. The DSP 121 preferably employs a plurality of symmetric and asymmetric compression/decompression as described herein. The data storage controller 120 further comprises at least one programmable logic device 122 (or volatile logic device). The programmable logic device 122 preferably implements the logic (program code) for instantiating and driving both a disk interface 114 and a bus interface 115 and for providing full DMA (direct memory access) capability for the disk and bus interfaces 114, 115. Further, upon host computer power-up and/or assertion of a system-level "reset" (e.g., PCI Bus reset), the DSP 121 initializes and programs the programmable logic device 122 before of the completion of initialization of the host computer. This advantageously allows the data storage controller 120 to be ready to accept and process commands from the host computer (via the bus 116) and retrieve boot data from the disk (assuming the data storage controller 120 is implemented as the boot device and the hard disk stores the boot data (e.g., operating system, etc.))

The data storage controller 120 further comprises a plurality of memory devices including a RAM (random access memory) device 123 and a ROM (read only memory) device 124 (or FLASH memory or other types of non-volatile memory). The RAM device 123 is utilized as on-board cache and is preferably implemented as SDRAM. The ROM device 124 is utilized for non-volatile storage of logic code associated with the DSP 121 and configuration data used by the DSP 121 to program the programmable logic device 122.

The DSP 121 is operatively connected to the memory devices 123, 124 and the programmable logic device 122 via a local bus 125. The DSP 121 is also operatively connected to the programmable logic device 122 via an independent control bus 126. The programmable logic device 122 provides data flow control between the DSP 121 and the host computer system attached to the bus 116, as well as data flow control between the DSP 121 and the storage device. A plurality of external I/O ports 127 are included for data transmission and/or loading of one or more programmable logic devices. Preferably, the disk interface 114 driven by the programmable logic device 122 supports a plurality of hard drives.

The storage controller 120 further comprises computer reset and power up circuitry 128 (or "boot configuration circuit") for controlling initialization (either cold or warm boots) of the host computer system and storage controller 120. A preferred boot configuration circuit and preferred computer initialization systems and protocols are described in U.S. patent application Ser. No. 09/775,897, filed on Feb. 2, 2001, entitled "System and Methods For Computer Initialization," which is commonly assigned and incorporated herein by reference. Preferably, the boot configuration circuit 128 is employed for controlling the initializing and programming the programmable logic device 122 during configuration of the host computer system (i.e., while the CPU of the host is held in reset). The boot configuration circuit 128 ensures that the programmable logic device 122 (and possibly other volatile or partially volatile logic devices) is initialized and programmed before the bus 116 (such as a PCI bus) is fully reset. In particular, when power is first applied to the boot configuration circuit 128, the boot configuration circuit 28 generates a control signal to reset the local system (e.g., storage controller 120) devices such as a DSP, memory, and I/O interfaces. Once the local system is powered-up and reset, the controlling device (such as the DSP 121) will then proceed to automatically determine the system environment and configure the local system to work within that environment. By way of example, the DSP 121 of the disk storage controller 120 would sense that the data storage controller 120 is on a PCI computer bus (expansion bus) and has attached to it a hard disk on an IDE interface. The DSP 121 would then load the appropriate PCI and IDE interfaces into the programmable logic device 122 prior to completion of the host system reset. Once the programmable logic device 122 is configured for its environment, the boot device controller is reset and ready to accept commands over the computer/expansion bus 116.

It is to be understood that the data storage controller 120 may be utilized as a controller for transmitting data (compressed or uncompressed) to and from remote locations over the DSP I/O ports 127 or system bus 116, for example. Indeed, the I/O ports 127 of the DSP 121 may be used for transmitting data (compressed or uncompressed) that is either retrieved from the disk or received from the host system via the bus 116, to remote locations for processing and/or storage. Indeed, the I/O ports may be operatively connected to other data storage controllers or to a network communication channels. Likewise, the data storage controller 120 may receive data (compressed or uncompressed) over the I/O ports 127 of the DSP 121 from remote systems that are connected to the I/O ports 127 of the DSP, for local processing by the data storage controller 120. For instance, a remote system may remotely access the data storage controller 120 (via the I/O ports of the DSP or system bus 116) to utilize the data compression, in which case the data storage controller 120 would transmit the compressed data back to the system that requested compression.

In accordance with the present invention, the system (e.g., data storage controller 120) preferably boots-up in a mode using asymmetrical data compression. It is to be understood that the boot process would not be affected whether the system boots up defaulting to an asymmetrical mode or to a symmetrical mode. This is because during the boot process of the computer, it is reading the operating system from the disk, not writing. However, once data is written to the disk using a compression algorithm, it must retrieve and read the data using the corresponding decompression algorithm.

As the user creates, deletes and edits files, the disk controller 120 will preferably utilize an asymmetrical compression routine that provides slow compression and fast decompression. Since using the asymmetrical compression algorithm will provide slower compression than a symmetrical algorithm, the file system of the computer will track whether the disk controller 120 has disk accesses pending. If the disk controller 120 does have disk accesses pending and the system is starting to slow down, the file management system will command the disk controller 120 to use a faster symmetrical compression algorithm. If there are no disk access requests pending, the file management system will leave the disk controller in the mode of using the asymmetrical compression algorithm.

If the disk controller 120 was switched to using a symmetrical algorithm, the file management system will preferably signal the controller to switch back to a default asymmetrical algorithm when, e.g., the rate of the disk access requests slow to the point where there are no pending disk accesses.

At some point a user may decide to install software or load files onto the hard disk. Before installing the software, for example, as described above, the user could indicate to the disk controller 120 (via a software utility) to enter and remain in an asymmetric mode using an asymmetric compression algorithm with a slow compression routine and a very fast decompression routine. The disk controller would continue to use the asymmetrical algorithm until commanded otherwise, regardless of the number of pending disk accesses. Then, after completing the software installation, the user would then release the disk controller from this "asymmetrical only" mode of operation (via the software utility).

Again, when the user is not commanding the disk controller 120 to remain in a certain mode, the file management system will determine whether the disk controller should use the asymmetrical compression algorithms or the symmetrical compression algorithms based on the amount of backlogged disk activity. If the backlogged disk activity exceeds a threshold, then the file management system will preferably command the disk controller to use a faster compression algorithm, even though compression performance may suffer. Otherwise, the file management system will command the disk controller to use the asymmetrical algorithm that will yield greater compression performance.

It is to be appreciated that the data compression methods described herein by be integrated or otherwise implemented with the content independent data compression methods described in the above-incorporated U.S. Pat. Nos. 6,195,024 and 6,309,424.

Figures 4A, 4B:
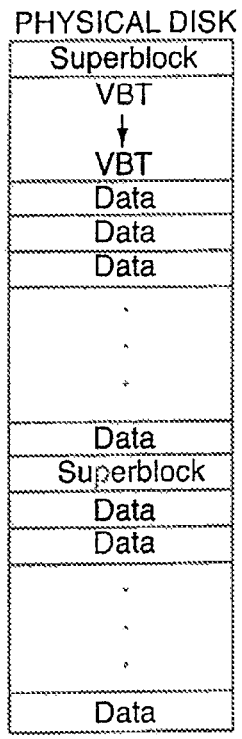
FIG. 4a is a diagram of a file system format of a virtual and/or physical disk according to an embodiment of the present invention.
FIG. 4b is a diagram of a data structure of a sector map entry of a virtual block table according to an embodiment of the present invention.

In yet another embodiment of the present invention a virtual file management system is utilized to store, retrieve, or transmit compressed and/or accelerated data. In one embodiment of the present invention, a physical or virtual disk is utilized employing a representative file system format as illustrated in FIG. 4. As shown in FIG. 4, a virtual file system format comprises one or more data items. For instance, a "Superblock" denotes a grouping of configuration information necessary for the operation of the disk management system. The Superblock typically resides in the first sector of the disk. Additional copies of the Superblock are preferably maintained on the disk for backup purposes. The number of copies will depend on the size of the disk. One sector is preferably allocated for each copy of the Superblock on the disk, which allows storage to add additional parameters for various applications. The Superblock preferably comprises information such as (i) compress size; (ii) virtual block table address; (iii) virtual block table size; (iv) allocation size; (v) number of free sectors (approximate); (vi) ID ("Magic") number; and (vii) checksum.

The "compress size" refers to the maximum uncompressed size of data that is grouped together for compression (referred to as a "data chunk"). For example, if the compress size is set to 16 k and a 40 k data block is sent to the disk controller for storage, it would be divided into two 16 k chunks and one 8 k chunk. Each chunk would be compressed separately and possess it's own header. As noted above, for many compression algorithms, increasing the compression size will increase the compression ratio obtained. However, even when a single byte is needed from al compressed data chunk, the entire chunk must be decompressed, which is a tradeoff with respect to using a very large compression size.

The "virtual block table address" denotes the physical address of the virtual block table. The "virtual block table size" denotes the size of the virtual block table.

The "allocation size" refers to the minimum number of contiguous sectors on the disk to reserve for each new data entry. For example, assuming that 4 sectors are allowed for each allocation and that a compressed data entry requires only 1 sector, then the remaining 3 sectors would be left unused. Then, if that piece of data were to be appended, there would be room to increase the data while remaining contiguous on the disk. Indeed, by maintaining the data contiguously, the speed at which the disk can read and write the data will increase. Although the controller preferably attempts to keep these unused sectors available for expansion of the data, if the disk were to fill up, the controller could use such sectors to store new data entries. In this way, a system can be configured to achieve greater speed, while not sacrificing disk space. Setting the allocation size to 1 sector would effectively disable this feature.

The "number Of free sectors" denotes the number of physical free sectors remaining on the disk. The ID ("Magic) number" identifies this data as a Superblock. The "checksum" comprises a number that changes based on the data in the Superblock and is used for error checking. Preferably, this number is chosen so that all of the words in the Superblock (including the checksum) added up are equal to zero.

The "virtual block table" (VET) comprises a number of "sector map" entries, one for each grouping of compressed data (or chunks). The VET may reside anywhere on the disk. The size of the VBT will depend on how much data is on the disk. Each sector map entry comprises 8 bytes. Although there is preferably only one VBT on the disk, each chunk of compressed data will have a copy of its sector map entry in its header. If the VBT were to become corrupted, scanning the disk for all sector maps could create a new one.

The term "type" refers to the sector map type. For example, a value of "00" corresponds to this sector map definition. Other values are preferably reserved for future redefinitions of the sector map.

A "C Type" denotes a compression type. A value of "000" will correspond to no compression. Other values are defined as required depending on the application. This function supports the use of multiple compression algorithms along with the use of various forms of asymmetric data compression.

The "C Info" comprises the compression information needed for the given compression type. These values are defined depending on the application. In addition, the data may be tagged based on it's use—for example operating system "00", Program "01", or data "10". Frequency of use or access codes may also be included. The size of this field may be greatly expanded to encode statistics supporting these items including, for example, cumulative number of times accessed, number of times accessed within a given time period or CPU clock cycles, and other related data.

The "sector count" comprises the number of physical sectors on the disk that are used for this chunk of compressed data. The "LBA" refers to the logical block address, or physical disk address, for this chunk of compressed data.

Referring back to FIG. 4a, each "Data" block represent each data chunk comprising a header and compressed data. The data chunk may up anywhere from 1 to 256 sectors on the disk. Each compressed chunk of data is preferably preceded on the disk by a data block header that preferably comprises the following information: (i) sector map; (ii) VBI; (iii) ID ("Magic") Number; and (iv) checksum.

The "sector map" comprises a copy of the sector map entry in the VBT for this data chunk. The "VBI" is the Virtual Block Index, which is the index into the VBT that corresponds to this data chunk. The "ID ("Magic) Number" identifies this data as a data block header. The "checksum" number will change based on the data in the header and is used for error checking. This number is preferably chosen such that the addition of all the words in the header (including the checksum) will equal zero.

It should be noted that the present invention is not limited to checksums but may employ any manner of error detection and correction techniques, utilizing greatly expanded fields error detection and/or correction.

It should be further noted that additional fields may be employed to support encryption, specifically an identifier for encrypted or unencrypted data along with any parameters necessary for routing or processing the data to an appropriate decryption module or user.

The virtual size of the disk will depend on the physical size of the disk, the compress size selected, and the expected compression ratio. For example, assume there is a 75 GB disk with a selected compress size expecting a 3:1 compression ratio, the virtual disk size would be 225 GB. This will be the maximum amount of uncompressed data that the file system will be able to store on the disk.

If the number chosen is too small, then the entire disk will not be utilized. Consider the above example where a system comprises a 75 GB disk and a 225 GB virtual size. Assume that in actuality during operation the average compression ratio obtained is 5:1. Whereas this could theoretically allow 375 GB to be stored on the 75 GB disk, in practice, only 225 GB would be able to be stored on the disk before a "disk full" message is received. Indeed, with a 5:1 compression ratio, the 225 GB of data would only take up 45 GB on the disk leaving 30 GB unused. Since the operating system would think the disk is full, it would not attempt to write any more information to the disk.

On the other hand, if the number chosen is too large, then the disk will fill up when the operating system would still indicate that there was space available on the disk. Again consider the above example where a system comprises a 75 GB disk and a 225 GB virtual size. Assume further that during operation, the average compression ratio actually obtained is only 2:1. In this case, the physical disk would be full after writing 150 GB to it, but the operating system would still think there is 75 GB remaining. If the operating system tried to write more information to the disk, an error would occur.

Thus, in another embodiment of the present invention, the virtual size of the disk is dynamically altered based upon the achieved compression ratio. In one embodiment, a running average may be utilized to reallocate the virtual disk size. Alternatively, certain portions of the ratios may already be known—such as a preinstalled operating system and programs. Thus, this ratio is utilized for that portion of the disk, and predictive techniques are utilized for the balance of the disk or disks.

Yet in another embodiment, users are prompted for setup information and the computer selects the appropriate virtual disk(s) size or selects the best method of estimation based on, e.g., a high level menu of what is the purpose of this computer: home, home office, business, server. Another submenu may ask for the expected data mix, word, excel, video, music, etc. Then, based upon expected usage and associated compression ratios (or the use of already compressed data in the event of certain forms of music and video) the results are utilized to set the virtual disk size.

It should be noted that the present invention is independent of the number or types of physical or virtual disks, and indeed may be utilized with any type of storage.

It is to be understood that the systems and methods described herein may be implemented in various forms of hardware, software, firmware, special purpose processors, or a combination thereof. In particular, the present invention may be implemented as an application comprising program instructions that are tangibly embodied on a program storage device (e.g., magnetic floppy disk, RAM, ROM, CD ROM, etc.) and executable by any device or machine comprising suitable architecture. It is to be further understood that, because some of the constituent system components and process steps depicted in the accompanying Figures are preferably implemented in software, the actual connections between such components and steps may differ depending upon the manner in which the present invention is programmed. Given the teachings herein, one of ordinary skill in the related art will be able to contemplate these and similar implementations or configurations of the present invention.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method comprising:
    compressing data using a compression routine providing a first compression rate;
    tracking throughput of a data processing system to determine if the first compression rate provides a throughput that meets a predetermined throughput threshold; and
    if the tracked throughput does not meet the predetermined throughput threshold, compressing data using a compression routine providing a second compression rate that is different from the first compression rate, to change the throughput of the data processing system.

2. The method of claim 1, wherein said data compressed using said first compression routine comprises:
    information from at least one of the World Wide Web (WWW), the Internet, a Wide Area Network (WAN), or a Local Area Network (LAN).

3. The method of claim 1, wherein said data compressed using said first compression routine comprises:
    at least one of digital audio or video data.

4. A method, comprising:
    compressing data using a compression routine providing a first compression rate;
    tracking throughput of a data processing system to determine if the first compression rate provides a throughput that meets a predetermined throughput threshold;
    if the tracked throughput does not meet the predetermined throughput threshold, compressing data using a compression routine providing a second compression rate that is different from the first compression rate, to change the throughput of the data processing system; and
    processing a user command to load a user-selected compression routine for compressing data.

5. A method, comprising:
    compressing data using a compression routine providing a first compression rate;
    tracking throughput of a data processing system to determine if the first compression rate provides a throughput that meets a predetermined throughput threshold;
    if the tracked throughput does not meet the predetermined throughput threshold, compressing data using a compression routine providing a second compression rate that is different from the first compression rate, to change the throughput of the data processing system;
    processing a user command to compress user-provided data; and
    automatically selecting a compression routine associated with a data type of the user-provided data.

6. A system comprising:
    a data compression system for compressing and decompressing data input;
    a plurality of compression algorithms selectively utilized by the data compression system;
    a controller for tracking throughput and generating a control signal to select a compression routine based on the throughput,
    wherein if the controller determines that the throughput falls below a predetermined throughput threshold, the controller commands the data compression engine to use another one of the plurality of compression algorithms to provide a different rate of compression; and
    a plurality of access profiles, operatively accessible by the controller, to determine a compression algorithm that is associated with a data type of data to be compressed.

7. A method comprising:
    compressing data using an asymmetric compression routine providing a first compression rate;
    tracking throughput of a data processing system to determine if the first compression rate provides a throughput that meets a predetermined throughput threshold; and
    if the tracked throughput does not meet the predetermined throughput threshold, compressing data using a compression routine providing a second compression rate that is different from the first compression rate, to change the throughput of the data processing system.

8. A method comprising:
    using an asymmetric compression algorithm to compress data at a first compression rate to provide first compressed data to a communications channel;
    tracking throughput of the communications channel;

determining if the first compression rate provides throughput that meets a predetermined throughput threshold; and if the tracked throughput does not meet the predetermined throughput threshold, using a compression algorithm to compress data at a second compression rate to provide second compressed data to the communications channel, wherein the second compression rate is different from the first compression rate, and providing the second compressed data to the communications channel changes the throughput of the communications channel.

* * * * *